(12) United States Patent
Nakaki

(10) Patent No.: US 9,029,938 B2
(45) Date of Patent: May 12, 2015

(54) SEMICONDUCTOR MEMORY DEVICE AND METHOD FOR MANUFACTURING SAME

(71) Applicant: Kabushiki Kaisha Toshiba, Minato-ku (JP)

(72) Inventor: Hiroshi Nakaki, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/204,512

(22) Filed: Mar. 11, 2014

(65) Prior Publication Data

US 2015/0069499 A1  Mar. 12, 2015

(30) Foreign Application Priority Data

Sep. 10, 2013  (JP) ................................. 2013-187675

(51) Int. Cl.
| | | |
|---|---|---|
| *H01L 29/792* | (2006.01) | |
| *H01L 21/336* | (2006.01) | |
| *H01L 27/115* | (2006.01) | |
| *H01L 29/66* | (2006.01) | |
| *H01L 23/535* | (2006.01) | |
| *H01L 21/768* | (2006.01) | |

(52) U.S. Cl.
CPC .... *H01L 27/11582* (2013.01); *H01L 29/66666* (2013.01); *H01L 27/11573* (2013.01); *H01L 23/535* (2013.01); *H01L 29/66833* (2013.01); *H01L 21/76802* (2013.01); *H01L 21/76877* (2013.01); *H01L 27/11565* (2013.01); *H01L 27/11578* (2013.01); *H01L 29/7926* (2013.01); *H01L 29/792* (2013.01)

(58) Field of Classification Search
CPC ................... H01L 27/11582; H01L 27/11578; H01L 27/11556; H01L 27/11573; H01L 27/11565; H01L 29/7926; H01L 29/792; H01L 29/66833; G11C 16/0483; G11C 16/16
USPC .......... 257/326, 324, 314, 316, 319, E29.309; 438/268, 287, 261, 264
See application file for complete search history.

(56) References Cited

U.S. PATENT DOCUMENTS

| | | | | |
|---|---|---|---|---|
| 7,936,004 | B2 * | 5/2011 | Kito et al. ...................... | 257/324 |
| 8,278,695 | B2 * | 10/2012 | Kidoh et al. ................... | 257/314 |
| 8,372,720 | B2 | 2/2013 | Fukuzumi et al. | |
| 8,435,857 | B2 * | 5/2013 | Kiyotoshi ...................... | 438/261 |
| 8,551,838 | B2 | 10/2013 | Kito et al. | |

(Continued)

FOREIGN PATENT DOCUMENTS

| | | |
|---|---|---|
| JP | 2007-266143 A | 10/2007 |
| JP | 2008-258458 A | 10/2008 |

(Continued)

*Primary Examiner* — Michael Trinh
(74) *Attorney, Agent, or Firm* — Oblon, McClelland, Maier & Neustadt, L.L.P.

(57) ABSTRACT

According to one embodiment, the stacked body includes a plurality of electrode layers and a plurality of insulating layers alternately stacked on the substrate. The plurality of contact parts are provided in a protruding shape on respective end parts of the plurality of electrode layers. The plurality of contact parts do not overlap each other in the stacking direction. The plurality of contact parts are displaced in a surface direction of the substrate. The plurality of plugs extends from the respective contact parts toward the respective circuit interconnections and electrically connects the respective contact parts with the respective circuit interconnections.

20 Claims, 56 Drawing Sheets

(56) References Cited

U.S. PATENT DOCUMENTS

| | | |
|---|---|---|
| 8,659,070 B2 | 2/2014 | Tanaka et al. |
| 8,729,624 B2 | 5/2014 | Fukuzumi et al. |
| 2007/0252201 A1 | 11/2007 | Kito et al. |
| 2010/0052042 A1 | 3/2010 | Tanaka et al. |
| 2010/0207195 A1 | 8/2010 | Fukuzumi et al. |
| 2011/0204420 A1* | 8/2011 | Kim et al. .................... 257/211 |
| 2011/0220987 A1* | 9/2011 | Tanaka et al. ................. 257/324 |
| 2011/0284947 A1 | 11/2011 | Kito et al. |
| 2011/0287597 A1 | 11/2011 | Kito et al. |
| 2013/0126961 A1 | 5/2013 | Fukuzumi et al. |
| 2013/0228844 A1* | 9/2013 | Nagashima et al. .......... 257/316 |
| 2013/0320526 A1 | 12/2013 | Wakisaka et al. |

FOREIGN PATENT DOCUMENTS

| | | |
|---|---|---|
| JP | 2009-146954 A | 7/2009 |
| JP | 2011-3833 A | 1/2011 |
| JP | 2011-171735 A | 9/2011 |
| JP | 2011-187794 A | 9/2011 |
| WO | WO 2009/075370 A1 | 6/2009 |

* cited by examiner

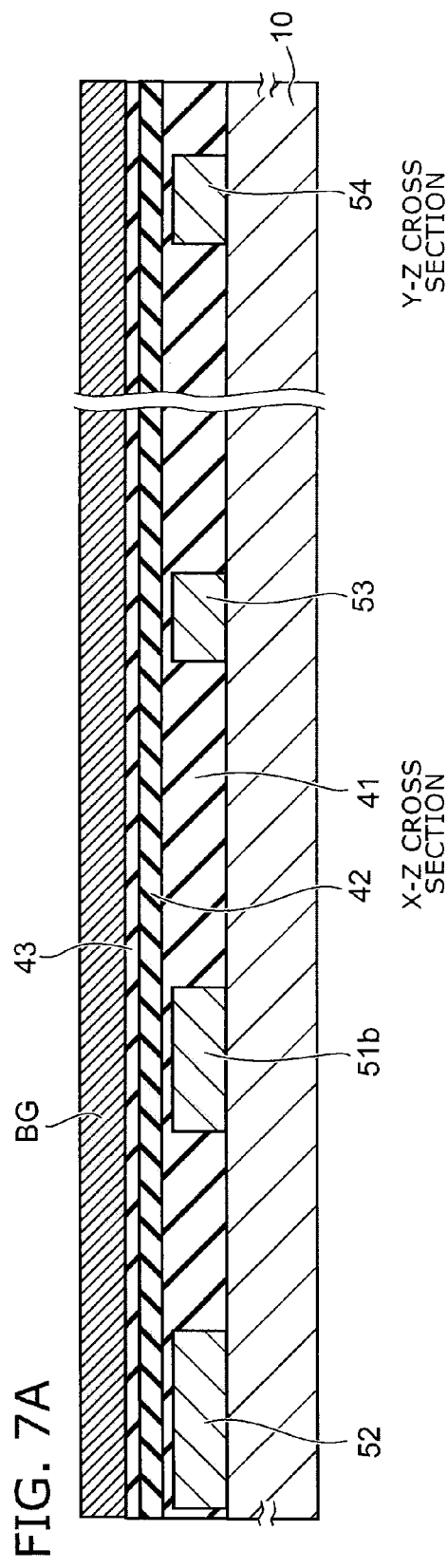
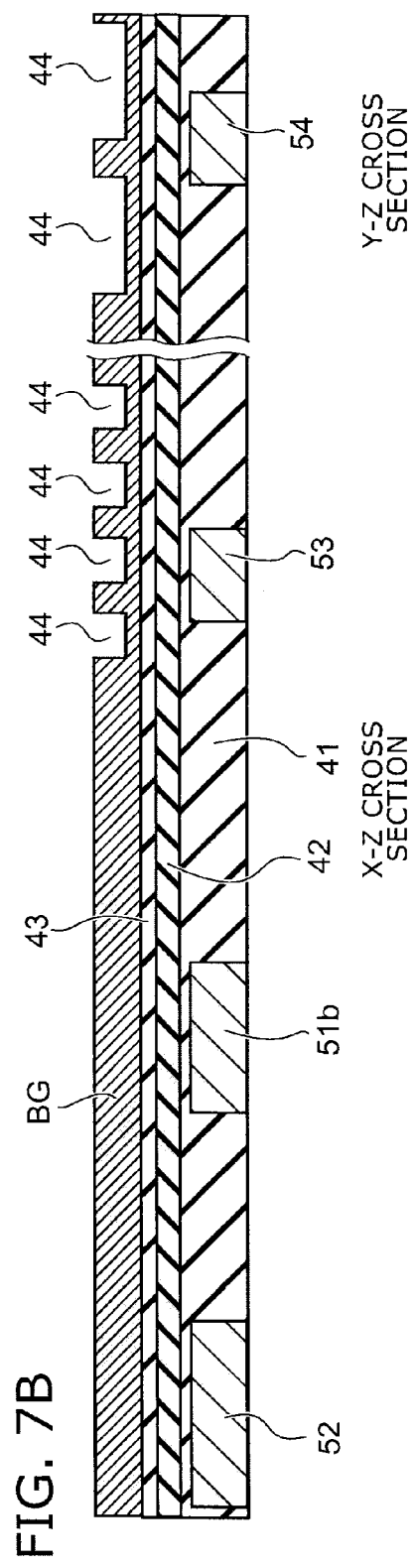
FIG. 7A
FIG. 7B

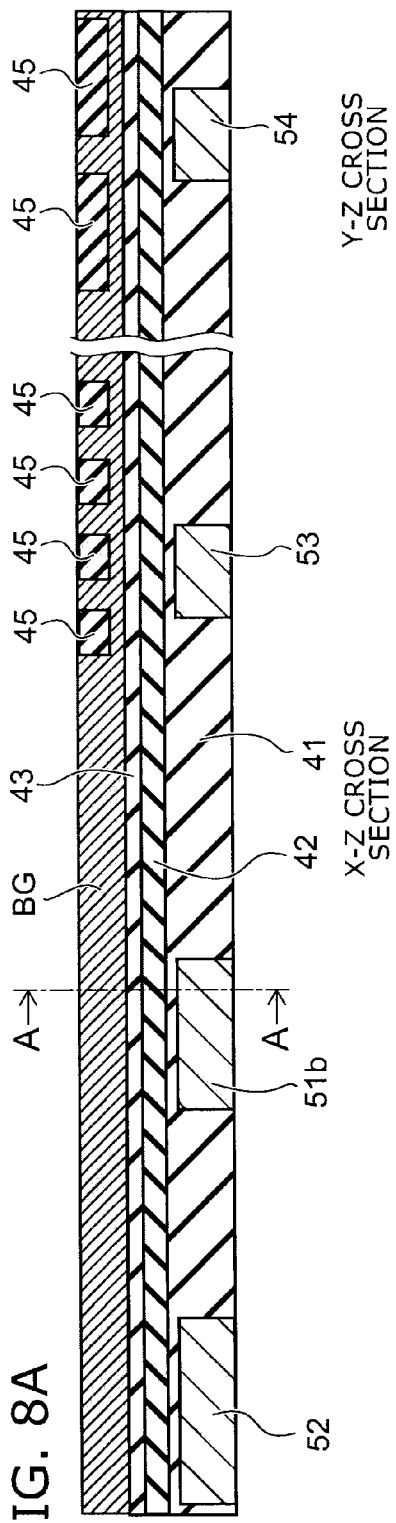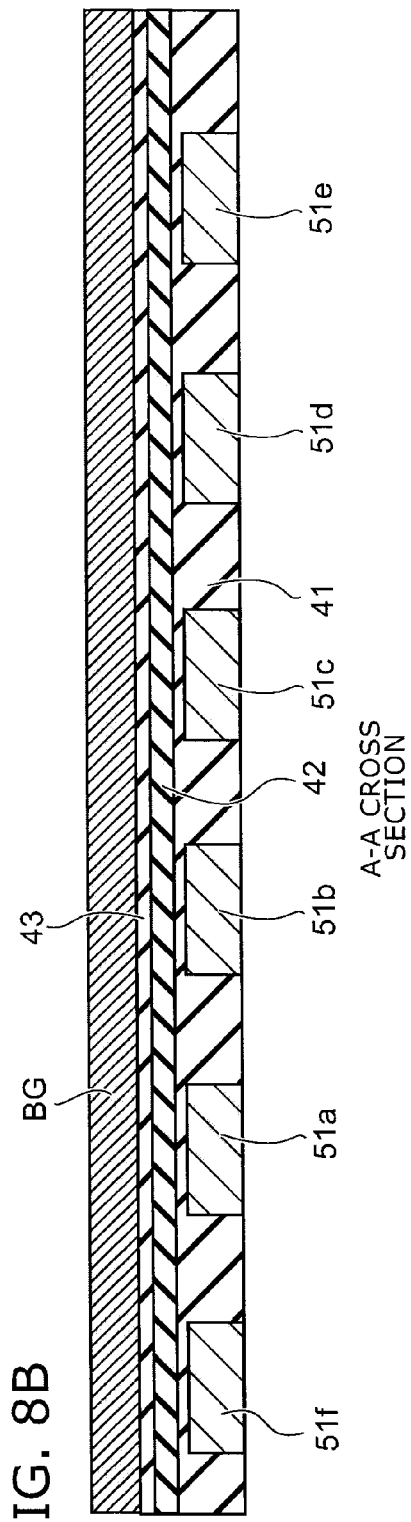

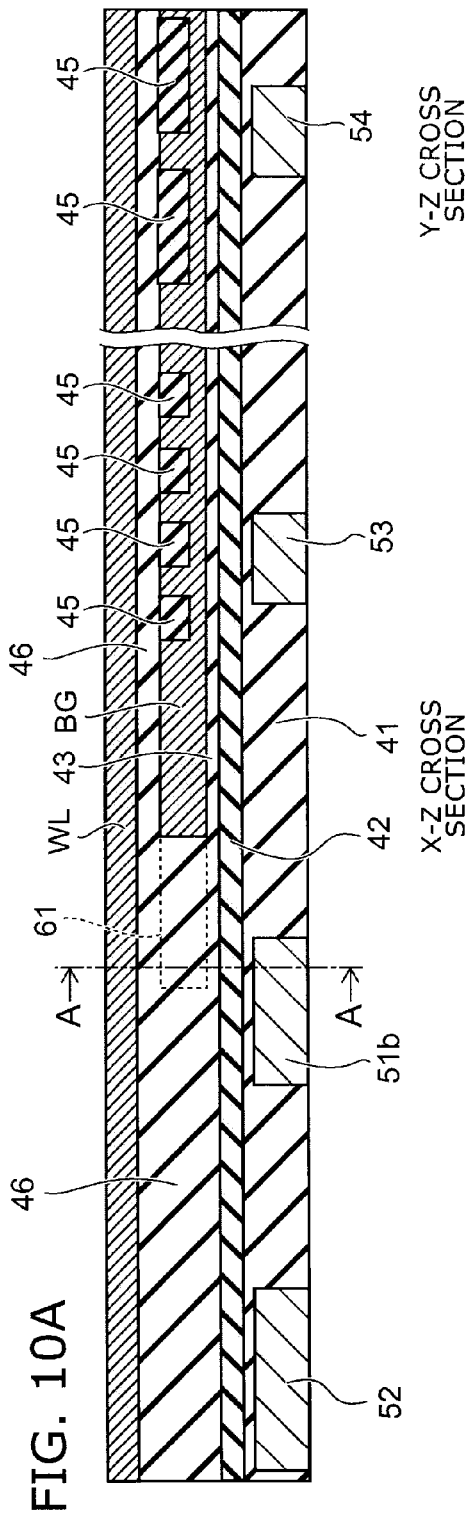
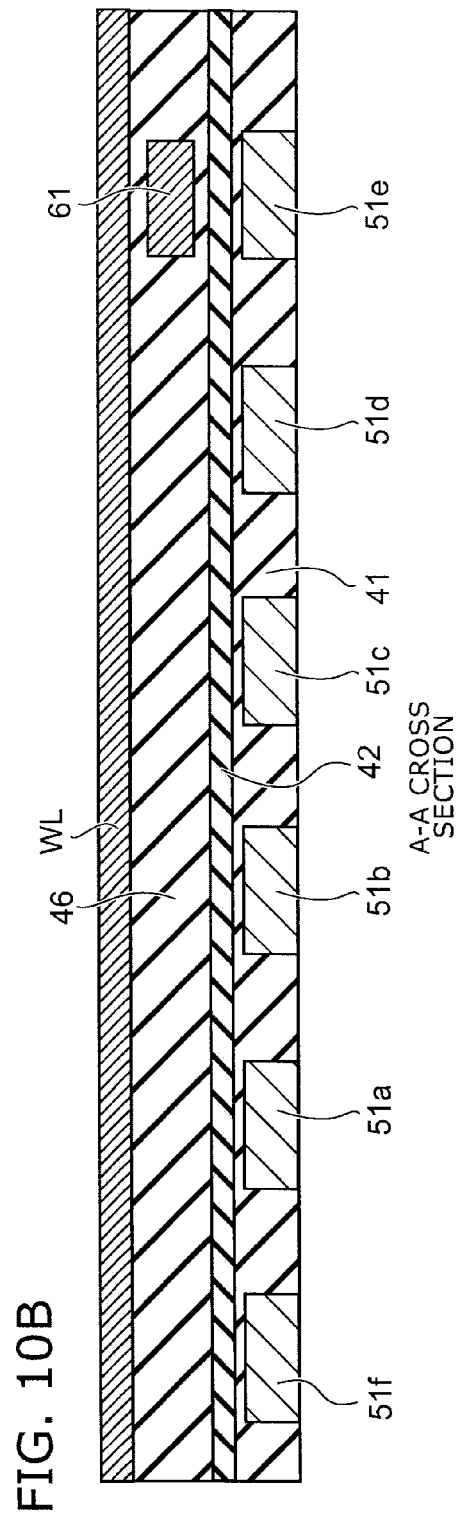
FIG. 10A
FIG. 10B

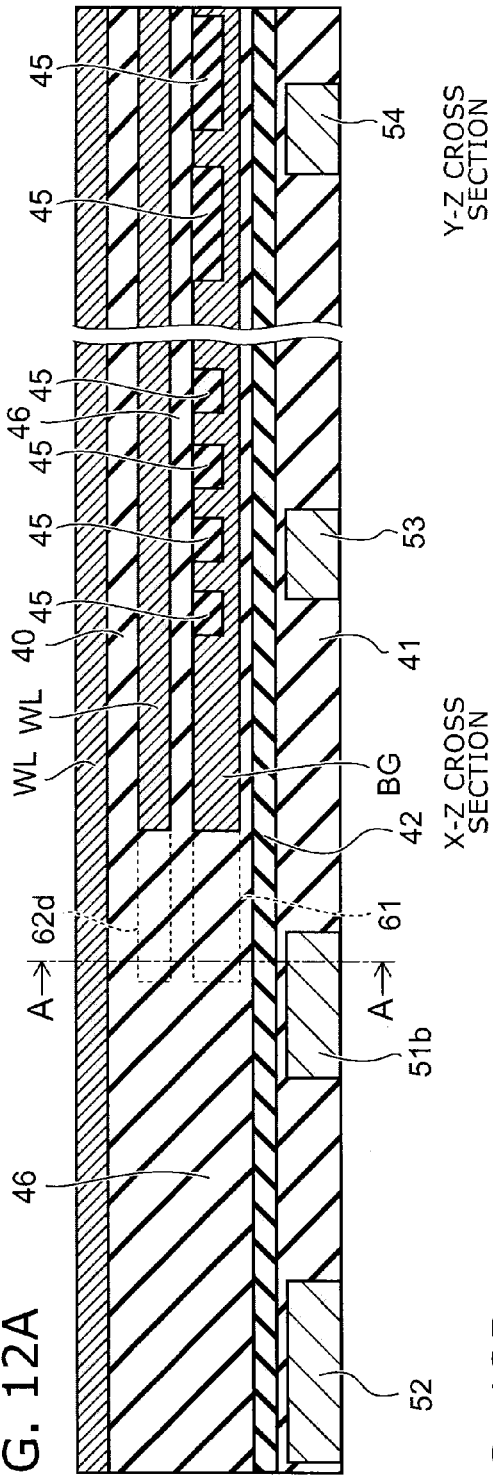
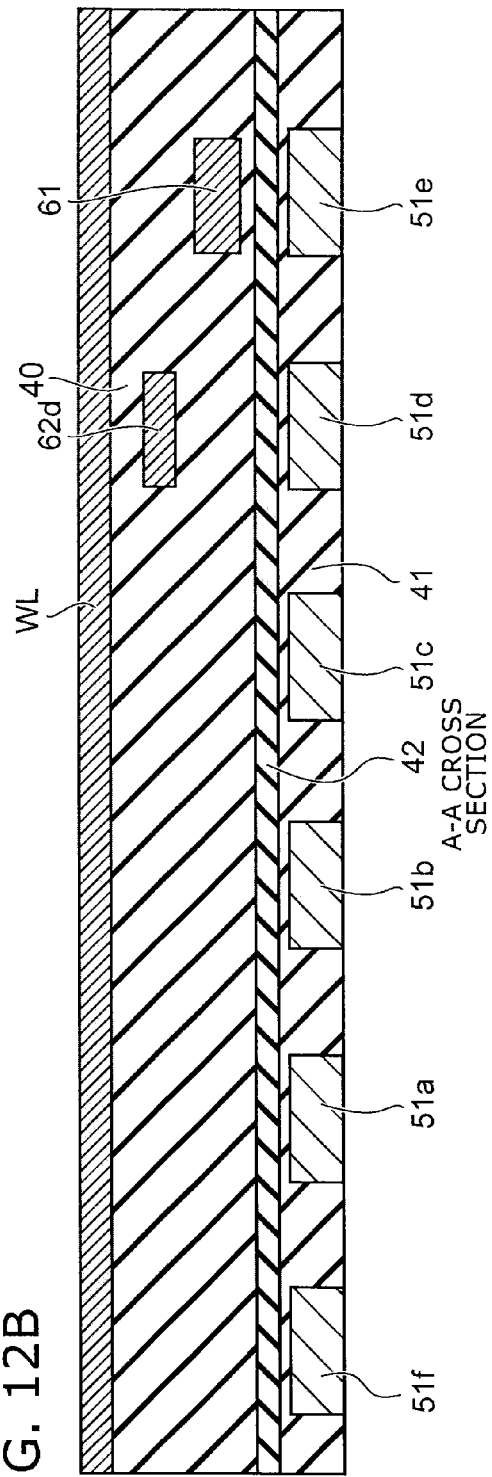
FIG. 12A
FIG. 12B

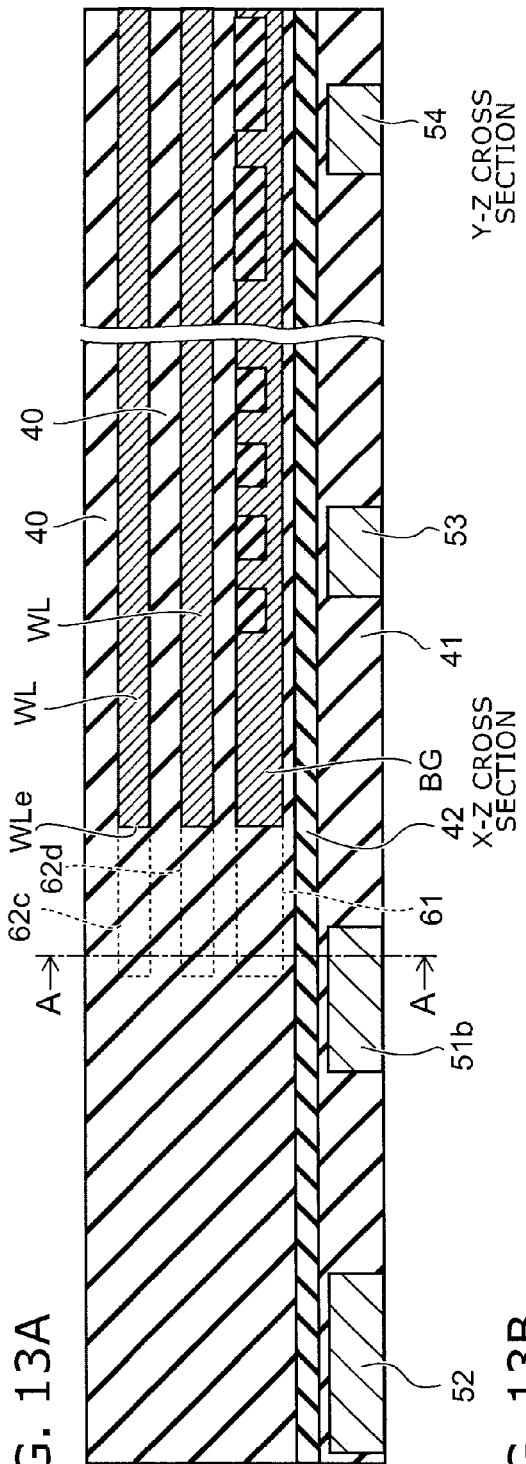
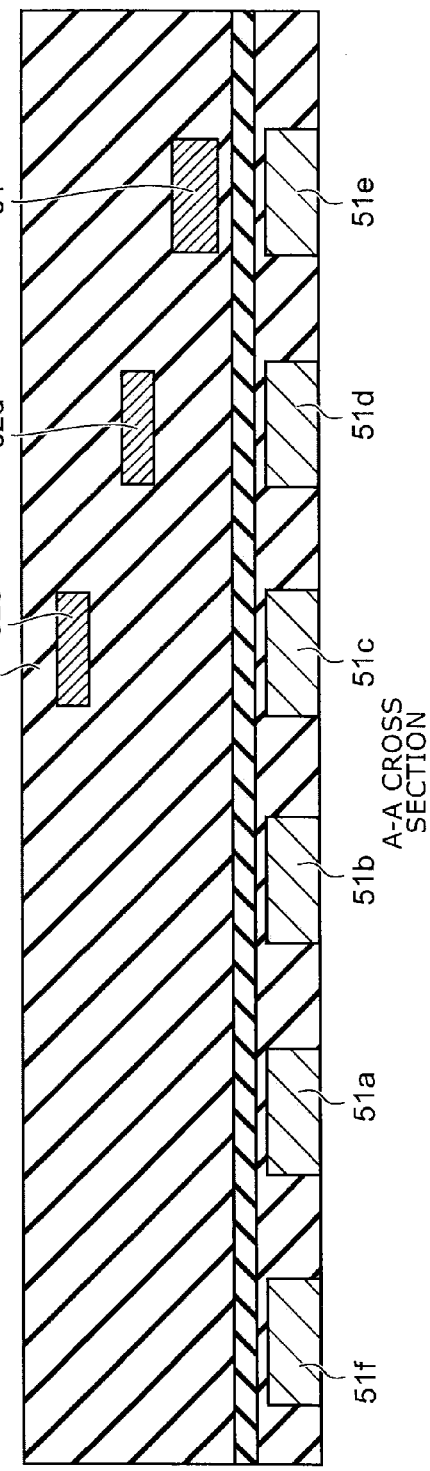
FIG. 13A
FIG. 13B

SEMICONDUCTOR MEMORY DEVICE AND METHOD FOR MANUFACTURING SAME

CROSS-REFERENCE TO RELATED APPLICATION

This application is based upon and claims the benefit of priority from Japanese Patent Application No. 2013-187675, filed on Sep. 10, 2013; the entire contents of which are incorporated herein by reference.

FIELD

Embodiments described herein relate generally to a semiconductor memory device and a method for manufacturing the same.

BACKGROUND

There is proposed a memory device having a three-dimensional structure. In this memory device, a memory hole is formed in a stacked body in which a plurality of electrode layers functioning as control gates in memory cells are alternately stacked with insulating layers. A silicon body constituting a channel is provided via a charge storage film on the sidewall of the memory hole. As an extraction contact structure of the electrode layers, there is proposed a structure in which a plug is connected to each of the plurality of electrode layers processed into a staircase structure.

In the staircase structure section, each electrode layer is once connected with the upper-layer interconnection through the plug extending upward from the electrode layer. Furthermore, the upper-layer interconnection is routed to the outside of the staircase structure section. Then, the upper-layer interconnection is connected to a circuit interconnection formed on the substrate surface through another plug extending from the upper-layer interconnection toward the substrate side. Such an extraction structure of interconnection may hamper the reduction of the chip area.

BRIEF DESCRIPTION OF THE DRAWINGS

FIG. 7A to FIG. 56 are schematic views showing a method for manufacturing the semiconductor memory device of the embodiment.

DETAILED DESCRIPTION

Figure 1:
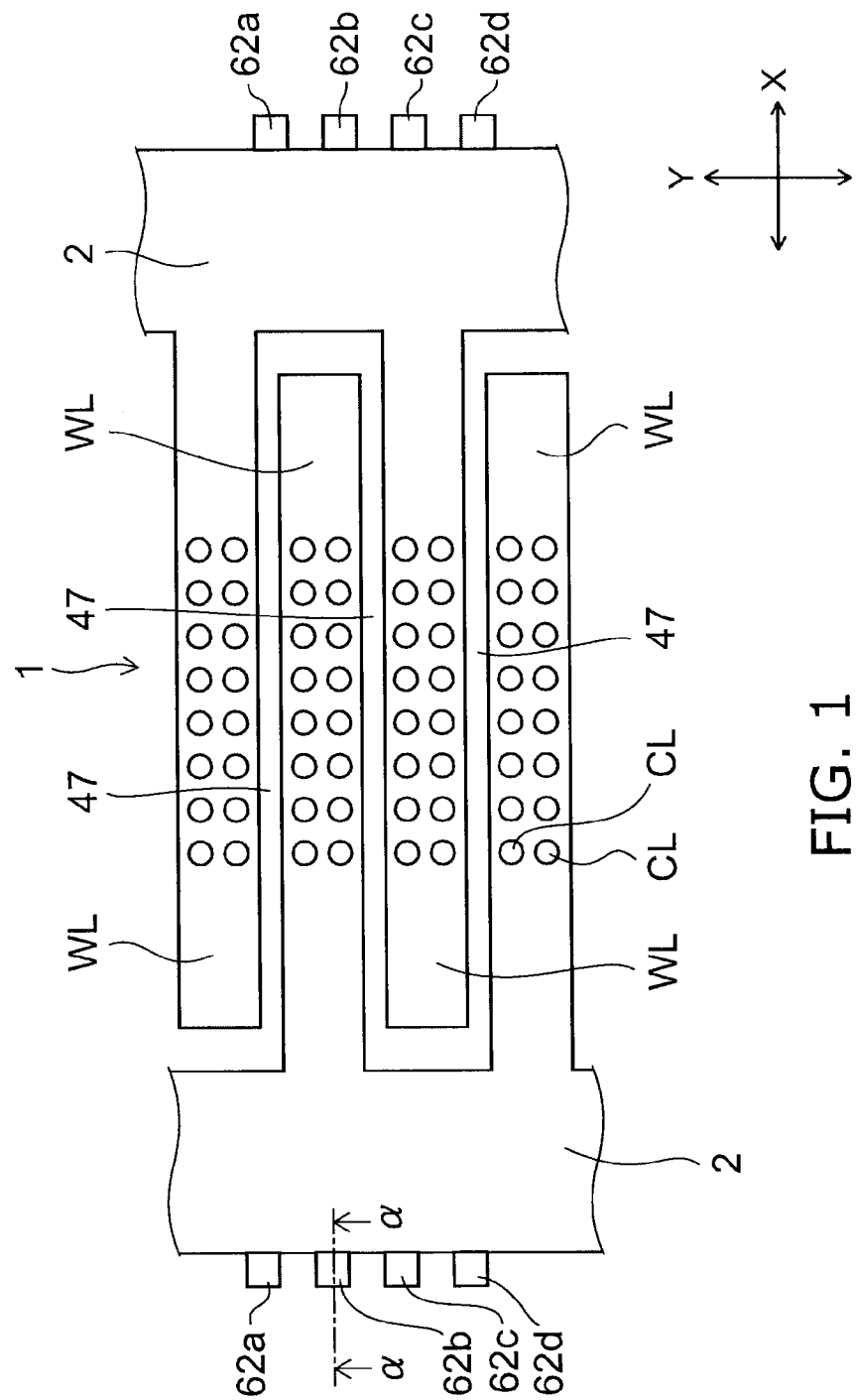
FIG. 1 is a schematic plan view of a semiconductor memory device of an embodiment.

According to one embodiment, a semiconductor memory device includes a substrate, a plurality of circuit interconnections, a stacked body, a channel body, a memory film, a plurality of contact parts, and a plurality of plugs. The plurality of circuit interconnections are provided on the substrate. The stacked body includes a plurality of electrode layers and a plurality of insulating layers alternately stacked on the substrate. The channel body extends in a stacking direction of the stacked body through the plurality of electrode layers. The memory film is provided between the electrode layer and the channel body. The plurality of contact parts are provided in a protruding shape on respective end parts of the plurality of electrode layers. The plurality of contact parts do not overlap each other in the stacking direction. The plurality of contact parts are displaced in a surface direction of the substrate. The plurality of plugs extends from the respective contact parts toward the respective circuit interconnections and electrically connects the respective contact parts with the respective circuit interconnections.

Embodiments will now be described with reference to the drawings. In the drawings, like elements are labeled with like reference numerals.

FIG. 1 is a schematic plan view of a semiconductor memory device of an embodiment.

Figure 2:
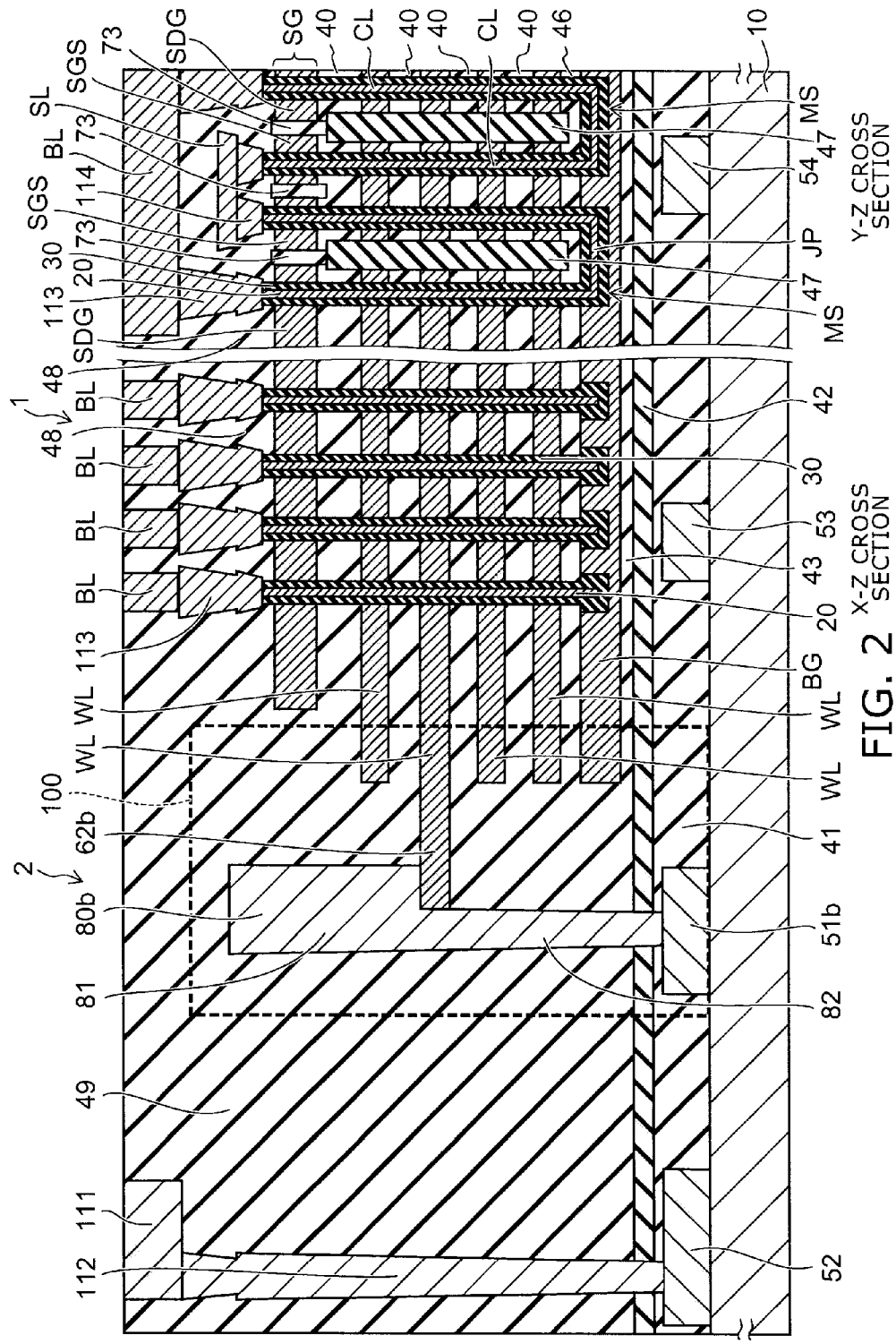
FIG. 2 is a schematic cross-sectional view of the semiconductor memory device of the embodiment.

FIG. 2 is a schematic sectional view of the semiconductor memory device of the embodiment.

The semiconductor memory device of the embodiment includes a memory cell array 1 and a tier selecting section 2.

Figure 3:
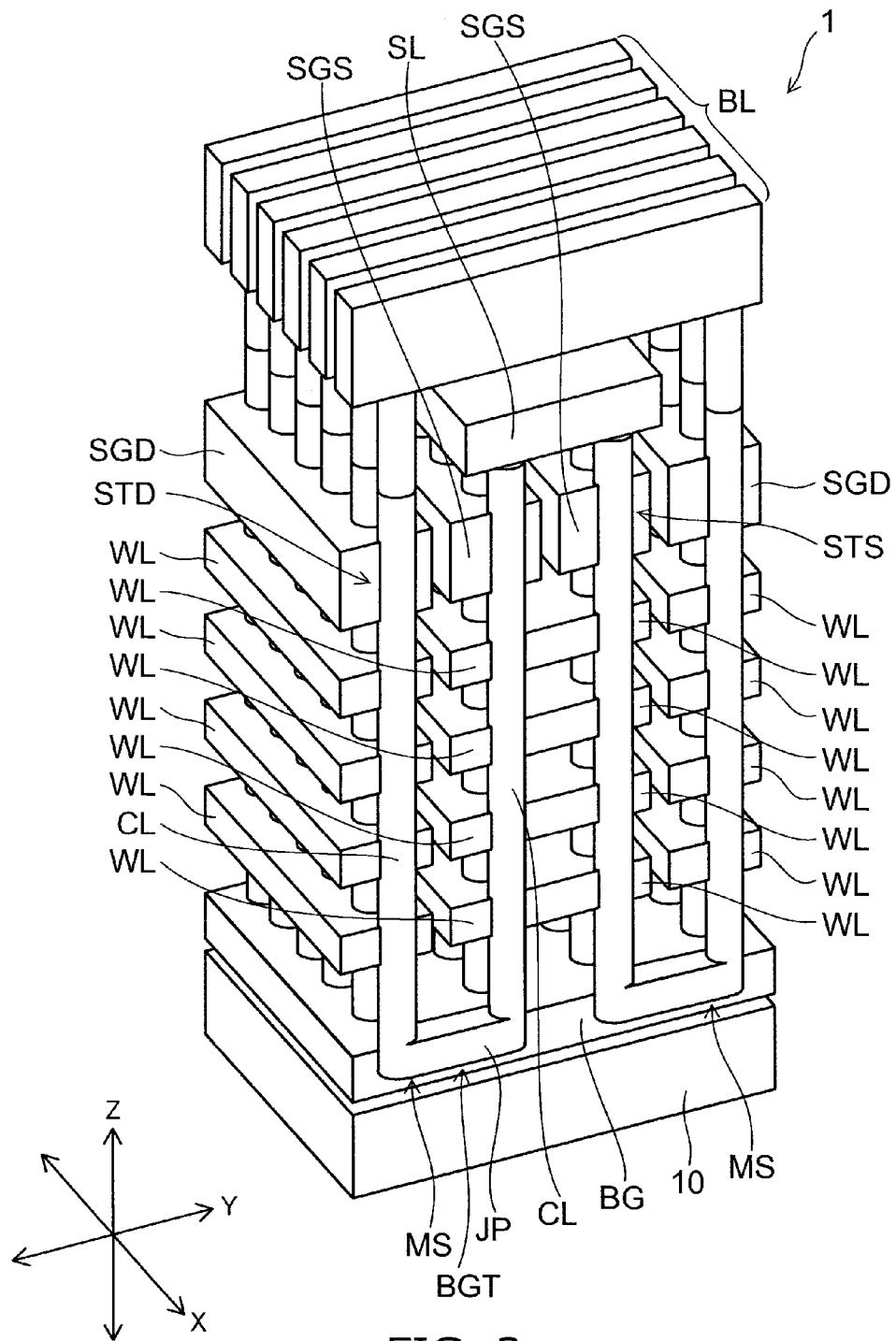
FIG. 3 is a schematic perspective view of a memory cell array of the semiconductor memory device of the embodiment.

FIG. 3 is a schematic perspective view of the memory cell array 1. In FIG. 3, insulating portions are not shown for clarity of illustration.

In FIG. 3, two directions orthogonal to each other in a plane parallel to the major surface of the substrate 10 are referred to as X-direction and Y-direction. The direction orthogonal to both the X-direction and the Y-direction is referred to as Z-direction (stacking direction).

The X-direction and the Y-direction shown in FIG. 1 correspond to the X-direction and the Y-direction shown in FIG. 3, respectively. Furthermore, FIG. 2 shows a Y-Z cross section and an X-Z cross section in the direction orthogonal to the Y-Z cross section, separated by the break line.

In FIG. 2, the cross section of the region 100 enclosed with the dashed line corresponds to the α-α cross section in FIG. 1.

Figure 4:
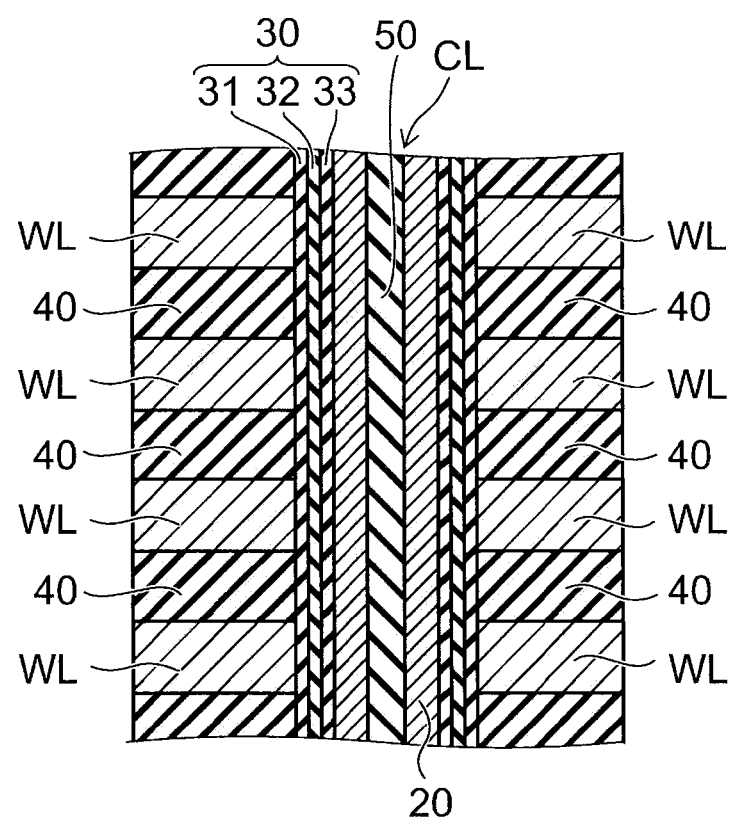
FIG. 4 is a schematic cross-sectional view of a memory cell of the semiconductor memory device of the embodiment.

FIG. 4 is an enlarged view of the portion provided with memory cells in the Y-Z cross section.

As shown in FIG. 2, the memory cell array 1 and the tier selecting section 2 are provided on the same substrate 10. The substrate 10 is e.g. a silicon substrate.

A circuit for driving or controlling the memory cell array 1 is formed on the surface of the substrate 10 and inside the substrate 10. The circuit includes transistors and interconnection layers. In FIG. 2, uppermost circuit interconnections 51b, 52, 53, 54 are shown.

Figure 5:
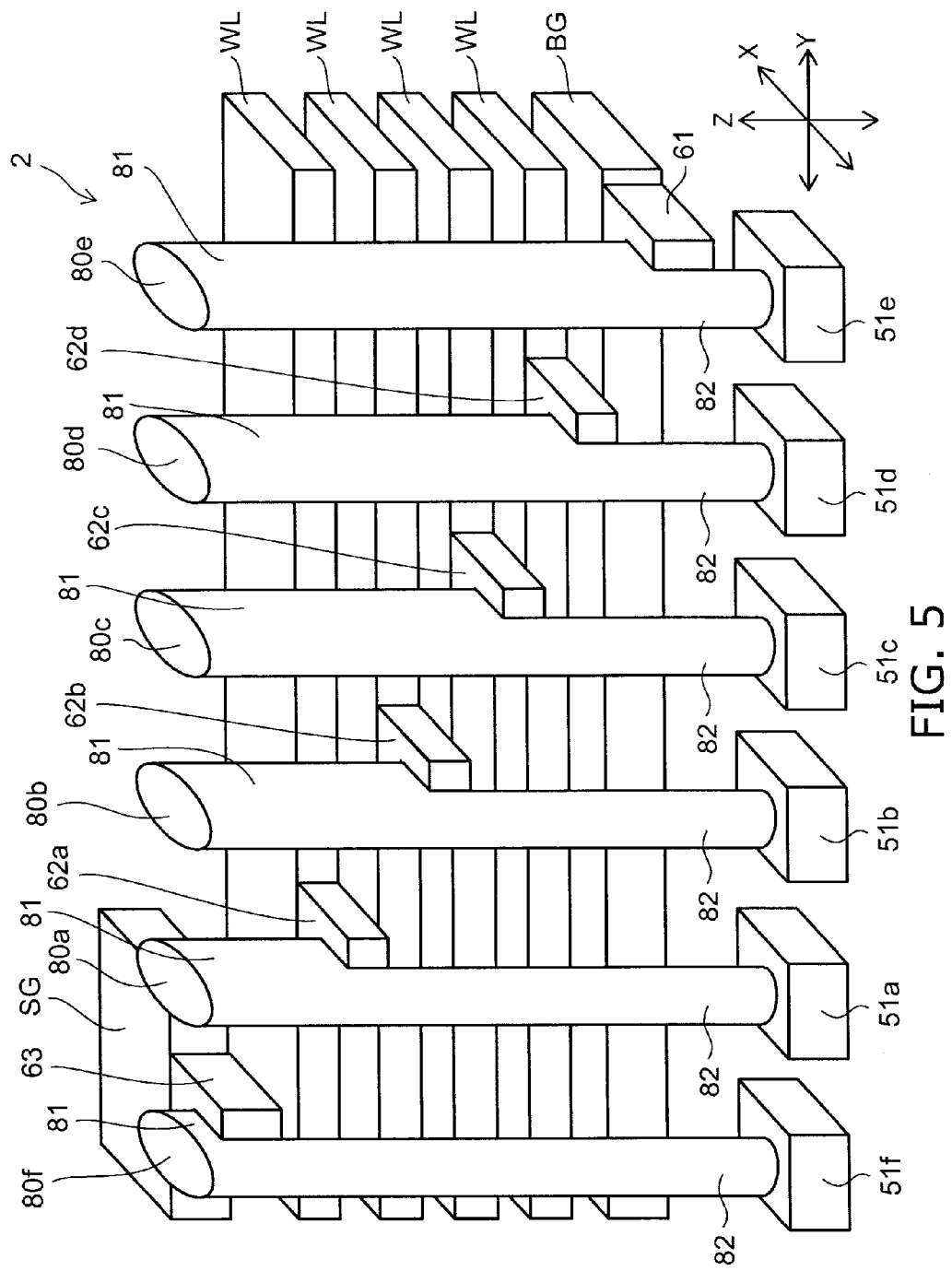
FIG. 5 is a schematic perspective view of a tier selecting section of the semiconductor memory device of the embodiment.

As shown in FIG. 5, other circuit interconnections 51a, 51c–51f are formed along the Y-direction on the rear side and the front side of the circuit interconnection 51b with respect to the page of FIG. 2.

As shown in FIG. 2, an insulating layer 41 is provided between the uppermost circuit interconnections and on the uppermost circuit interconnections. An insulating layer 42 different in kind from the insulating layer 41 is provided on the insulating layer 41. For instance, the insulating layer 41 is a layer primarily including silicon oxide. The insulating layer 42 is a layer primarily including silicon nitride.

The memory cell array 1 includes a stacked body in which a plurality of electrode layers WL and a plurality of insulating layers 40 are stacked alternately one by one.

This stacked body is provided on a back gate electrode layer (hereinafter simply referred to as back gate) BG. Here, the number of electrode layers WL shown in the figure is illustrative only. The number of electrode layers WL is arbitrary.

The back gate BG is provided on the insulating layer 42 via an insulating layer 43. The insulating layer 43 is e.g. a layer primarily including silicon oxide. The back gate BG and the electrode layer WL are conductive layers, such as silicon layers doped with impurity.

An insulating layer 46 is provided between the back gate BG and the lowermost electrode layer WL. The insulating layer 40 and the insulating layer 46 are e.g. layers primarily including silicon oxide.

As shown in FIG. 3, the memory cell array 1 includes a plurality of memory strings MS. One memory string MS is formed in a U-shape including a pair of columnar parts CL extending in the Z-direction and a joining part JP joining the respective lower ends of the pair of columnar parts CL. The columnar part CL is formed in e.g. a cylindrical shape, and penetrates through the stacked body.

A drain side select gate SGD is provided in one upper end part of the pair of columnar parts CL in the U-shaped memory string MS. A source side select gate SGS is provided in the other upper end part. As shown in FIG. 2, the drain side select gate SGD and the source side select gate SGS as upper select gates are provided on the uppermost electrode layer WL via the insulating layer 40.

The drain side select gate SGD and the source side select gate SGS are conductive layers, such as silicon layers doped with impurity. In the following description, the drain side select gate SGD and the source side select gate SGS may also be simply referred to as select gates SG without distinction.

The drain side select gate SGD and the source side select gate SGS are separated in the Y-direction by an insulating separation film 73. The stacked body below the drain side select gate SGD and the stacked body below the source side select gate SGS are separated in the Y-direction by an insulating separation film 47. That is, the stacked body between the pair of columnar parts CL in the U-shaped memory string MS is separated in the Y-direction by the insulating separation film 47.

A source line SL and a bit line BL are provided on the select gate SG. The source line SL and the bit line BL are e.g. metal films. As shown in FIGS. 1 and 2, a plurality of bit lines BL are arranged in the X-direction. Each bit line BL extends in the Y-direction.

An insulating layer 48 is provided between the bit line BL and the select gate SG, between the source line SL and the select gate SG, and between the bit line BL and the source line SL.

Figure 29:
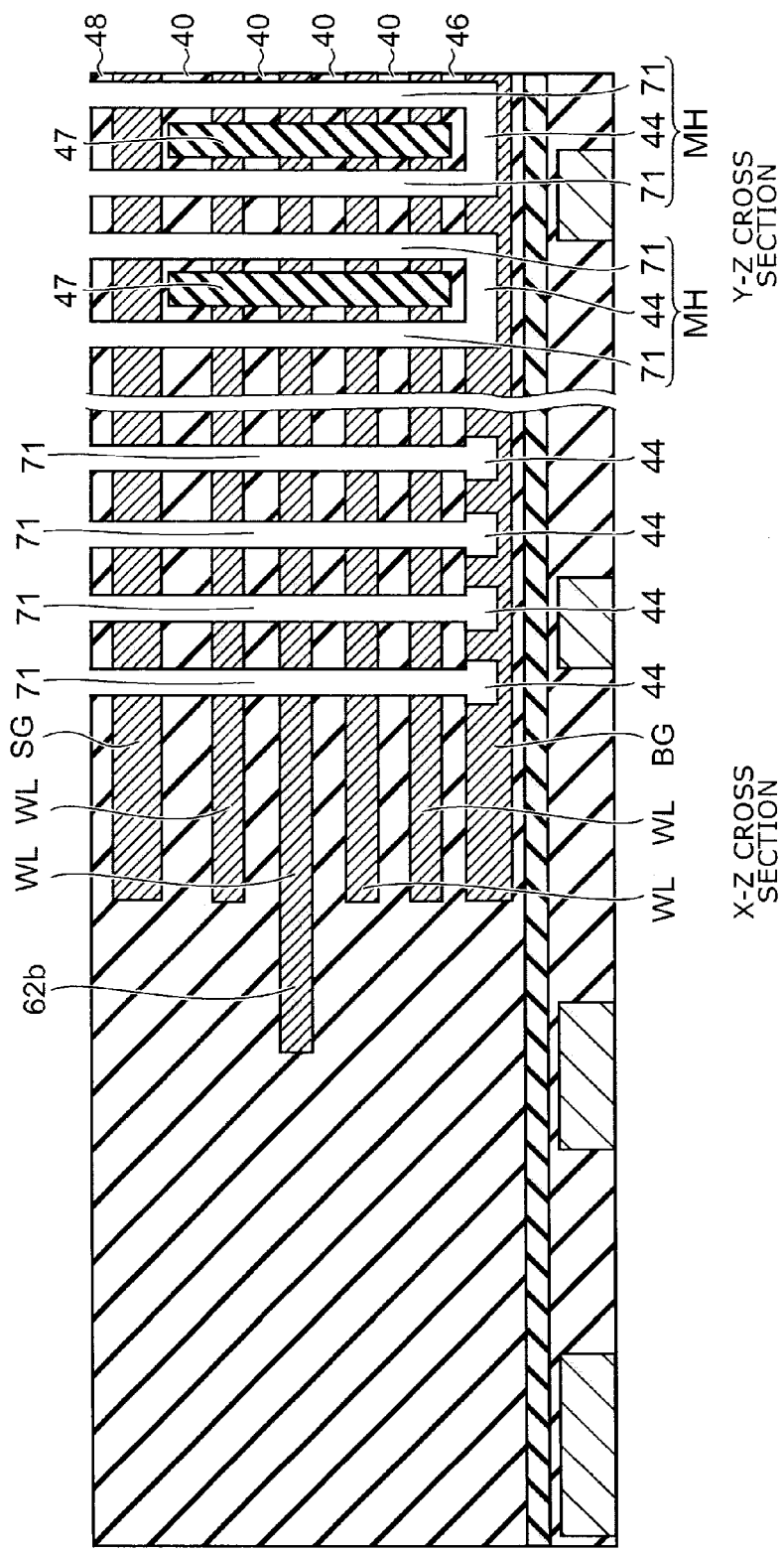

A U-shaped memory hole MH is formed in the back gate BG and the stacked body on the back gate BG as shown in FIG. 29 described later. A channel body 20 is provided in the memory hole MH. The channel body 20 is e.g. a silicon film. The impurity concentration of the channel body 20 is lower than the impurity concentration of the electrode layer WL.

A memory film 30 is provided between the inner wall of the memory hole MH and the channel body 20. As shown in FIG. 4, the memory film 30 includes a block film 31, a charge storage film 32, and a tunnel film 33. The block film 31, the charge storage film 32, and the tunnel film 33 are provided sequentially from the electrode layer WL side between the electrode layer WL and the channel body 20.

The channel body 20 is provided in a tubular shape. The memory film 30 in a tubular shape is provided so as to surround the outer peripheral surface of the channel body 20. The electrode layer WL surrounds the channel body 20 via the memory film 30. Furthermore, a core insulating film 50 is provided inside the channel body 20.

The block film 31 is in contact with the electrode layer WL. The tunnel film 33 is in contact with the channel body 20. The charge storage film 32 is provided between the block film 31 and the tunnel film 33.

The channel body 20 functions as a channel in the memory cell. The electrode layer WL functions as a control gate of the memory cell. The charge storage film 32 functions as a data memory layer for accumulating charge injected from the channel body 20. That is, a memory cell having a structure with the channel surrounded with the control gate is formed at the intersection of the channel body 20 and each electrode layer WL.

The semiconductor memory device of the embodiment is a nonvolatile semiconductor memory device capable of electrically and freely erasing/writing data and retaining its memory content even when powered off.

The memory cell is e.g. a charge trap type memory cell. The charge storage film 32 includes a large number of trap sites for trapping charge, and is e.g. a silicon nitride film.

The block film 31 is e.g. a silicon oxide film, a silicon nitride film, or a multilayer film thereof, and prevents the charge accumulated in the charge storage film 32 from diffusing into the electrode layer WL.

The tunnel film 33 serves as a potential barrier when charge is injected from the channel body 20 into the charge storage film 32, or when the charge accumulated in the charge storage film 32 is diffused into the channel body 20. The tunnel film 33 is e.g. a silicon oxide film, a silicon nitride film, a silicon oxynitride film, or a multilayer film including them.

As shown in FIG. 3, a drain side select transistor STD is provided in one upper end part of the pair of columnar parts CL in the U-shaped memory string MS. A source side select transistor STS is provided in the other upper end part.

The memory cell, the drain side select transistor STD, and the source side select transistor STS have a vertical channel structure in which the current flows in the Z-direction.

The drain side select gate SGD functions as a gate electrode (control gate) of the drain side select transistor STD. An insulating film functioning as a gate insulating film of the drain side select transistor STD is provided between the drain side select gate SGD and the channel body 20. The channel body of the drain side select transistor STD is connected with the bit line BL through the plug 113 shown in FIG. 2 above the drain side select gate SGD.

The source side select gate SGS functions as a gate electrode (control gate) of the source side select transistor STS. An insulating film functioning as a gate insulating film of the source side select transistor STS is provided between the source side select gate SGS and the channel body 20. The channel body of the source side select transistor STS is connected with the source line SL through the plug 114 shown in FIG. 2 above the source side select gate SGS.

A back gate transistor BGT is provided in the joining part JP of the memory string MS. The back gate BG functions as a gate electrode (control gate) of the back gate transistor BGT. The memory film 30 provided in the back gate BG functions as a gate insulating film of the back gate transistor BGT.

A plurality of memory cells with the respective electrode layers WL serving as control gates are provided between the drain side select transistor STD and the back gate transistor BGT. Likewise, a plurality of memory cells with the respective electrode layers WL serving as control gates are provided also between the source side select transistor STS and the back gate transistor BGT.

The plurality of memory cells, the drain side select transistor STD, the back gate transistor BGT, and the source side select transistor STS are series connected through the channel body 20 to constitute one U-shaped memory string MS. This memory string MS is arranged in a plurality in the X-direction and the Y-direction. Thus, a plurality of memory cells are provided three-dimensionally in the X-direction, the Y-direction, and the Z-direction.

The memory cell array 1 is provided in a memory array region on the substrate 10. As shown in FIG. 1, a plurality of columnar parts CL are arranged in a matrix configuration in the X-direction and the Y-direction in the memory array region.

The lower ends of a pair of columnar parts CL adjacent in the Y-direction are joined to form a U-shaped memory string MS.

In the example shown in FIG. 1, two tier selecting sections 2 are laid out so as to sandwich the memory cell array 1 in the X-direction.

The stacked body including a plurality of electrode layers WL is divided into a plurality in the Y-direction in the memory cell array region. Each block extends in the X-direction and is connected with the tier selecting section 2 on one end side of the block in the X-direction. The insulating separation film 47 is provided between the blocks adjacent in the Y-direction.

The pair of columnar parts CL joined at lower ends are provided, respectively, in a pair of blocks adjacent in the Y-direction across the insulating separation film 47.

The tier selecting section 2 is provided outside the memory cell array region on the substrate 10. In the tier selecting section 2, each electrode layer WL is not divided in the Y-direction, but is continuous in the Y-direction.

Next, the tier selecting section 2 is described with reference to FIGS. 2 and 5. FIG. 5 is a schematic perspective view of the region 100 enclosed with the dashed line in FIG. 2.

The positions in the X-direction of the end parts (end parts in the X-direction) of the back gate BG and the respective electrode layers WL in the tier selecting section 2 are aligned. Contact parts 61, 62*a*-62*d* are provided on the end parts.

A contact part 62*a* is provided on the end part of the uppermost electrode layer WL. A contact part 62*b* is provided on the end part of the second highest electrode layer WL. A contact part 62*c* is provided on the end part of the third highest electrode layer WL. A contact part 62*d* is provided on the end part of the fourth highest electrode layer WL. A contact part 61 is provided on the end part of the back gate BG.

A contact part 63 is provided also on the end part of the select gate SG.

Each contact part 61, 62*a*-62*d*, 63 is formed in a protruding shape projected from the end part of the corresponding layer in the X-direction on the opposite side from the memory cell array region. Each contact part 61, 62*a*-62*d*, 63 is integrally made of the same material (e.g., silicon doped with impurity) as the corresponding layer.

The contact parts 61, 62*a*-62*d*, 63 do not overlap each other in the Z-direction. The contact parts 61, 62*a*-62*d*, 63 are displaced in the Y-direction parallel to the surface of the substrate 10. The contact parts 61, 62*a*-62*d*, 63 are spaced in the Y-direction.

The aforementioned stacked body is not provided between the contact part 61, 62*a*-62*d*, 63 and the circuit interconnection 51*a*-51*f*. The select gate SG, the electrode layers WL, and the back gate BG do not lie below the contact parts 61, 62*a*-62*d*, 63.

The circuit interconnection 51*a*-51*f* is formed on the front side of the substrate 10 directly below each contact part 62*a*-62*d*, 61, 63. The circuit interconnections 51*a*-51*f* correspond to the uppermost interconnection in the circuit for applying a potential to the electrode layers WL, the back gate BG, and the select gate SG, respectively. The circuit interconnections 51*a*-51*f* are spaced in the Y-direction.

Each contact part 62*a*-62*d*, 61, 63 has an upper surface and a lower surface parallel to the upper surface and the lower surface of the corresponding layer. Furthermore, each contact part 62*a*-62*d*, 61, 63 has a pair of side surfaces and an end surface (a surface formed at the end in the X-direction) formed between the upper surface and the lower surface.

The X-direction end part of each layer and the contact part 62*a*-62*d*, 61, 63 are covered with the insulating layer 49 shown in FIG. 2.

The contact parts 62*a*-62*d*, 61, 63 are electrically connected with the circuit interconnections 51*a*-51*f* through plugs 80*a*-80*f*, respectively. The plug 80*a*-80*f* primarily includes a metal material (e.g., tungsten).

Each plug 80*a*-80*f* is in contact with the upper surface and the end surface of the corresponding contact part 62*a*-62*d*, 61, 63. The lower end of each plug 80*a*-80*f* is in contact with the corresponding circuit interconnection 51*a*-51*f*.

That is, the uppermost electrode layer WL is electrically connected to the circuit interconnection 51*a* through the contact part 62*a* and the plug 80*a*. The second highest electrode layer WL is electrically connected to the circuit interconnection 51*b* through the contact part 62*b* and the plug 80*b*. The third highest electrode layer WL is electrically connected to the circuit interconnection 51*c* through the contact part 62*c* and the plug 80*c*. The fourth highest electrode layer WL is electrically connected to the circuit interconnection 51*d* through the contact part 62*d* and the plug 80*d*. The back gate BG is electrically connected to the circuit interconnection 51*e* through the contact part 61 and the plug 80*e*. The select gate SG is electrically connected to the circuit interconnection 51*f* through the contact part 63 and the plug 80*f*.

Each plug 80*a*-80*f* is formed in a cylindrical shape extending in the direction (Z-direction) connecting the corresponding contact part 62*a*-62*d*, 61, 63 with the corresponding circuit interconnection 51*a*-51*f* in the insulating layer 49.

Each plug 80*a*-80*f* has an upper part 81 and a lower part 82 smaller in diameter than the upper part 81. The upper part 81 and the lower part 82 are integrally made of the same material. A cross-sectional area parallel to the surface direction of the substrate 10 of the upper part 81 is larger than a cross-sectional area parallel to the surface direction of the lower part 82.

The upper part 81 is provided above the corresponding contact part 62*a*-62*d*, 61, 63. The lower end of the upper part 81 reaches the upper surface of the corresponding contact part 62*a*-62*d*, 61, 63.

The lower part 82 is in contact with the end surface of the corresponding contact part 62*a*-62*d*, 61, 63 and extends downward. The lower end of the lower part 82 penetrates through the insulating layer 42 and the insulating layer 41 provided on the corresponding circuit interconnection 51*a*-51*f* and reaches the corresponding circuit interconnection 51*a*-51*f*.

In the memory cell array 1 of the embodiment, the drain side select gate SGD switches on/off the electrical continuity between the bit line BL and the channel body 20. The source side select gate SGS switches on/off the electrical continuity between the source line SL and the channel body 20.

The channel body 20 can be made electrically continuous with the bit line BL by applying a desired potential to the drain side select gate SGD through the contact part 63. The channel body 20 can be made electrically continuous with the source line SL by applying a desired potential to the source side select gate SGS through the contact part 63.

The bit line BL and the source line SL are connected with the circuit interconnection 52 through an upper-layer interconnection 111 (shown in FIG. 2) formed above the stacked body in which memory cells are formed. That is, the upper-layer interconnection 111 is connected with the plug 112 extending in the insulating layer 49 therebelow toward the circuit interconnection 52. The lower end of the plug 112 is connected with the circuit interconnection 52.

Furthermore, a tier of the electrode layers WL is selected through the tier selecting section 2. That is, a desired potential can be applied to each electrode layers WL through the corresponding circuit interconnection 51a-51f, the corresponding plug 80a-80f, and the corresponding contact part 62a-62d. Furthermore, a desired potential can be applied to the back gate BG through the circuit interconnection 51e, the plug 80e, and the contact part 61.

According to the embodiment, other contact parts 62a-62d, 61, 63 do not lie below each contact part 62a-62d, 61, 63. Furthermore, the electrode layers WL, the back gate BG, and the select gate SG do not also lie below each contact part 62a-62d, 61, 63.

Thus, the respective electrode layers WL, the back gate BG, and the select gate SG can be directly connected with the circuit interconnections 51a-51f below the stacked body through the plug 80a-80f extending downward from the corresponding contact part 62a-62d, 61, 63 without traversing the upper-layer interconnection routed on the stacked body.

Accordingly, the interconnection path connecting each layer with the circuit interconnection is made shorter than in the case of traversing the upper-layer interconnection. This can suppress the propagation delay of signals.

Furthermore, the area of the interconnection formation region connecting each layer with the circuit interconnection can be made smaller than that of the interconnection routing structure traversing the upper-layer interconnection. Thus, the total chip area can be reduced, leading to cost reduction.

Here, the select gate SG is divided into more blocks (drain side select gate SGD, source side select gate SGS) than the electrode layers WL and the back gate BG. Dense packing of contact parts and plugs should be avoided. Thus, the drain side select gate SGD and the source side select gate SGS are not limited to being connected with the circuit interconnection 51f through the contact part 63 and the plug 80f shown in FIG. 5.

Figure 6:
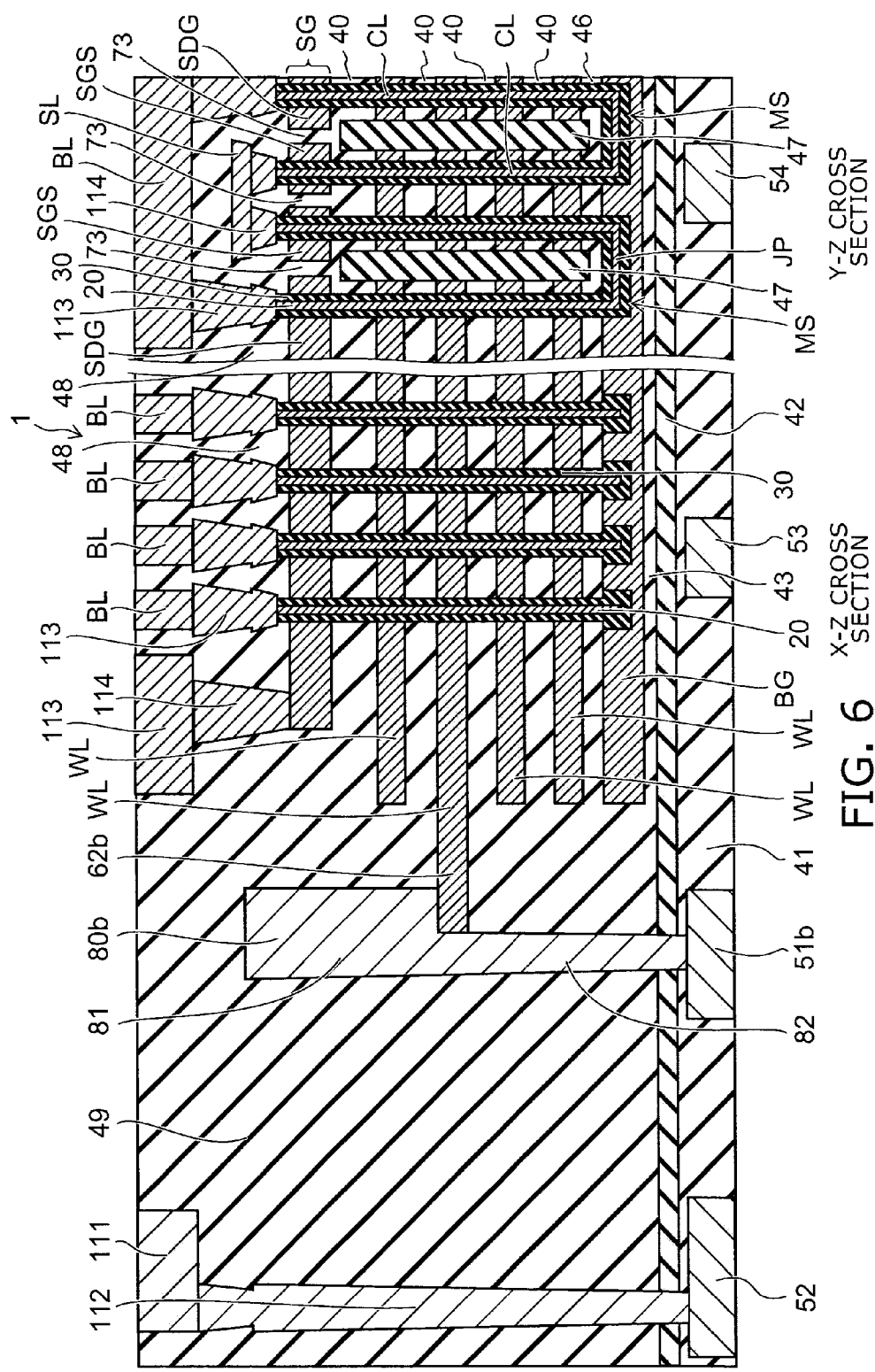
FIG. 6 is a schematic cross-sectional view of the semiconductor memory device of the embodiment.

As shown in FIG. 6, part of the drain side select gates SGD and the source side select gates SGS may be connected with the circuit interconnection through an upper-layer interconnection 113 formed on the select gates SG.

Part of the select gates SG are connected with the upper-layer interconnection 113 through a plug 114 provided on the select gate SG. The upper-layer interconnection 113 is routed as the upper-layer interconnection 111 outside the region provided with the stacked body. The upper-layer interconnection 111 is connected with the circuit interconnection 52 through the plug 112 extending downward from the upper-layer interconnection 111.

For the select gate SG divided in a larger number than the electrode layers WL and the back gate BG, dense packing of the connection structure thereof can be suppressed by combining the structure of direct connection to the circuit interconnection therebelow and the structure of connection to the circuit interconnection through the upper-layer interconnection. This facilitates processing and enhances the reliability.

Next, a method for manufacturing a semiconductor memory device of the embodiment is described with reference to FIGS. 7A to 33.

The X-Z cross section and the Y-Z cross section in each process sectional view correspond to the X-Z cross section and the Y-Z cross section in FIG. 2, respectively.

As shown in FIG. 7A, a peripheral circuit for controlling the memory cell array is formed on the substrate 10. The peripheral circuit includes transistors and interconnection layers. In FIG. 7A, uppermost interconnection layers 51b, 52-54 in the peripheral circuit are shown. The substrate 10 is not shown in FIG. 7B and the subsequent figures.

The interconnection layers 51b, 52-54 are covered with an insulating layer 41. An insulating layer 42 different in material from the insulating layer 41 is formed on the insulating layer 41. For instance, the insulating layer 41 primarily includes silicon oxide. The insulating layer 42 primarily includes silicon nitride. The insulating layer 42 functions as a stopper film for etching in a later step.

An insulating layer 43 different in material from the insulating layer 42 and primarily including silicon oxide is formed on the insulating layer 42. A back gate BG is formed on the insulating layer 43. The back gate BG is a silicon layer doped with impurity such as boron.

As shown in FIG. 7B, a plurality of recesses 44 are formed in the back gate BG. The recesses 44 are formed by e.g. RIE (reactive ion etching) technique using a resist film, not shown, as a mask.

As shown in FIG. 8A, a sacrificial film 45 such as a silicon nitride film is embedded in the recess 44 by CVD (chemical vapor deposition) technique.

FIG. 8B shows an A-A cross section in FIG. 8A.

That is, a plurality of circuit interconnections 51a-51f are arranged in the Y-direction.

Figure 9A:
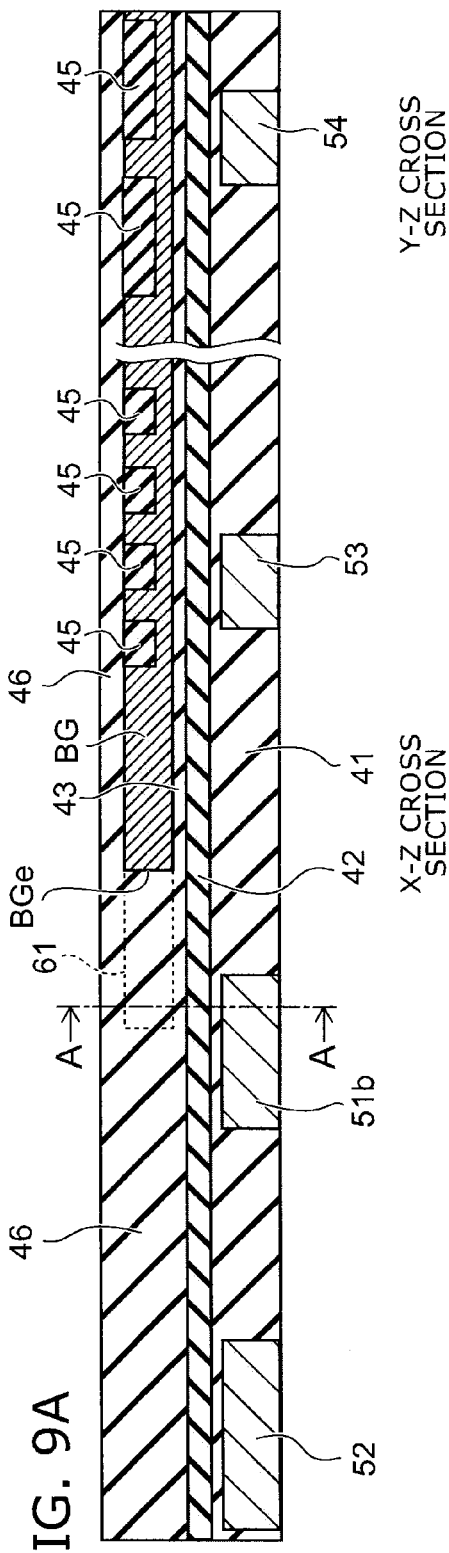
Figure 9B:
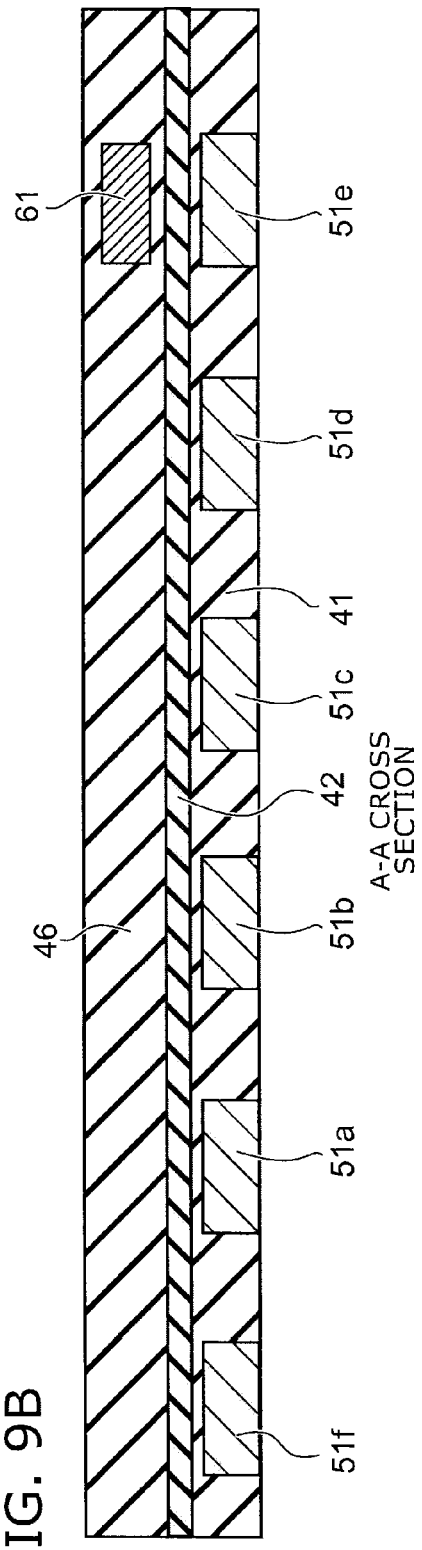

FIG. 9A shows a step subsequent to FIG. 8A. FIG. 9B shows an A-A cross section in FIG. 9A.

The back gate BG is processed by etching using a mask, not shown. Thus, a contact part 61 in a protruding shape is formed on the X-direction end part of the back gate BG. The contact part 61 is projected in the X-direction toward the opposite side from the region (memory cell array region) embedded with the sacrificial film 45.

The end surface BGe of the back gate BG and the contact part 61 are covered with an insulating layer 46. Furthermore, the insulating layer 46 is formed on the back gate BG and on the sacrificial film 45. The insulating layer 46 is e.g. a layer primarily including silicon oxide.

As shown in FIGS. 10A and 10B, an electrode layer WL is formed on the insulating layer 46. FIG. 10B shows an A-A cross section in FIG. 10A. The electrode layer WL is a silicon layer doped with impurity such as boron.

Figure 11A:
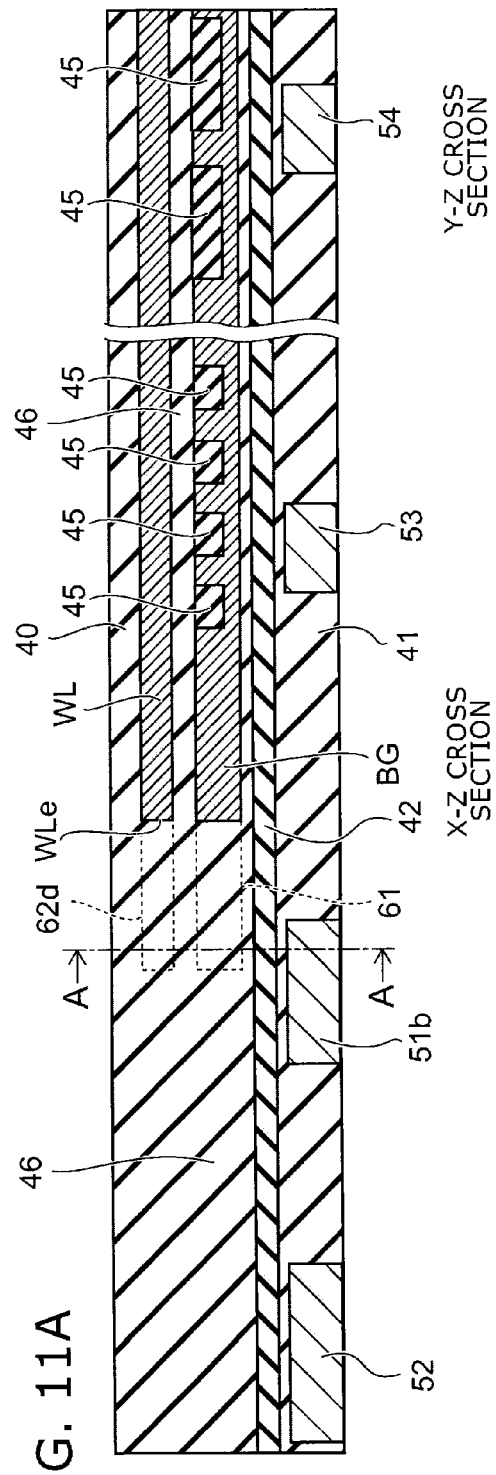
Figure 11B:
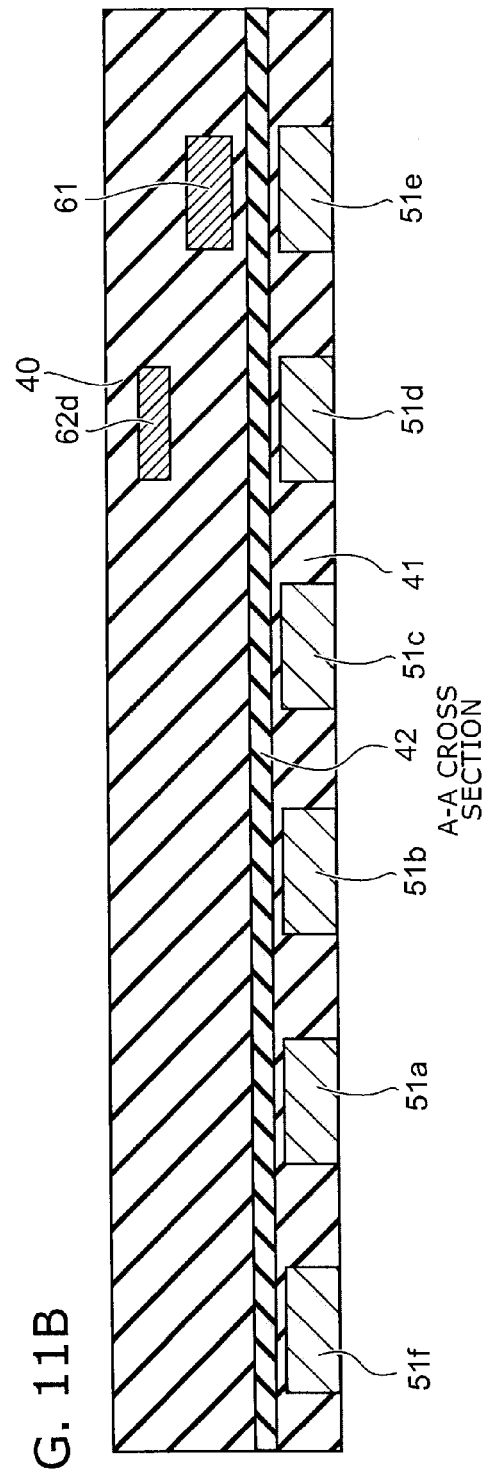

The electrode layer WL is processed by etching using a mask, not shown. Thus, as shown in FIGS. 11A and 11B, a contact part 62d in a protruding shape is formed on the X-direction end part of the electrode layer WL. The contact part 62d is projected in the X-direction toward the opposite side from the memory cell array region. FIG. 11B shows an A-A cross section in FIG. 11A.

As shown in FIG. 11B, the contact part 62d does not overlap the contact part 61 of the back gate BG. The contact part 62d is displaced in the Y-direction from the contact part 61.

The end surface WLe of the electrode layer WL and the contact part 62d are covered with an insulating layer 40. Furthermore, the insulating layer 40 is further stacked on the electrode layer WL. The insulating layer 40 is e.g. a layer primarily including silicon oxide.

As shown in FIGS. 12A and 12B, an electrode layer WL is further stacked on the insulating layer 40. FIG. 12B shows an A-A cross section in FIG. 12A.

The electrode layer WL is processed by etching using a mask, not shown. Thus, as shown in FIGS. 13A and 13B, a contact part 62c in a protruding shape is formed on the X-direction end part of the electrode layer WL. The contact part 62c is projected in the X-direction toward the opposite side from the memory cell array region. FIG. 13B shows an A-A cross section in FIG. 13A.

As shown in FIG. 13B, the contact part 62c does not overlap the contact part 61 of the back gate BG and the contact part 62d of the underlying electrode layer WL. The contact part 62c is displaced in the Y-direction from the contact parts 61 and 62d.

The end surface WLe of the electrode layer WL and the contact part 62c are covered with an insulating layer 40. Furthermore, the insulating layer 40 is further stacked on the electrode layer WL.

Figure 14:
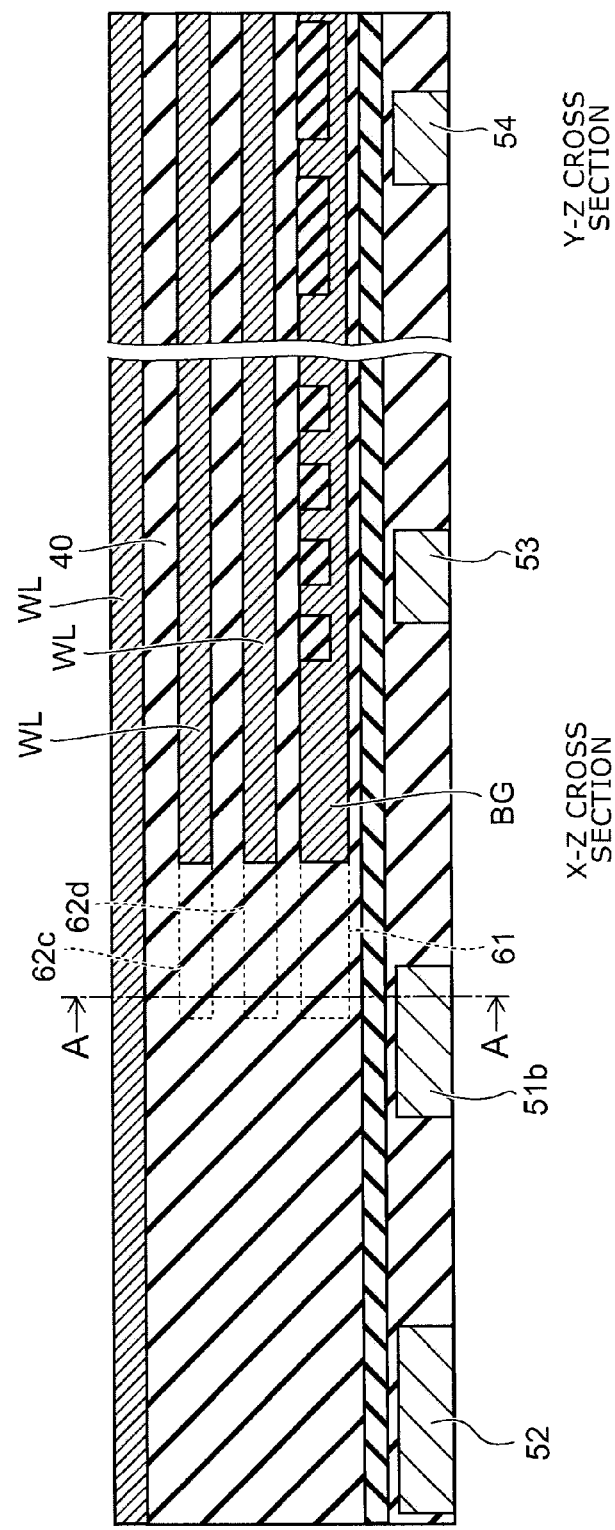
Figure 15:
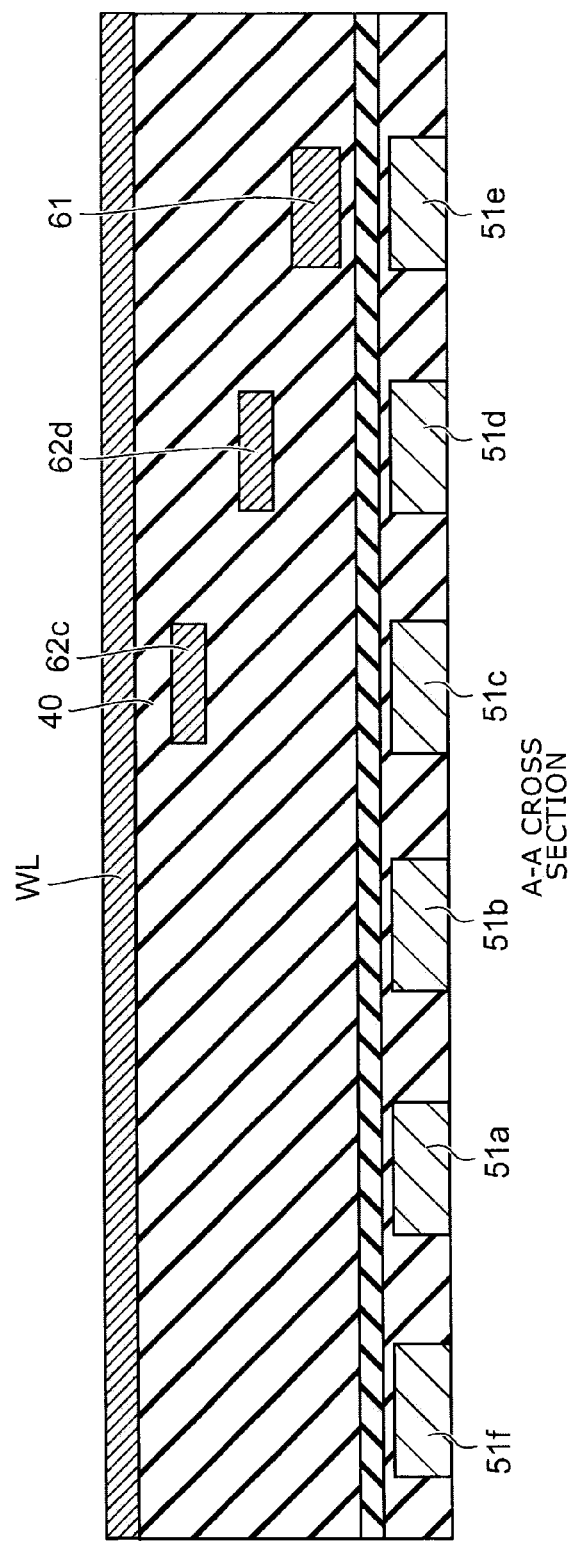

As shown in FIGS. 14 and 15, an electrode layer WL is further stacked on the insulating layer 40. FIG. 15 shows an A-A cross section in FIG. 14.

Figure 16:
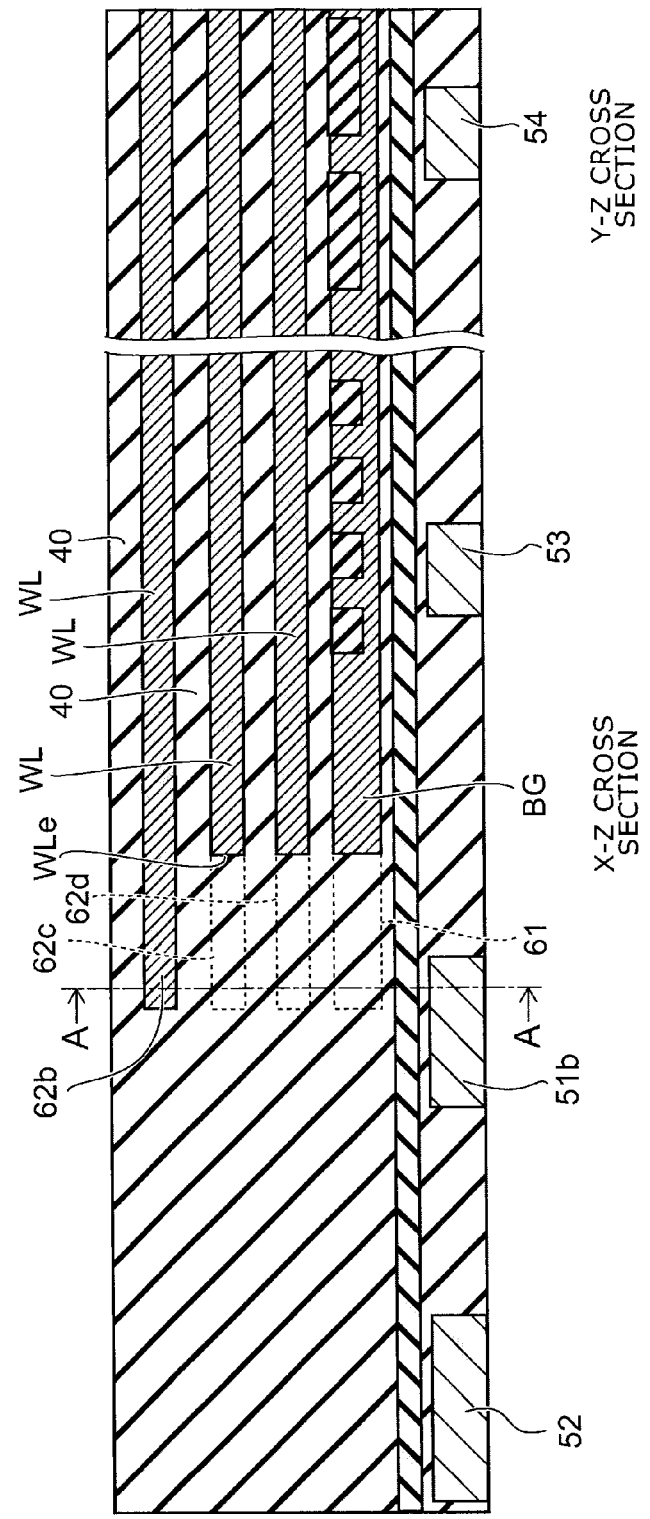
Figure 17:
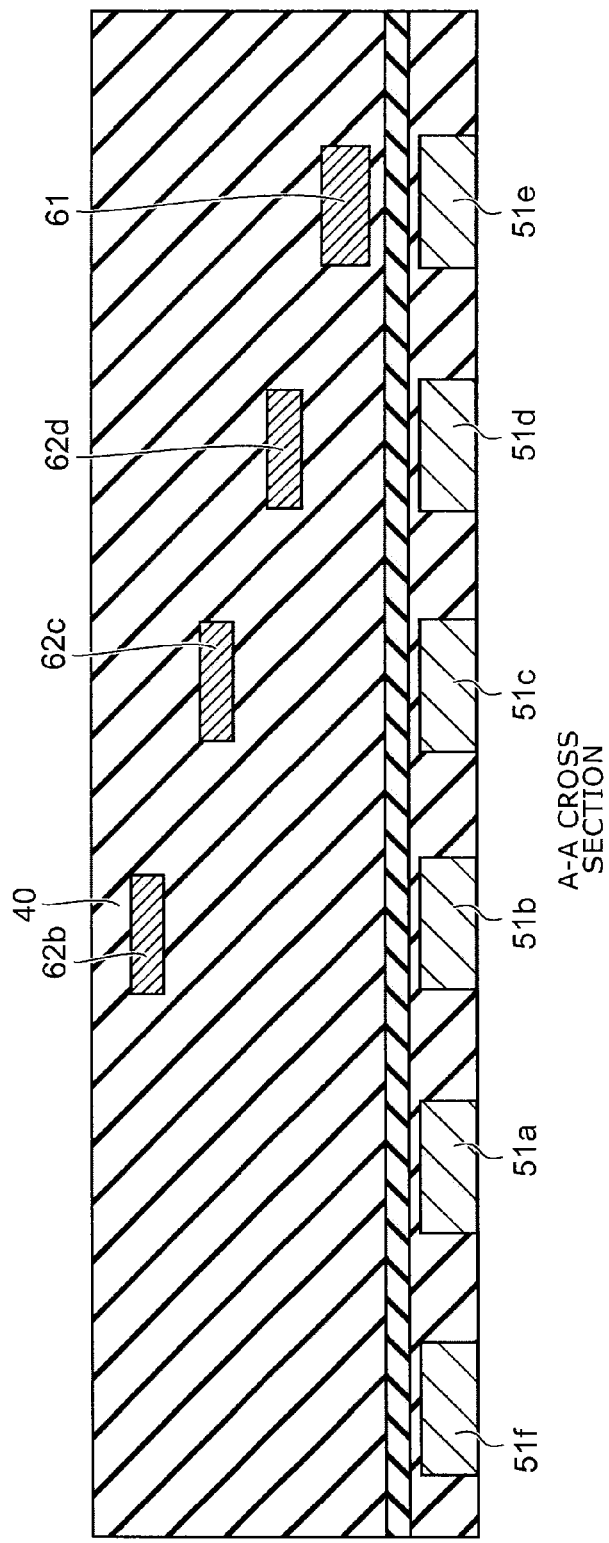

The electrode layer WL is processed by etching using a mask, not shown. Thus, as shown in FIGS. 16 and 17, a contact part 62b in a protruding shape is formed on the X-direction end part of the electrode layer WL. The contact part 62b is projected in the X-direction toward the opposite side from the memory cell array region. FIG. 17 shows an A-A cross section in FIG. 16.

As shown in FIG. 17, the contact part 62b does not overlap the contact part 61 of the back gate BG and the contact parts 62d and 62c of the underlying electrode layers WL. The contact part 62b is displaced in the Y-direction from the contact parts 61, 62d, and 62c.

The end surface of the electrode layer WL and the contact part 62b are covered with an insulating layer 40. Furthermore, the insulating layer 40 is further stacked on the electrode layer WL.

Figure 18:
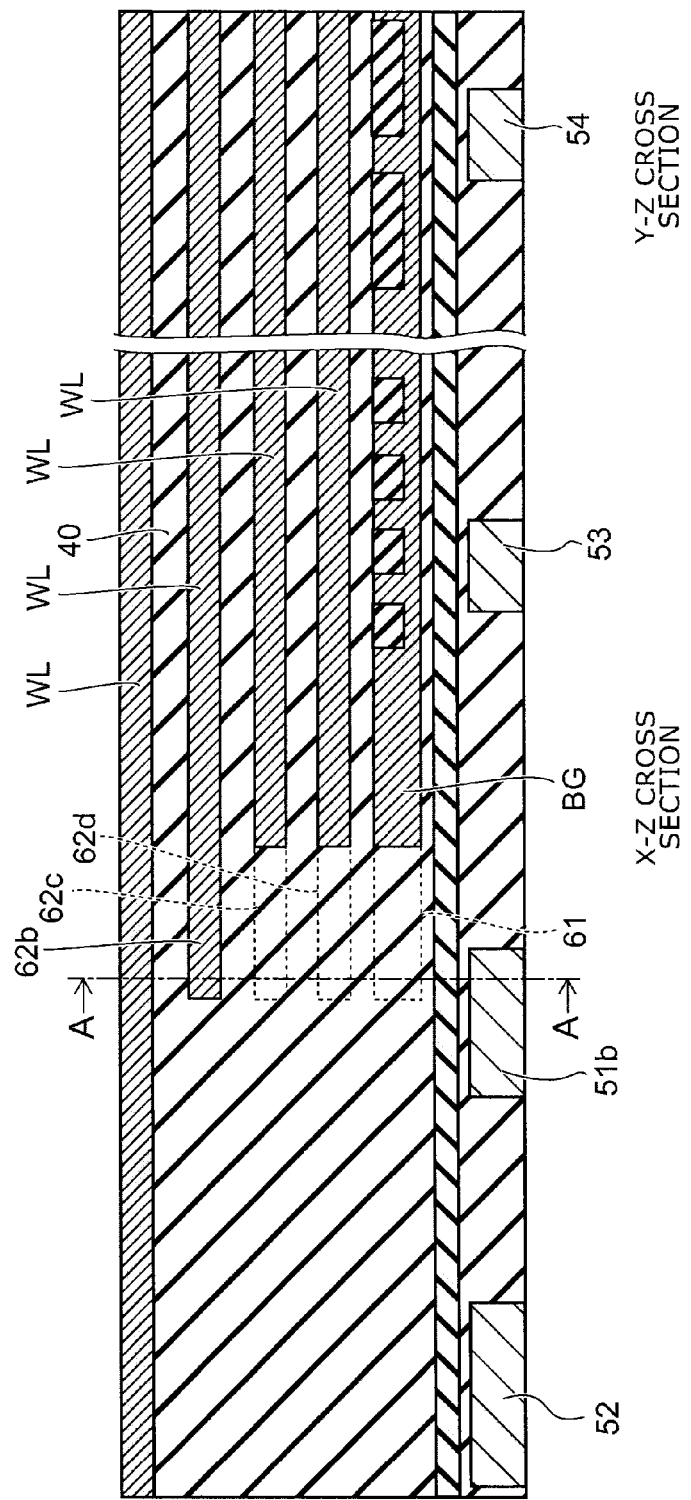
Figure 19:
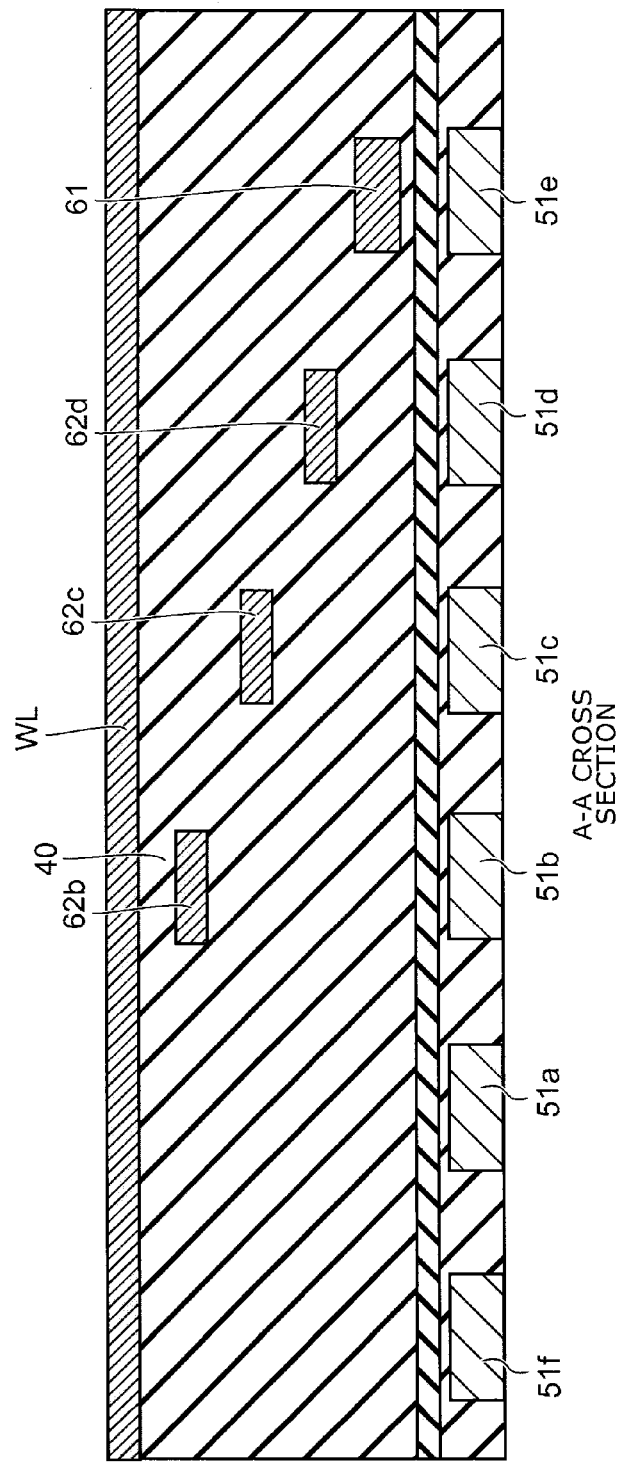

As shown in FIGS. 18 and 19, an electrode layer WL is further stacked on the insulating layer 40. FIG. 19 shows an A-A cross section in FIG. 18.

Figure 20:
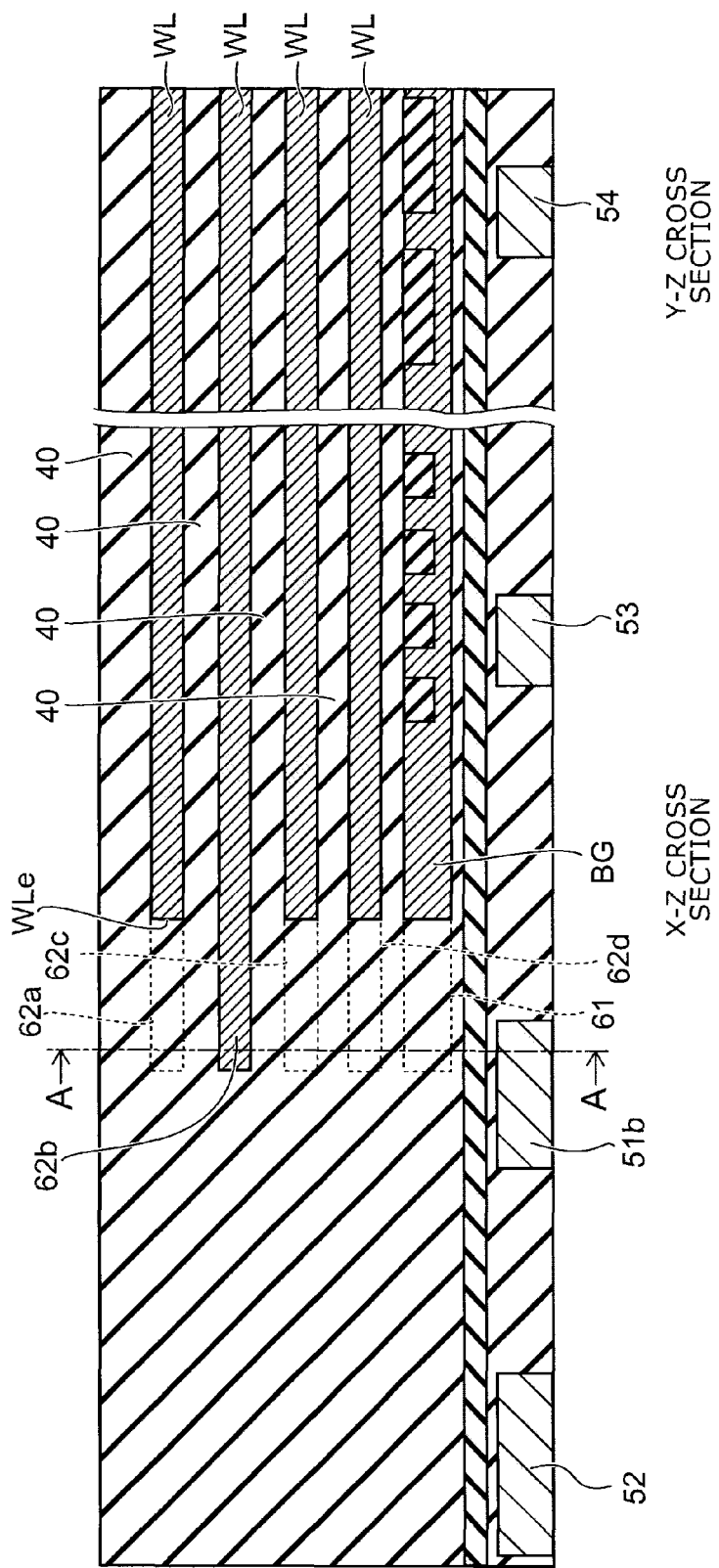
Figure 21:
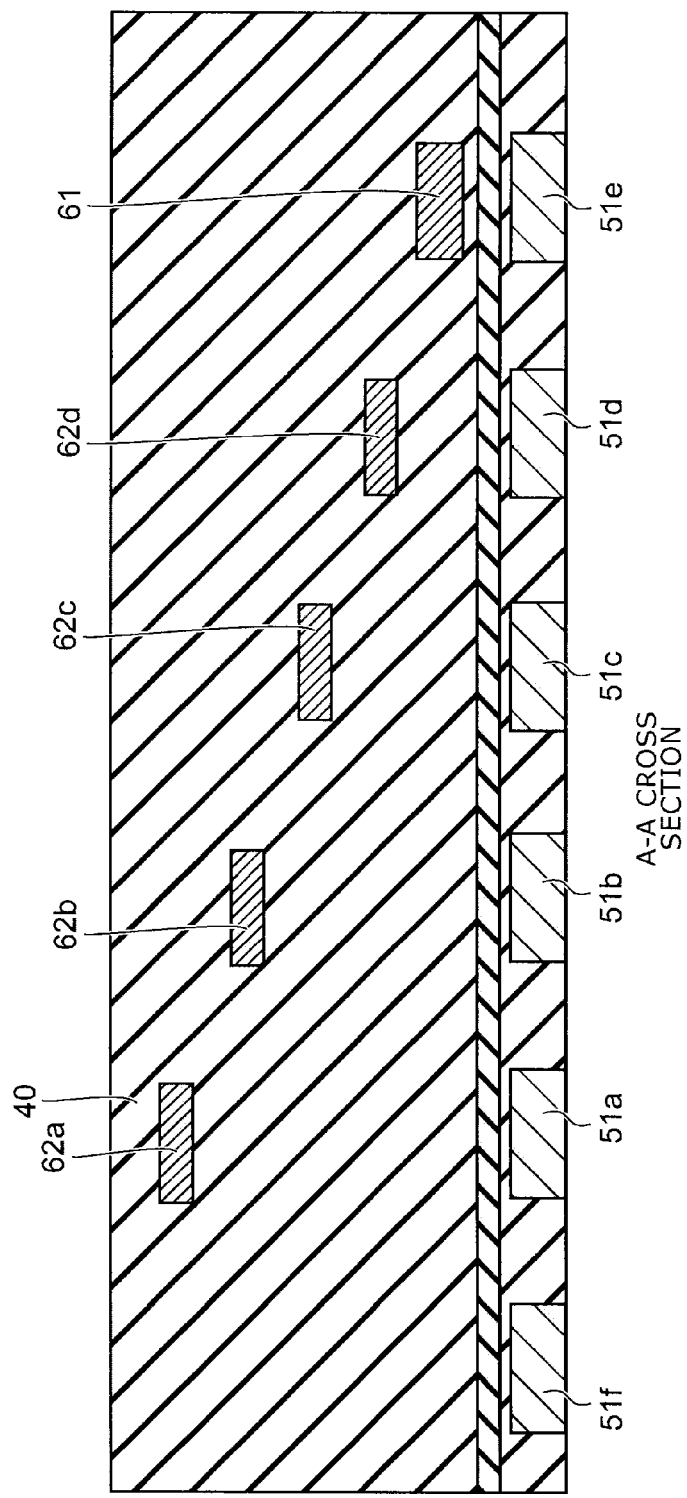

The electrode layer WL is processed by etching using a mask, not shown. Thus, as shown in FIGS. 20 and 21, a contact part 62a in a protruding shape is formed on the X-direction end part of the electrode layer WL. The contact part 62a is projected in the X-direction toward the opposite side from the memory cell array region. FIG. 21 shows an A-A cross section in FIG. 20.

As shown in FIG. 21, the contact part 62a does not overlap the contact part 61 of the back gate BG and the contact parts 62d, 62c, and 62b of the underlying electrode layers WL. The contact part 62a is displaced in the Y-direction from the contact parts 61, 62d, 62c, and 62b.

The end surface WLe of the electrode layer WL and the contact part 62a are covered with an insulating layer 40. Furthermore, the insulating layer 40 is further stacked on the electrode layer WL.

Figure 22:
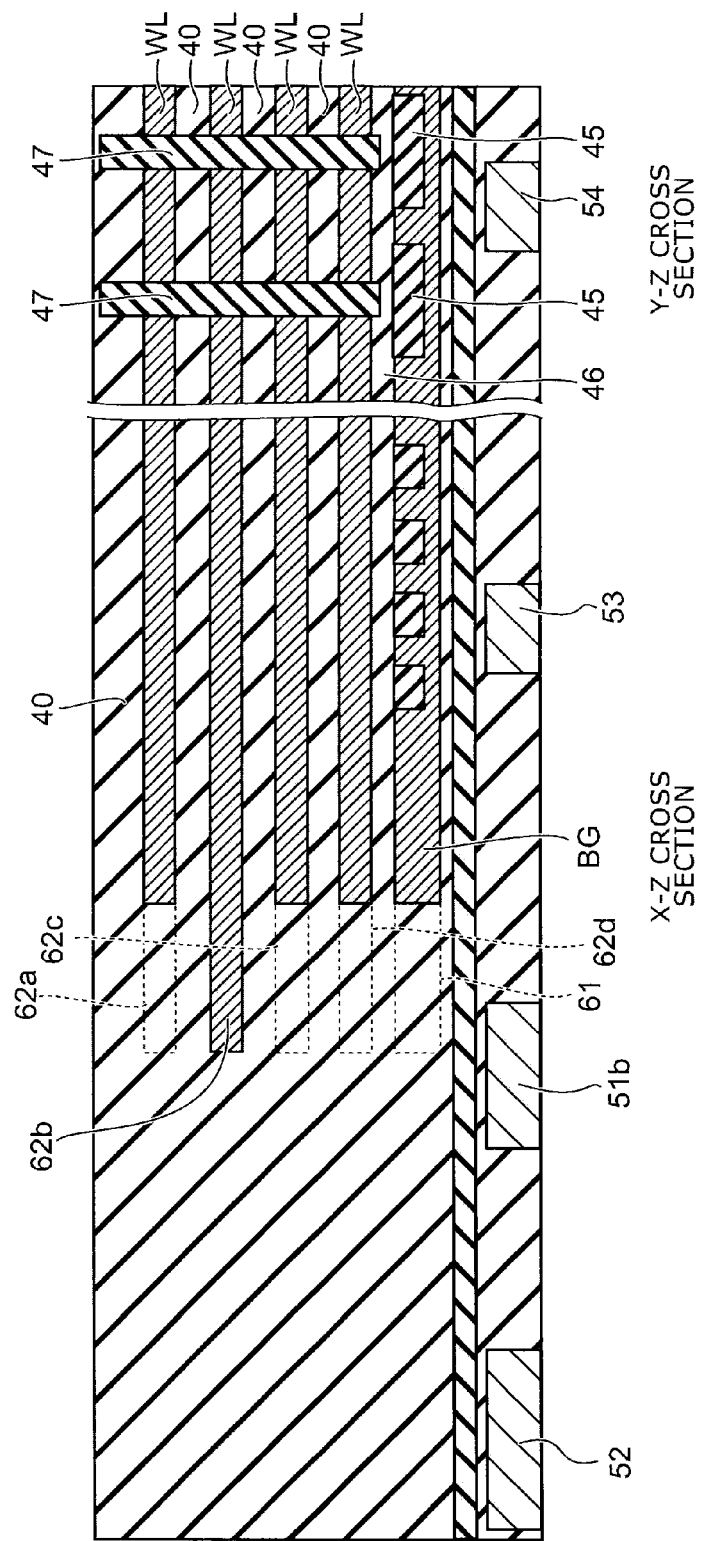

Next, a slit is formed in the stacked body in the memory cell array region. Then, an insulating separation film 47 shown in FIG. 22 is embedded in the slit.

The insulating separation film 47 divides a plurality of electrode layers WL in the Y-direction on the sacrificial film 45 embedded in the back gate BG. The insulating separation film 47 extends in the X-direction as shown in FIG. 1.

Figure 23:
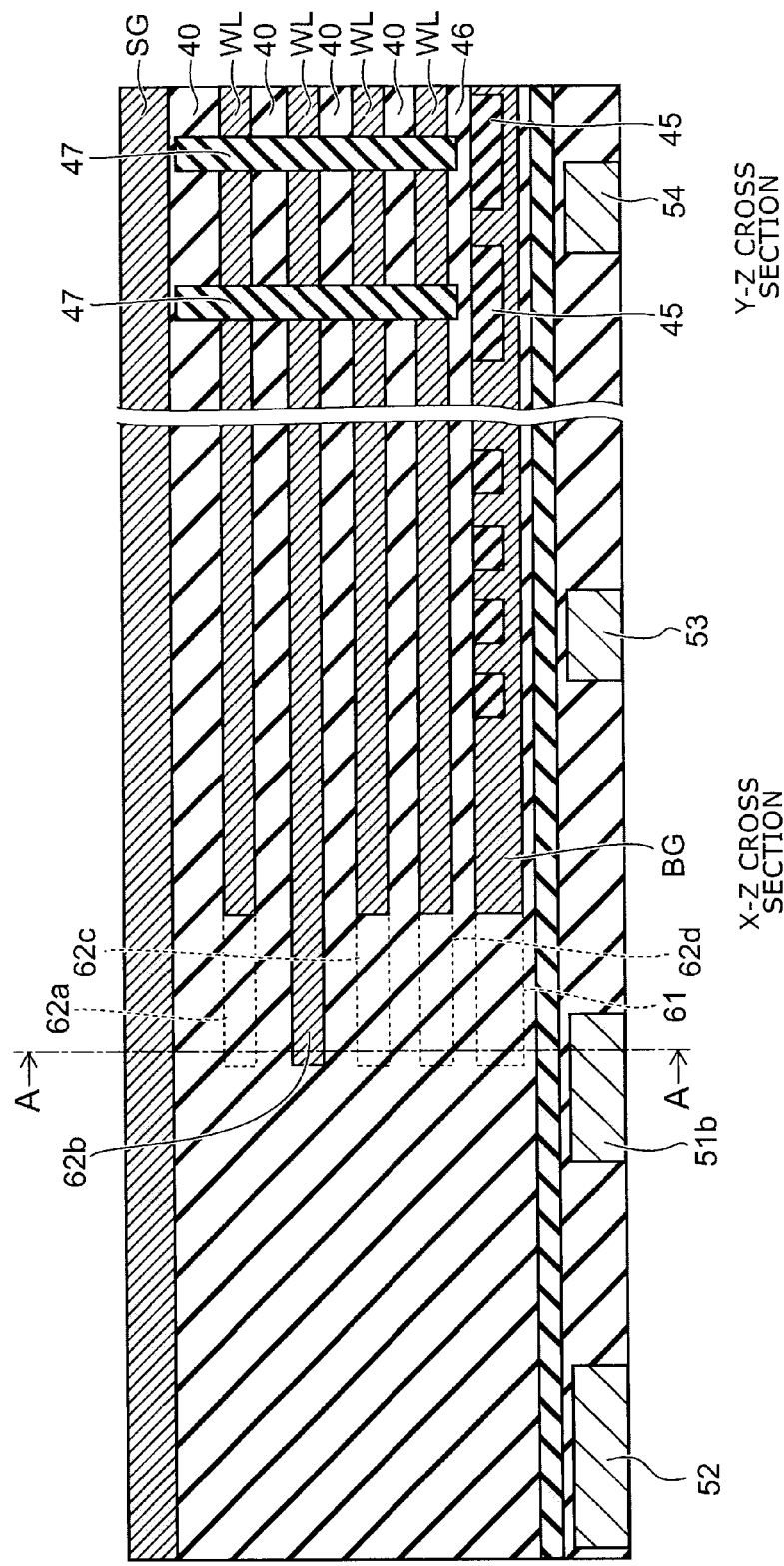
Figure 24:
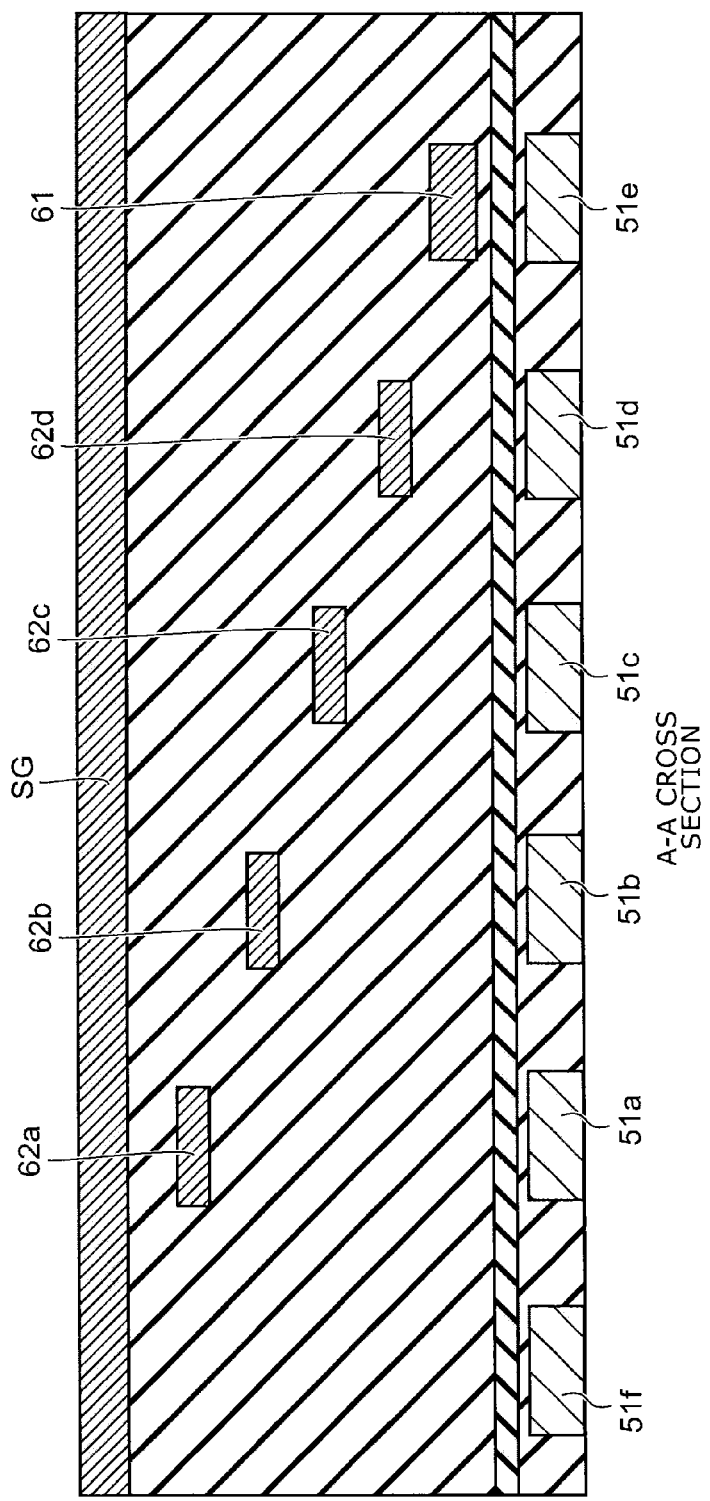

Next, as shown in FIGS. 23 and 24, a select gate SG is stacked on the uppermost insulating layer 40. FIG. 24 shows an A-A cross section in FIG. 23. The select gate SG is a silicon layer doped with impurity such as boron.

Figure 25:
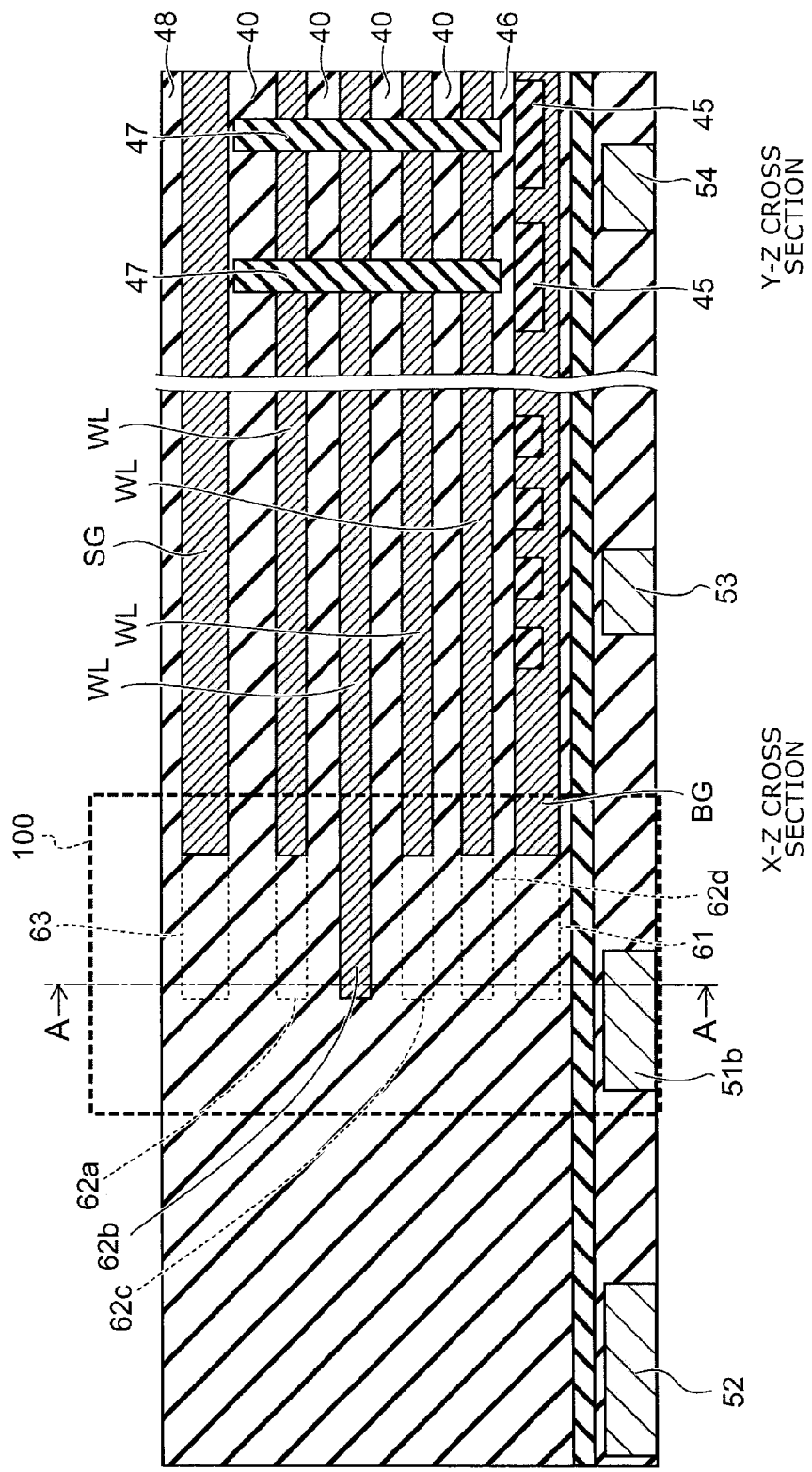
Figure 26:
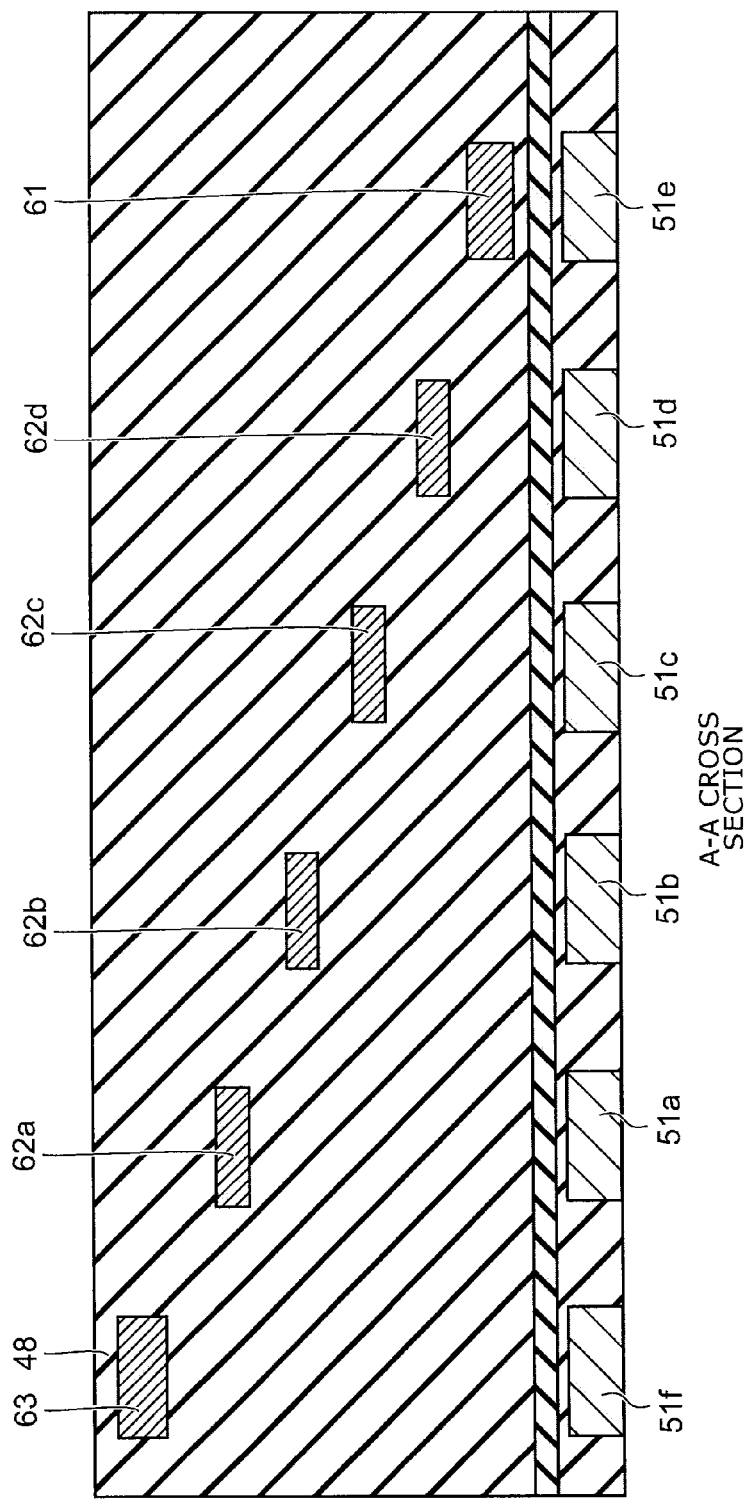

The select gate SG is processed by etching using a mask, not shown. Thus, as shown in FIGS. 25 and 26, a contact part 63 in a protruding shape is formed on the X-direction end part of the select gate SG. The contact part 63 is projected in the X-direction toward the opposite side from the memory cell array region. FIG. 26 shows an A-A cross section in FIG. 25.

As shown in FIG. 26, the contact part 63 does not overlap the contact part 61 of the back gate BG and the contact parts 62d, 62c, 62b, and 62a of the underlying electrode layers WL. The contact part 63 is displaced in the Y-direction from the contact parts 61, 62d, 62c, 62b, and 62a.

The end surface of the select gate SG and the contact part 63 are covered with an insulating layer 48. Furthermore, the insulating layer 48 is stacked on the select gate SG.

Figure 27:
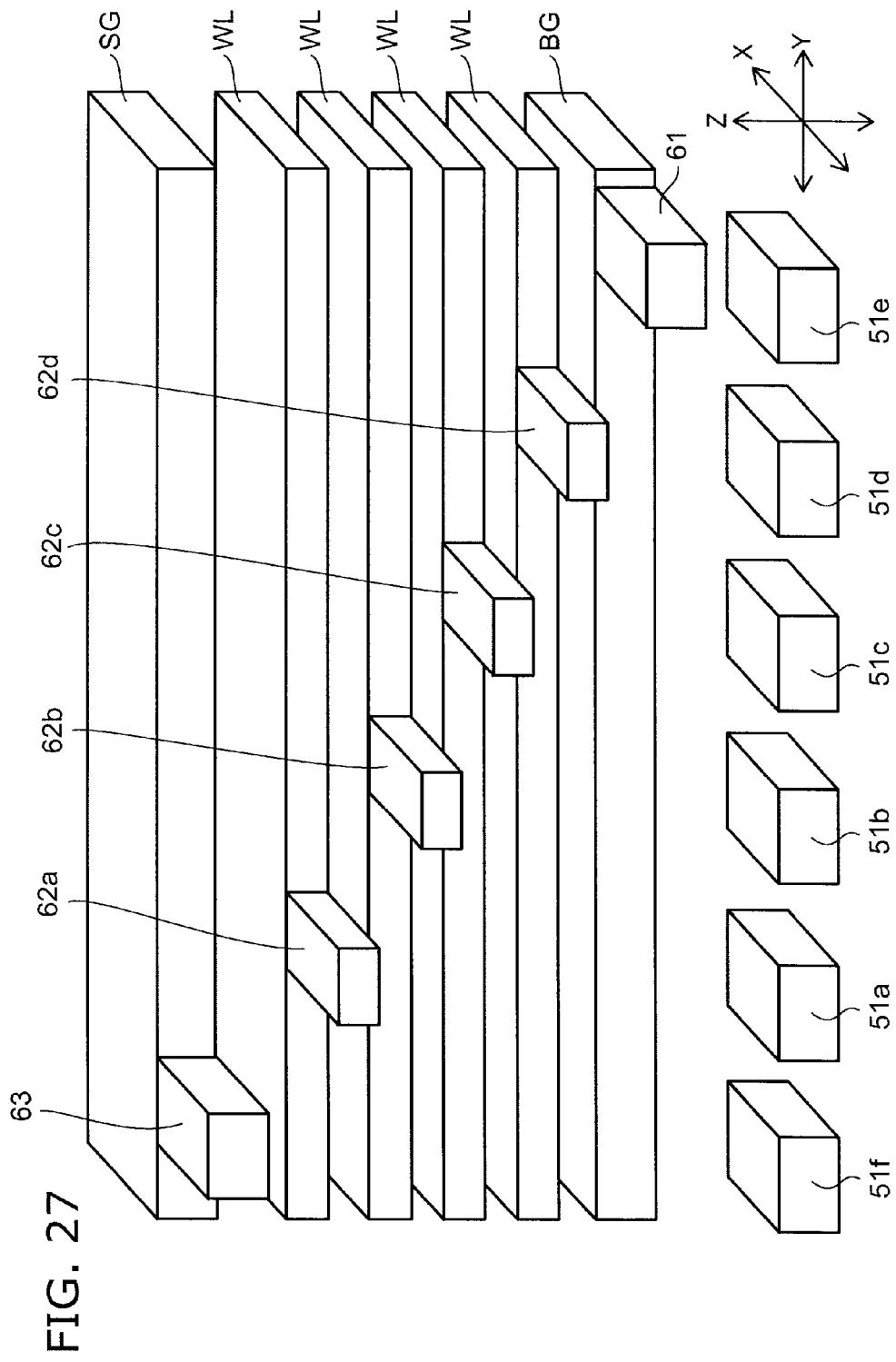

FIG. 27 is a schematic perspective view of the region 100 enclosed with the dashed line in FIG. 25.

As shown in FIG. 27, the contact parts 63, 62a-62d, 61 in a protruding shape are formed in the respective end parts of the select gate SG, the electrode layers WL, and the back gate BG.

The contact parts 63, 62a-62d, 61 do not overlap each other in the Z-direction, but are displaced in the Y-direction from each other. Furthermore, the circuit interconnections 51a-51f are formed directly below the contact parts 62a-62d, 61, 63.

The select gate SG, the electrode layers WL, and the back gate BG are not formed between the contact part 62a-62d, 61, 63 and the circuit interconnection 51a-51f.

Figure 28:
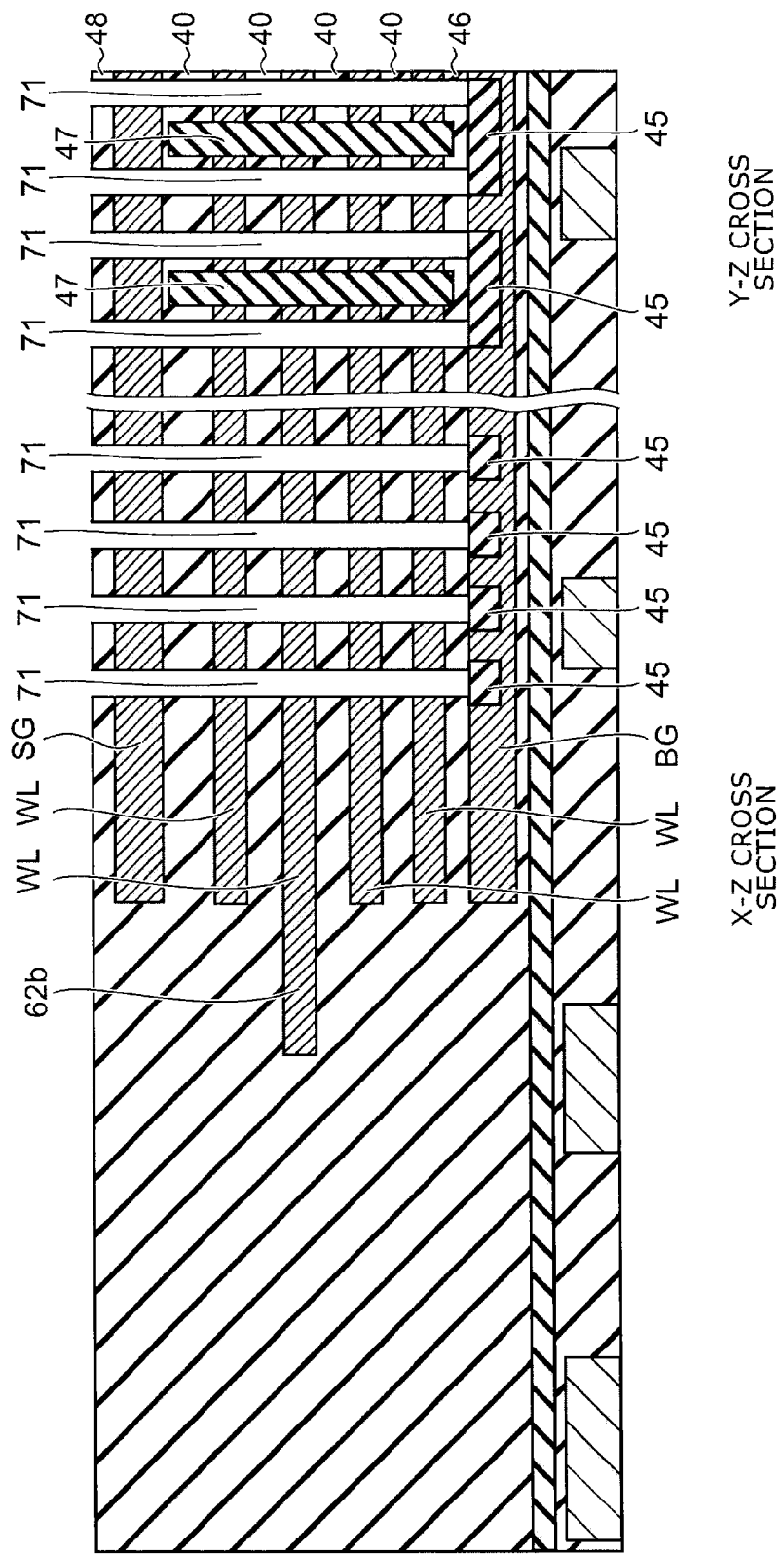

Next, as shown in FIG. 28, holes 71 are formed. The holes 71 penetrate through the stacked body in the memory cell array region and reach the sacrificial film 45. A pair of holes 71 are formed per one recess (sacrificial film 45). The holes 71 are formed by RIE technique using a mask, not shown, formed on the stacked body.

The hole 71 penetrates through the select gate SG made of a silicon layer, the electrode layers WL also made of silicon layers, and the insulating layers 48, 40, 46 made of silicon oxide layers, and reaches the sacrificial film 45 made of a silicon nitride film. The sacrificial film 45 different in material from the select gate SG, the electrode layers WL, and the insulating layers 48, 40, 46 functions as an etching stopper for etching the hole 71.

Next, the sacrificial film 45 is removed by etching through the hole 71. For instance, the sacrificial film 45 is removed by wet etching using $H_3PO_4$.

As shown in FIG. 29, the recess 44 formed in the back gate BG appears by the removal of the sacrificial film 45. The respective lower ends of the pair of holes 71 are connected to the recess 44. Thus, a U-shaped memory hole MH is formed in the back gate BG and the stacked body thereabove.

Figure 30:
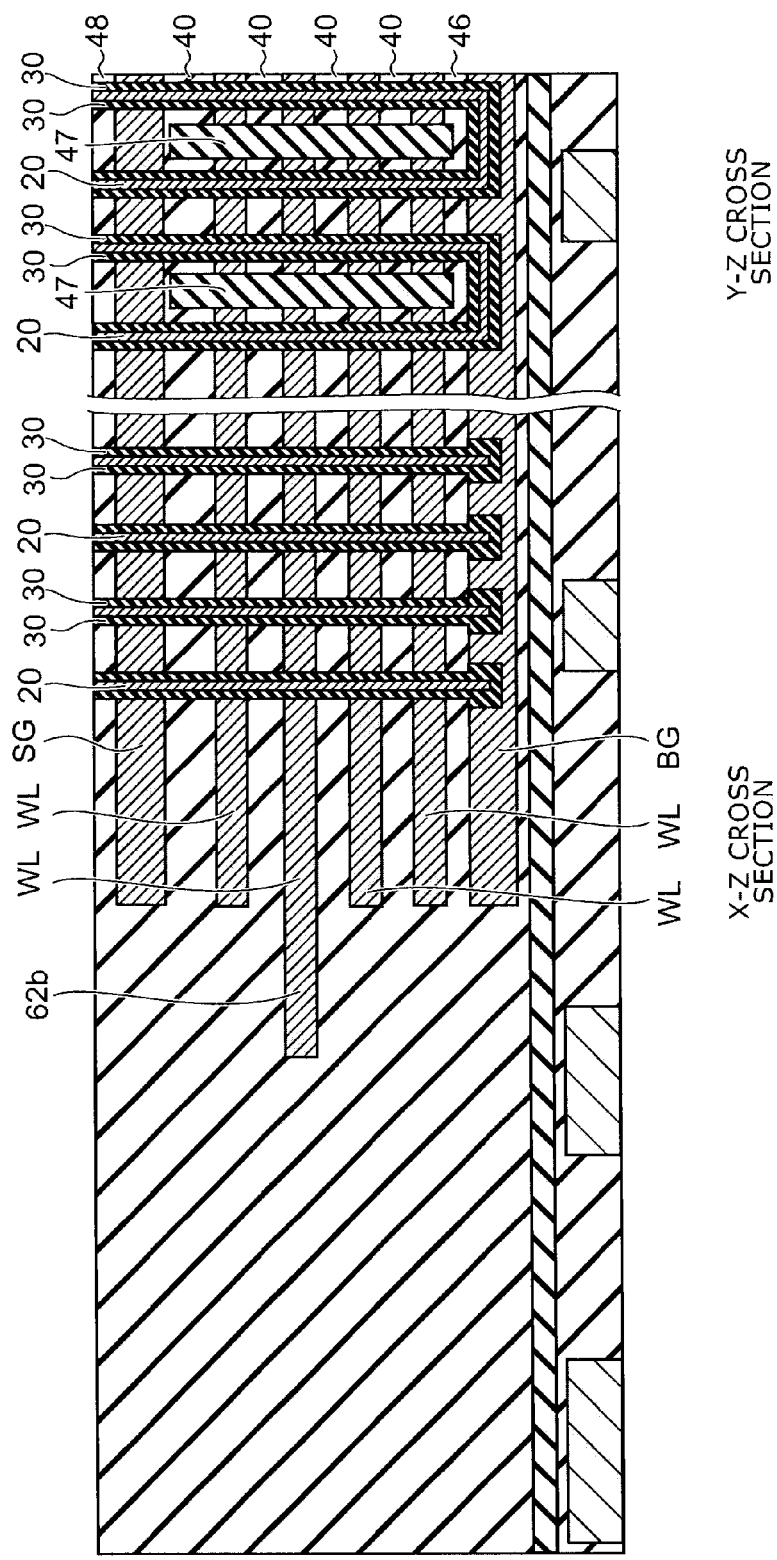

As shown in FIG. 30, the aforementioned memory film 30 is formed on the inner wall of the memory hole MH. Furthermore, a channel body 20 is formed on the inner wall of the memory film 30. Furthermore, a core insulating film 50 shown in FIG. 4 is embedded inside the channel body 20.

Figure 31:
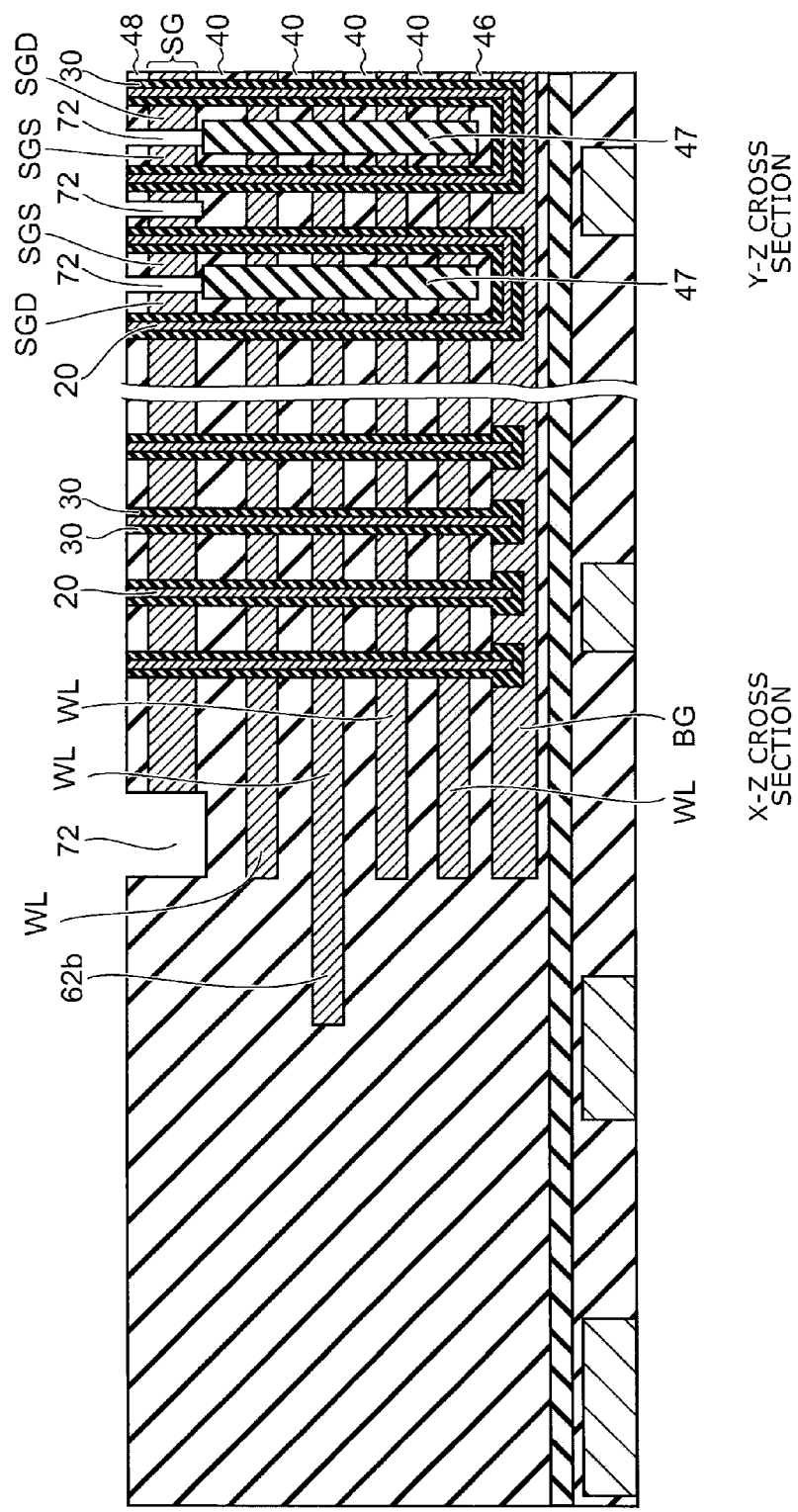
Figure 32:
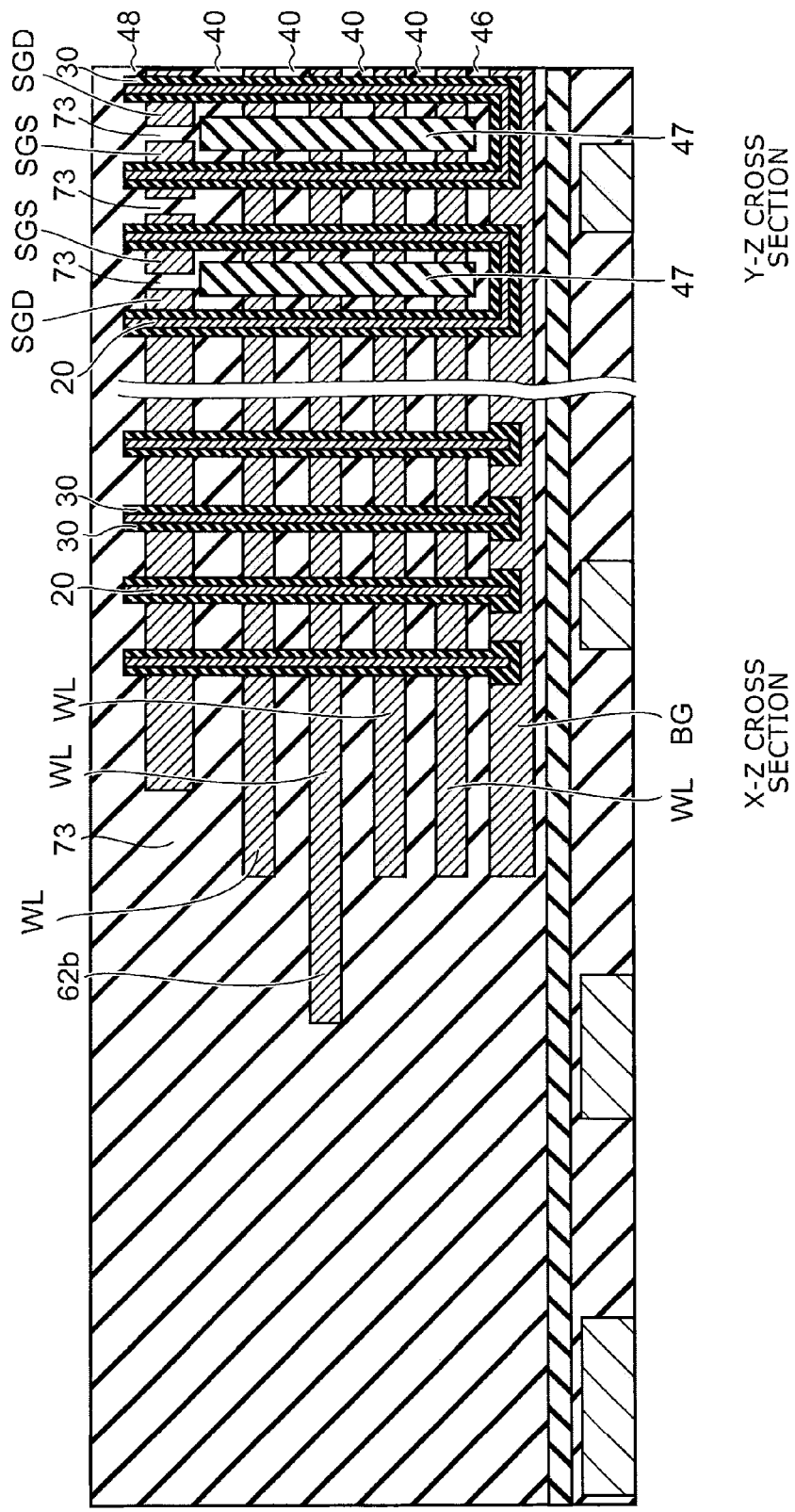

Next, as shown in FIG. 31, a slit 72 is formed. The slit 72 divides the select gate SG into a plurality of drain side select gates SGD and source side select gates SGS. As shown in FIG. 32, an insulating separation film 73 is embedded in the slit 72.

Figure 33:
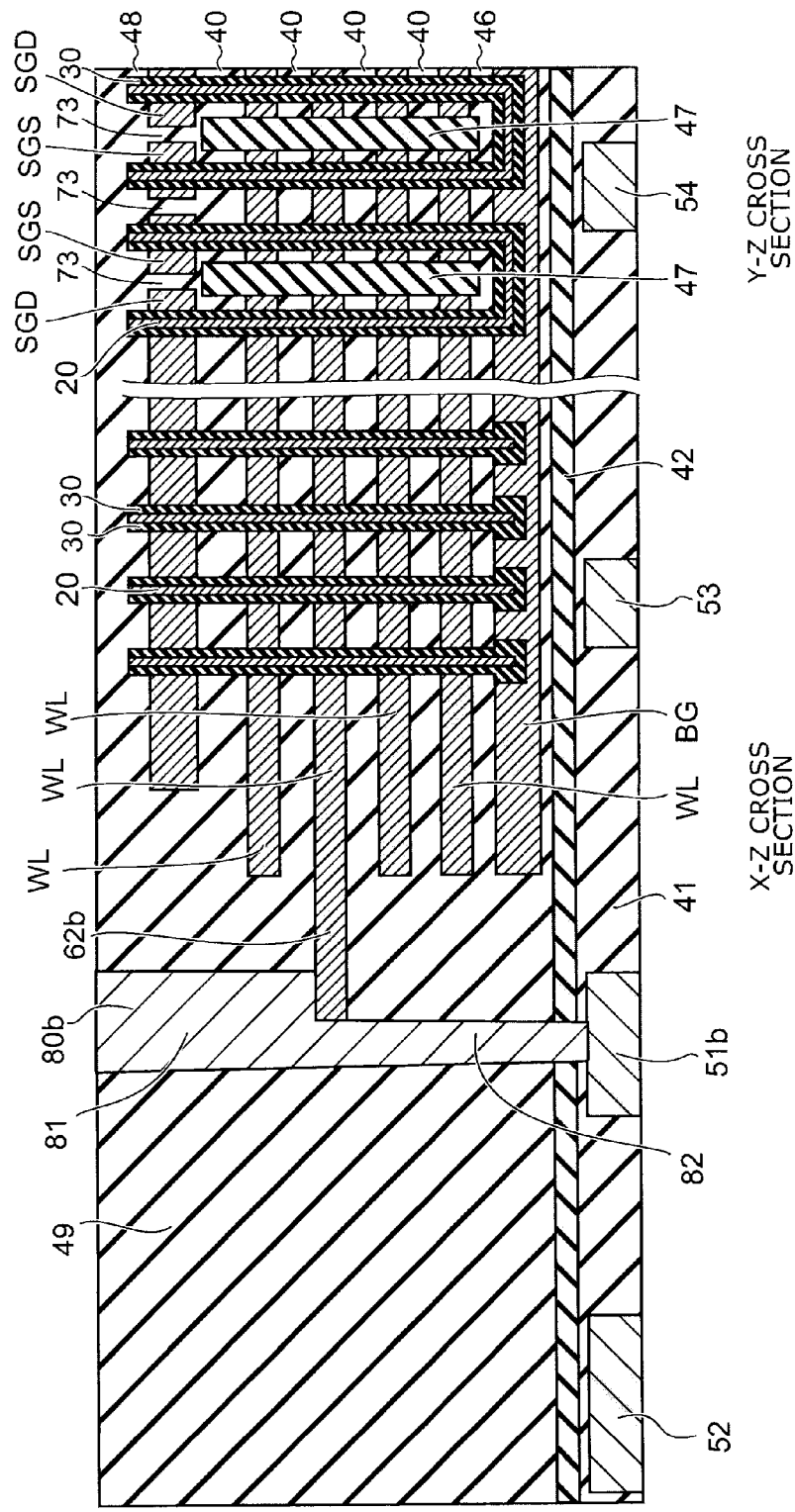

As shown in FIGS. 33 and 5, plugs 80a-80f are formed in the region where the contact parts 62a-62d, 61, 63 are formed. The plugs 80a-80f connect the respective contact parts 62a-62d, 61, 63 with the respective circuit interconnections 51a-51f.

First, a plurality of contact holes are simultaneously formed by e.g. RIE technique. The insulating layer 49 in the region where the contact parts 62a-62d, 61, 63 are formed is etched. Furthermore, the insulating layer 42 below the insulating layer 49 and the insulating layer 41 therebelow are etched. The lower end of the contact hole reaches the circuit interconnection 51*a*-51*f*.

The contact holes extend in the insulating layer 49 toward the respective contact parts 62*a*-62*d*, 61, 63. The contact holes further extend therefrom toward the respective circuit interconnections 51*a*-51*f*.

The contact parts 62*a*-62*d*, 61, 63 and the circuit interconnections 51*a*-51*f* different in material from the insulating layers 49, 42, 41 are scarcely etched because of high etching selectivity in etching for contact hole formation.

Then, a metal material including e.g. tungsten is embedded in the contact hole. Thus, plugs 80*a*-80*f* are formed. The plugs 80*a*-80*f* directly connect the respective contact parts 62*a*-62*d*, 61, 63 with the respective circuit interconnections 51*a*-51*f* without the intermediary of upper-layer interconnection.

Subsequently, bit lines BL, source lines SL and the like are formed in the memory cell array region. The upper-layer interconnection 111, the plug 112 and the like shown in FIG. 2 are formed in the peripheral region around the memory cell array region.

Next, a method for manufacturing a semiconductor memory device of an alternative embodiment is described with reference to FIGS. 34 to 42. In the following embodiment, the contact parts of the respective layers are collectively formed after stacking the back gate BG, the electrode layers WL, and the select gate SG.

Like the above embodiment, recesses 44 are formed in the back gate BG. A sacrificial film 45 is embedded in the recess 44. Then, a stacked body including a plurality of electrode layers WL is formed on the back gate BG.

Figure 34:
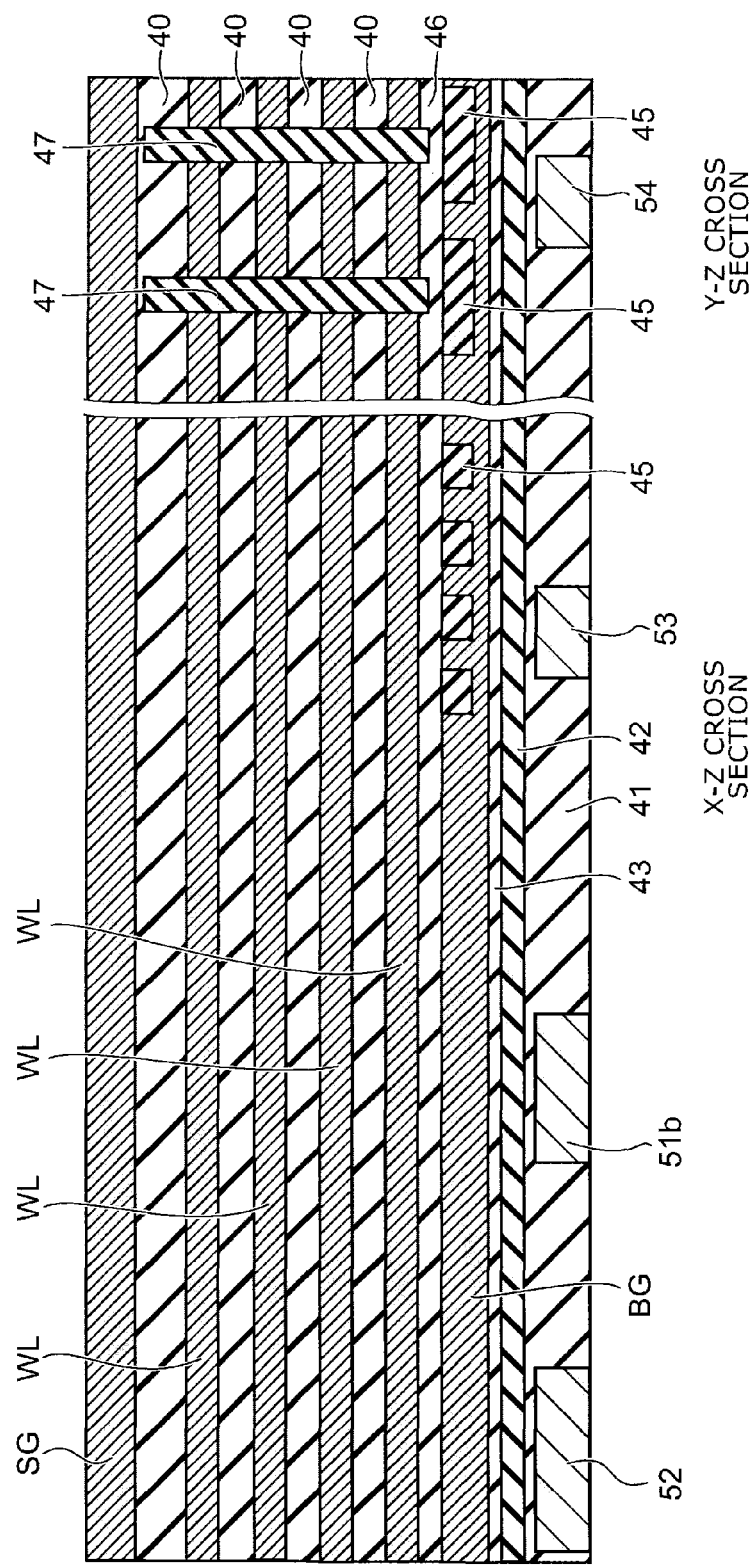

Then, as shown in FIG. 34, the stacked body in the memory cell array region is divided into a plurality of blocks by an insulating separation film 47.

Figure 35:
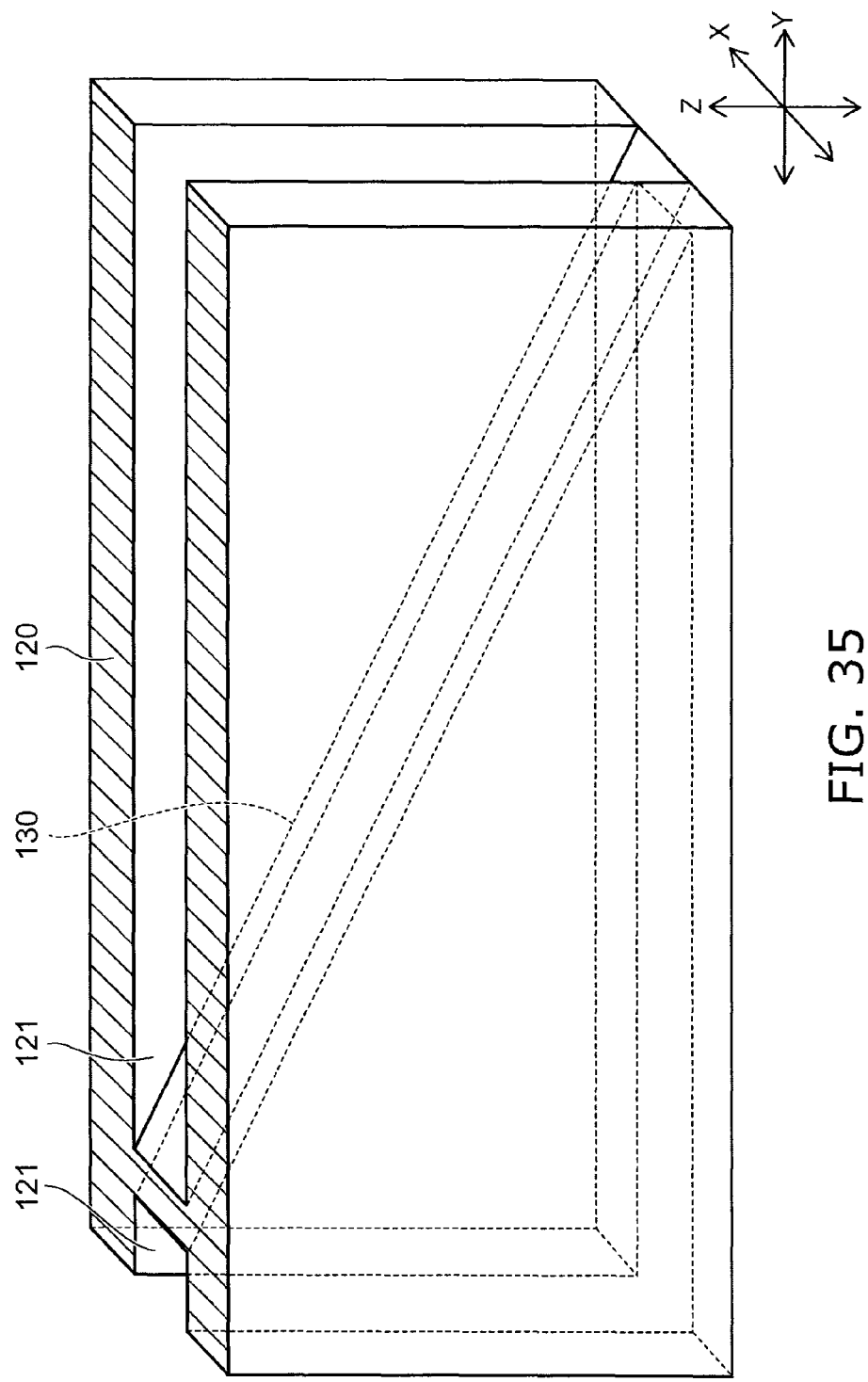

Next, a select gate SG is stacked on the uppermost insulating layer 40. As shown in FIG. 35, a mask layer 120 is formed from e.g. resist on the select gate SG. A pair of openings 121 are selectively formed in the mask layer 120.

Then, the stacked body outside the memory cell array region is etched by e.g. RIE technique using the mask layer 120 as a mask.

Etching is advanced in a direction oblique to the X-direction, the Y-direction, and the Z-direction through the pair of openings 121 of the mask layer 120. For instance, RIE is performed with the wafer held so that the wafer surface (X-Y surface) to be etched is inclined with respect to the acceleration direction of ions.

A protrusion 130 is formed in part of the stacked body by this oblique etching. The protrusion 130 is inclined with respect to the surface direction of the substrate 10 and extends from the select gate SG toward the back gate BG.

Figure 36:
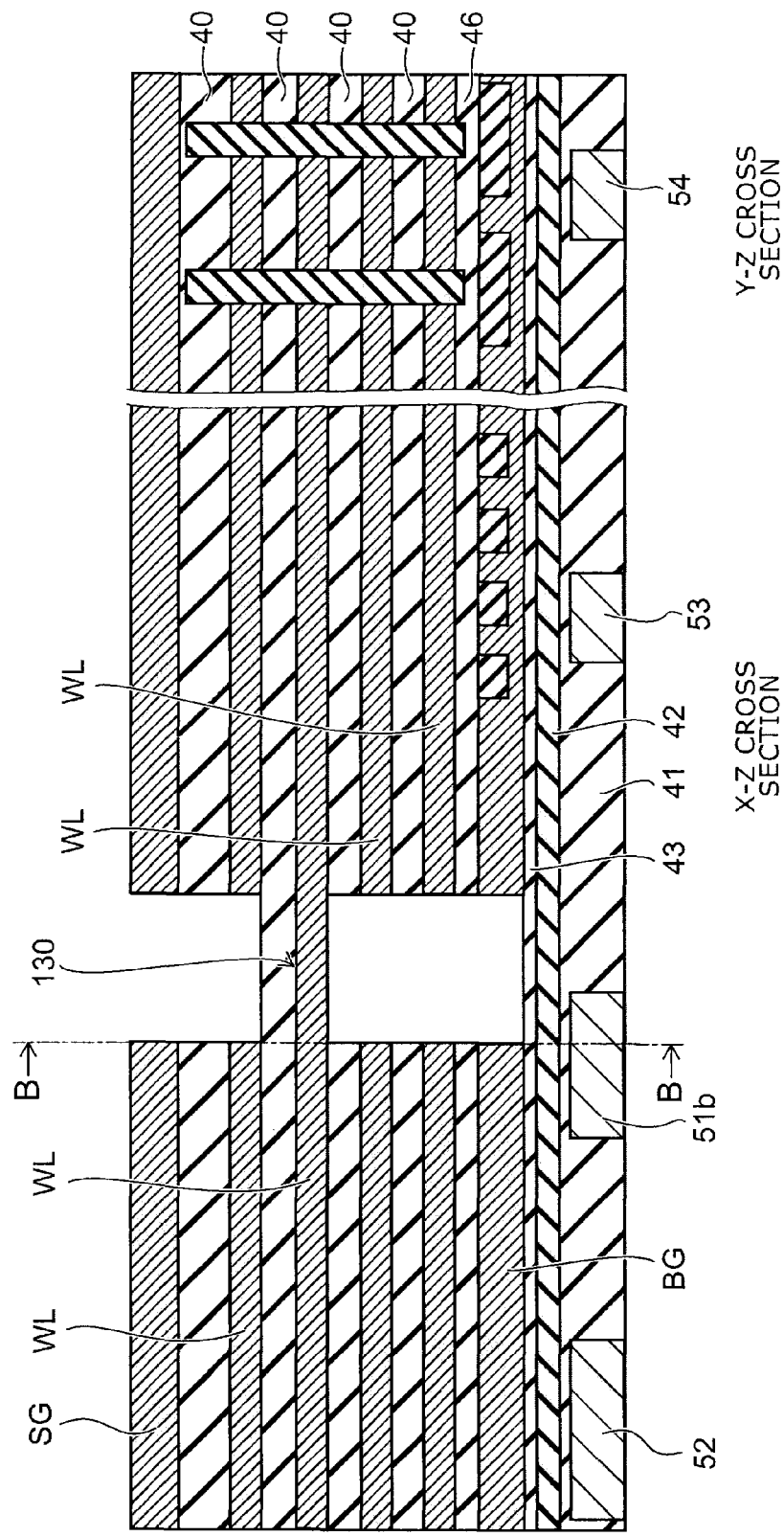

FIG. 36 shows an X-Z cross section of the region where the protrusion 130 is formed.

Figure 37:
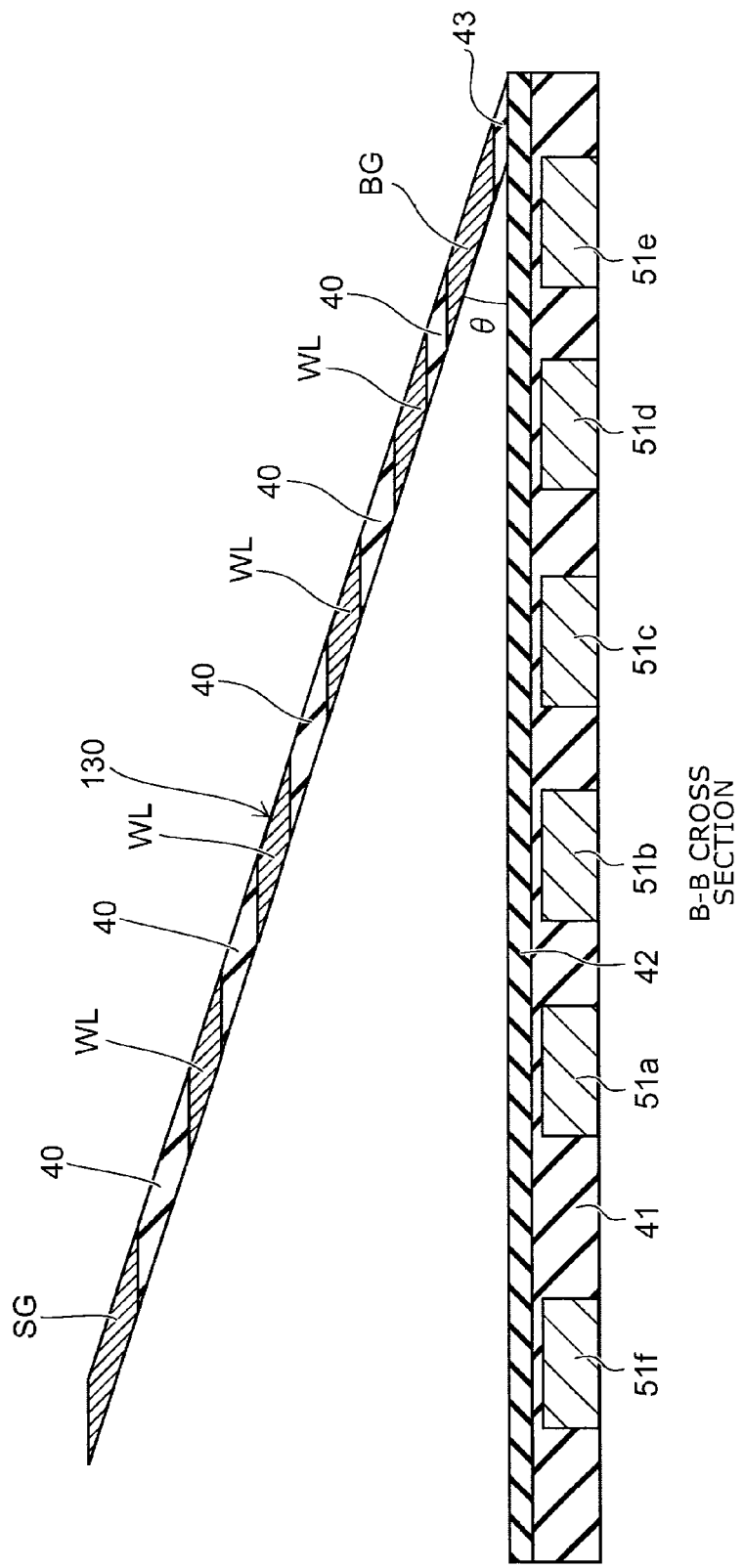

FIG. 37 is a B-B sectional view in FIG. 36.

FIG. 36 shows a cross section of cutting the protrusion 130 in the portion of the second highest electrode layer WL and the insulating layer 40 thereabove in FIG. 37.

As shown in FIG. 37, the insulating layers 40 and the electrode layers WL are alternately arranged along the oblique direction of extension of the protrusion 130 between the select gate SG and the back gate BG in the protrusion 130. The insulating layer 43 is formed between the back gate BG and the insulating layer 42.

In the protrusion 130, the select gate SG, the plurality of electrode layers WL, and the back gate BG do not overlap each other in the Z-direction, but are displaced in the Y-direction from each other.

Furthermore, a space is formed above and below the protrusion 130. Thus, the select gate SG, the electrode layers WL, and the back gate BG do not lie below the protrusion 130.

Figure 38:
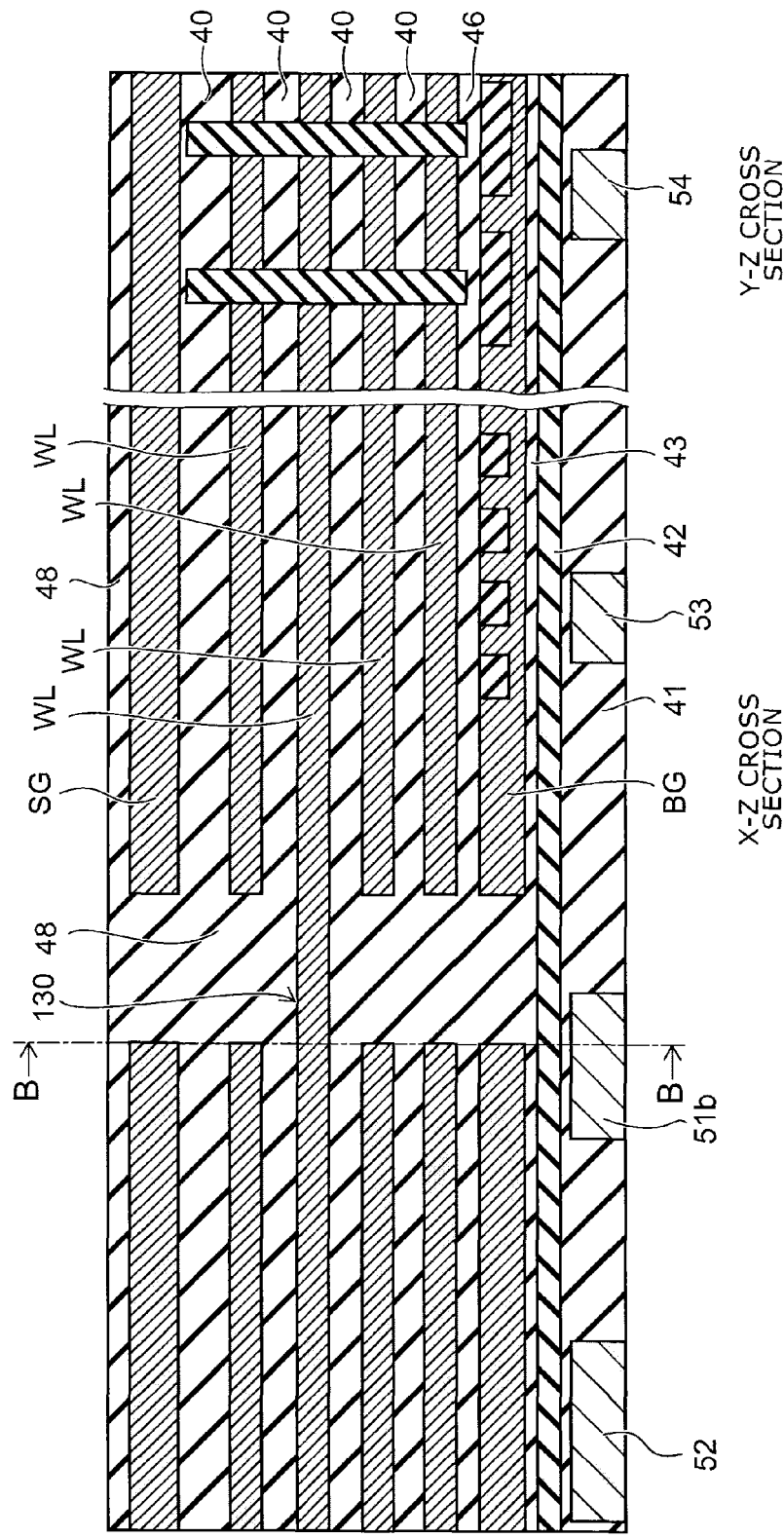
Figure 39:
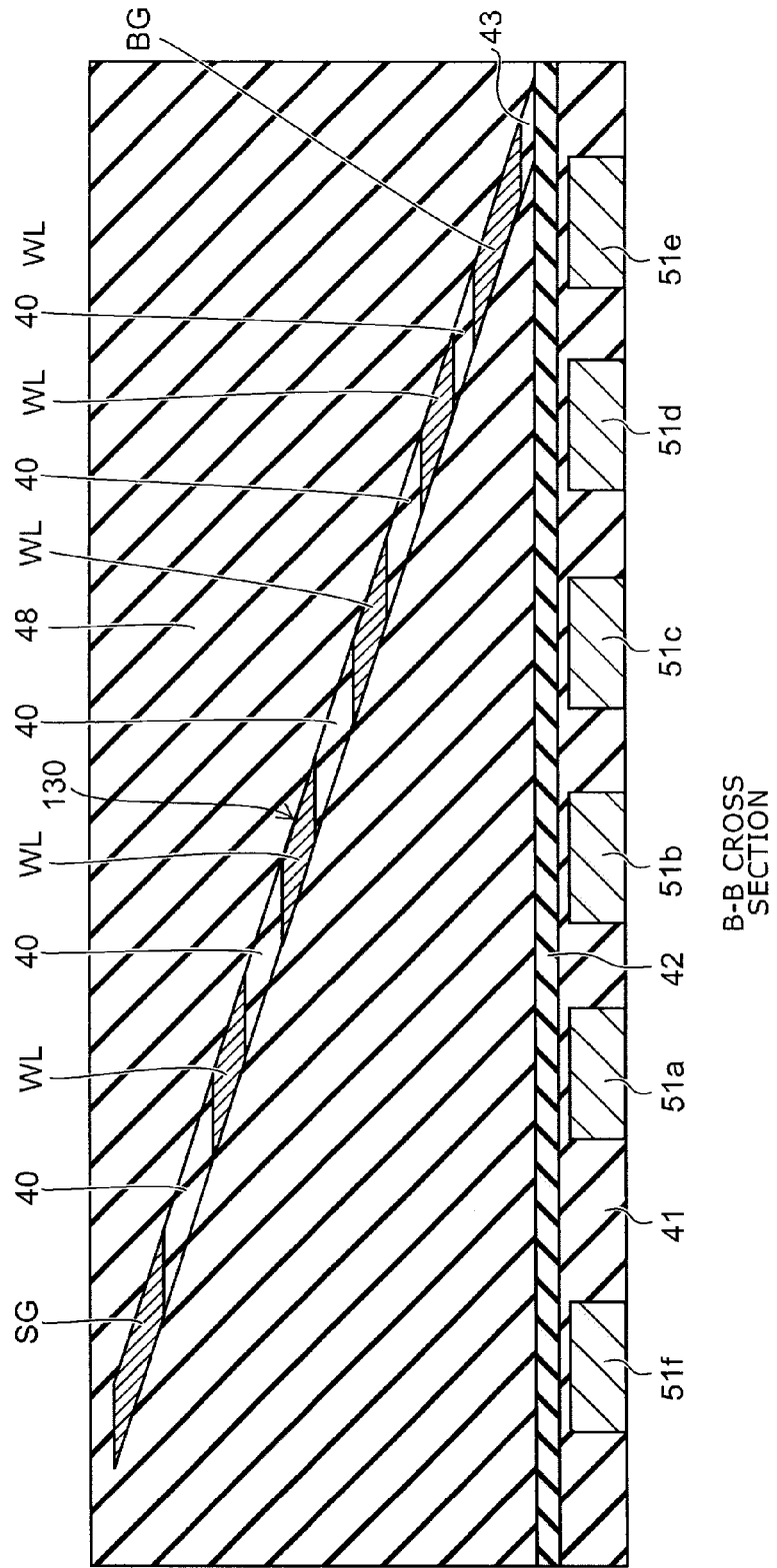

Next, as shown in FIGS. 38 and 39, an insulating layer 48 is embedded in the space above and below the protrusion 130. FIG. 39 shows a B-B cross section in FIG. 38. Furthermore, the insulating layer 48 is stacked on the select gate SG.

Figure 40:
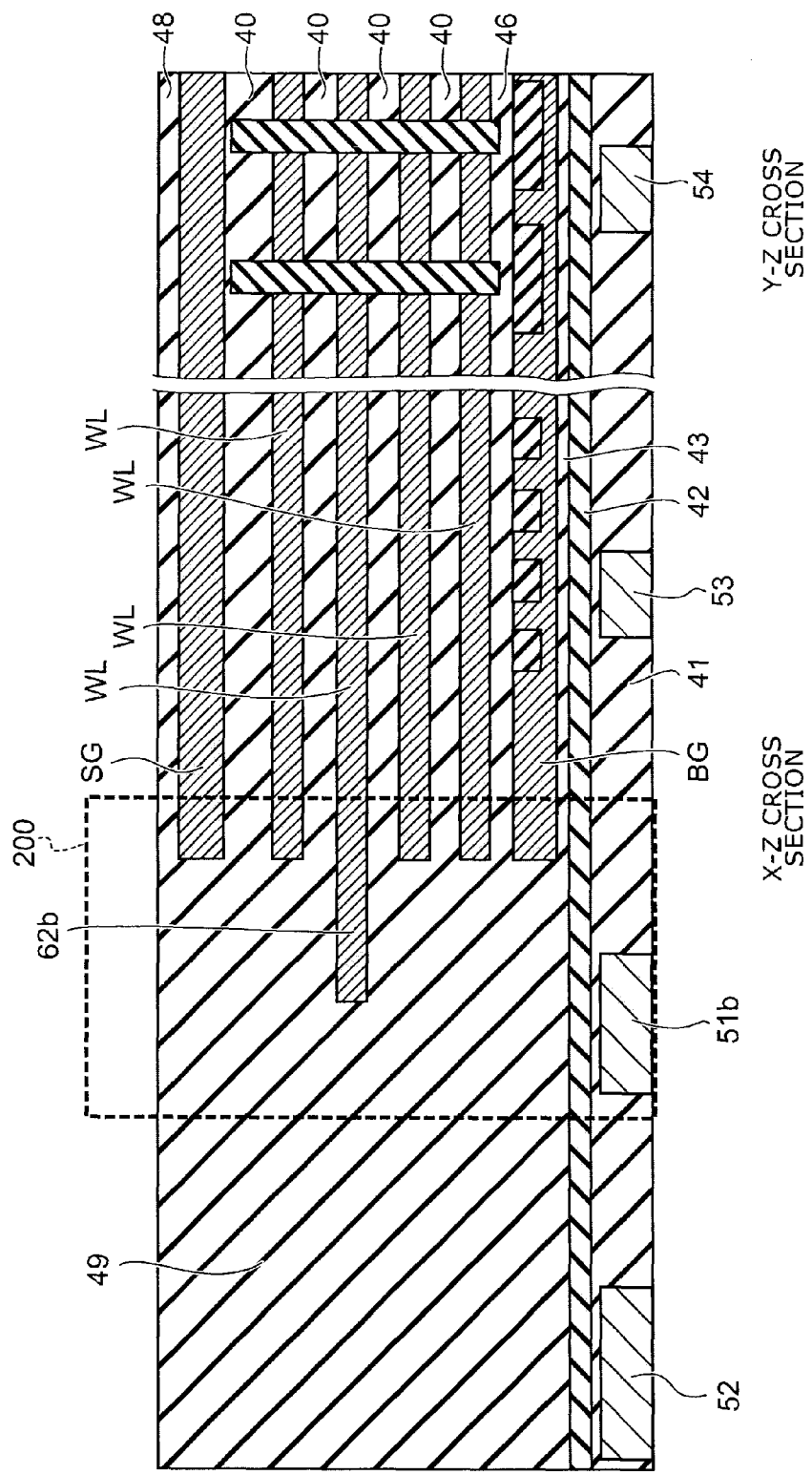

Next, the stacked body on the left side of line B-B in FIG. 38 is removed. That is, the stacked body located on the farther side from the memory cell array region than the protrusion 130 is removed. As shown in FIG. 40, an insulating layer 49 is embedded in the portion where the stacked body has been removed.

Figure 41:
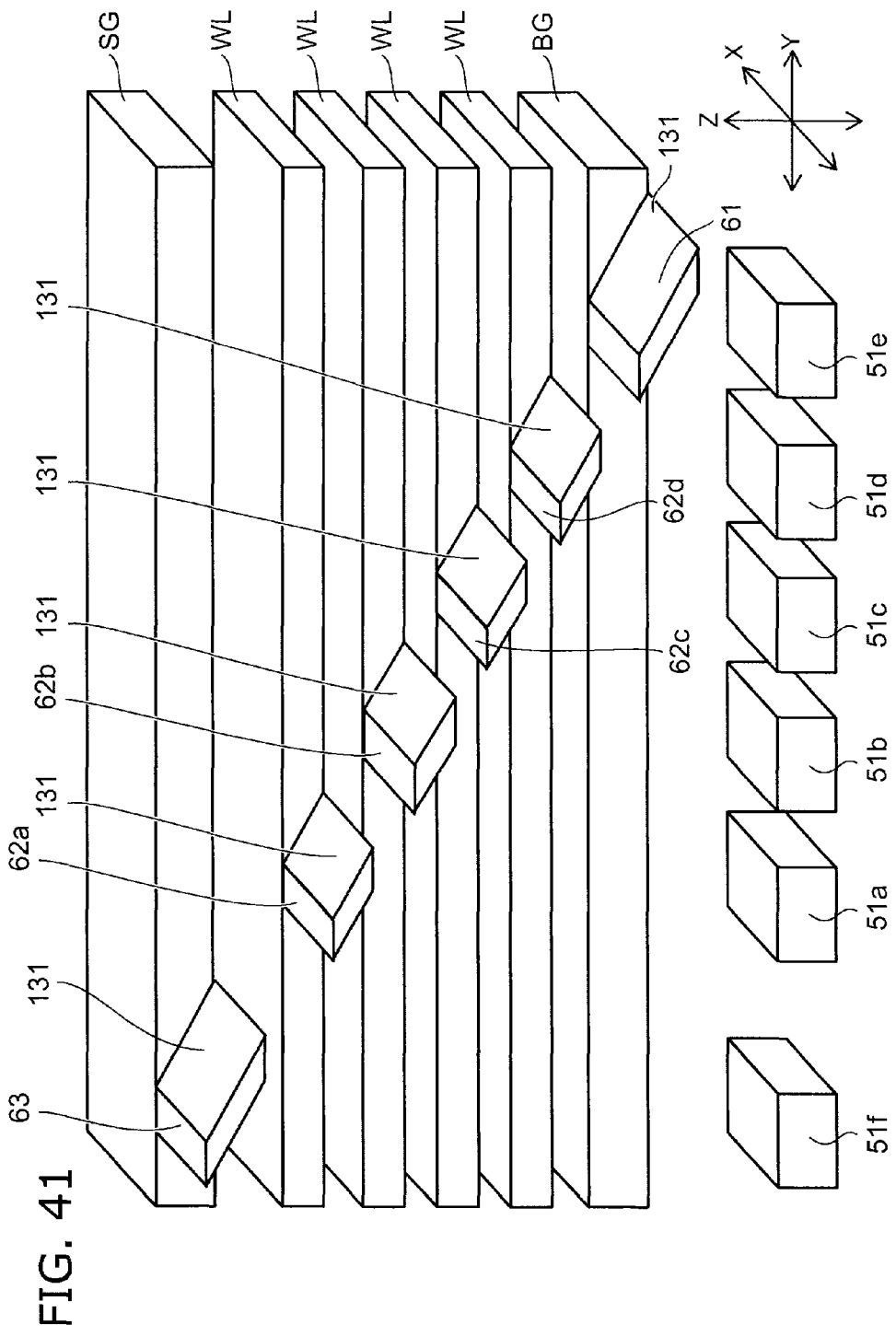

FIG. 41 is a schematic perspective view of the region 200 enclosed with the dashed line in FIG. 40.

The positions in the X-direction of the end parts (end parts in the X-direction) of the select gate SG, the respective electrode layers WL, and the back gate BG are aligned in the tier selecting section outside the memory cell array region. Contact parts 63, 62*a*-62*d*, 61 are provided on the end parts.

The contact part 63 is provided on the end part of the select gate SG. The contact part 62*a* is provided on the end part of the uppermost electrode layer WL. The contact part 62*b* is provided on the end part of the second highest electrode layer WL. The contact part 62*c* is provided on the end part of the third highest electrode layer WL. The contact part 62*d* is provided on the end part of the fourth highest electrode layer WL. The contact part 61 is provided on the end part of the back gate BG.

Each contact part 61, 62*a*-62*d*, 63 is formed in a protruding shape projected from the end part of the corresponding layer in the X-direction on the opposite side from the memory cell array region. Each contact part 61, 62*a*-62*d*, 63 is integrally made of the same material (e.g., silicon doped with impurity) as the corresponding layer.

Furthermore, each contact part 61, 62*a*-62*d*, 63 has an oblique surface 131 inclined with respect to the upper surface and the end surface of the corresponding layer. Furthermore, each contact part 61, 62*a*-62*d*, 63 has an end surface parallel to the end surface of the corresponding layer.

The contact parts 61, 62*a*-62*d*, 63 do not overlap each other in the Z-direction. The contact parts 61, 62*a*-62*d*, 63 are displaced in the Y-direction parallel to the surface of the substrate 10. The contact parts 61, 62*a*-62*d*, 63 are spaced in the Y-direction.

The circuit interconnection 51*a*-51*f* is formed on the front side of the substrate 10 directly below each contact part 62*a*-62*d*, 61, 63.

The aforementioned stacked body is not provided between the contact part 61, 62*a*-62*d*, 63 and the circuit interconnection 51*a*-51*f*. The select gate SG, the electrode layers WL, and the back gate BG do not lie below the contact parts 61, 62*a*-62*d*, 63.

Figure 42:
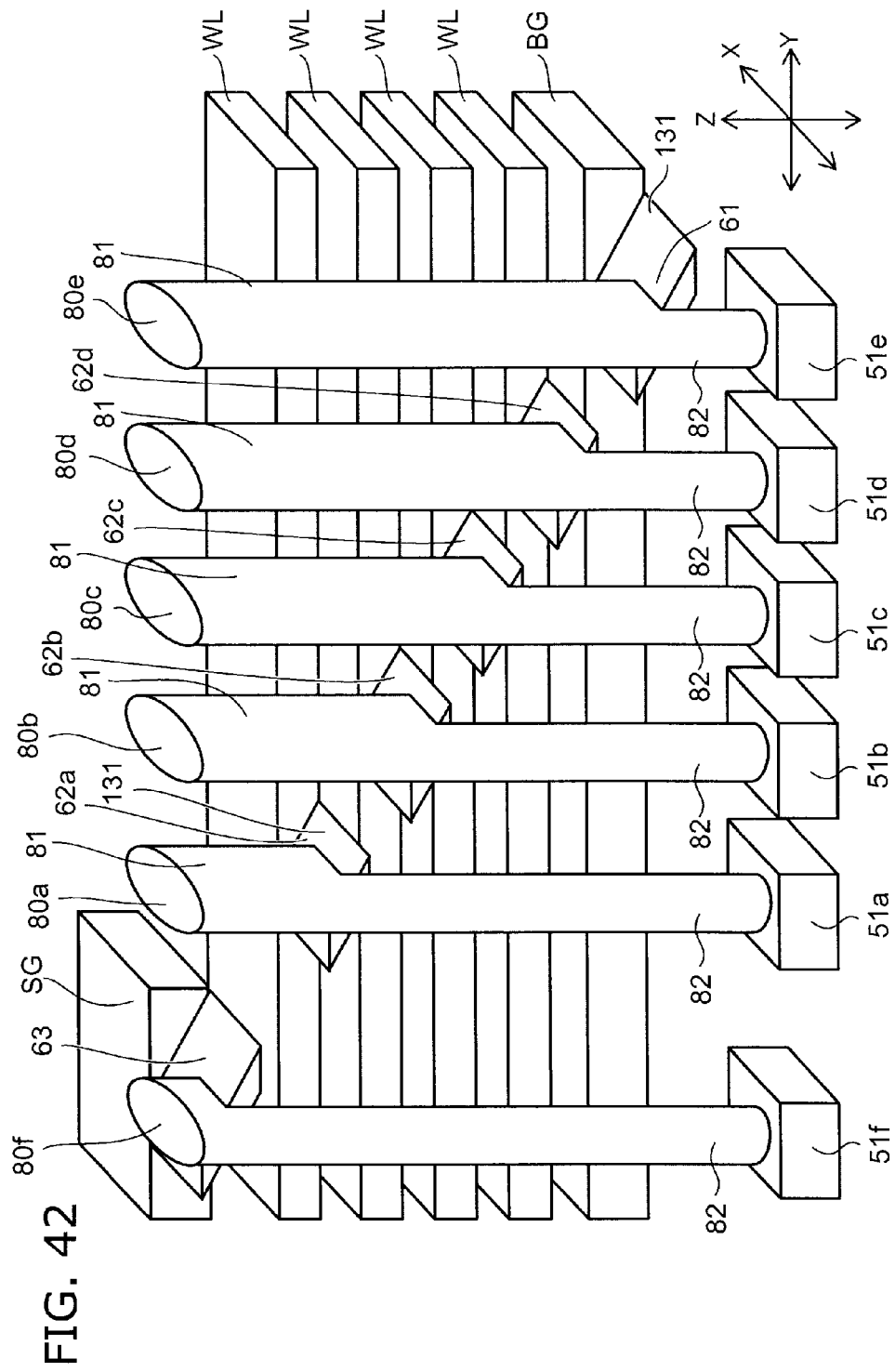

Next, as in the above embodiment, plugs 80*a*-80*f* shown in FIG. 42 are formed. The contact parts 62*a*-62*d*, 61, 63 are electrically connected with the circuit interconnections 51*a*-51*f* through plugs 80*a*-80*f*, respectively.

Each plug 80*a*-80*f* is in contact with the end surface of the corresponding contact part 62*a*-62*d*, 61, 63. Furthermore, each plug 80*a*-80*f* is in contact with at least one of the upper surface and the oblique surface 131 of the corresponding contact part 62*a*-62*d*, 61, 63. The contact resistance can be reduced if each plug 80*a*-80*f* is in contact with both the upper surface and the oblique surface 131 of the corresponding contact part 62*a*-62*d*, 61, 63. The lower end of each plug 80*a*-80*f* is in contact with the corresponding circuit interconnection 51*a*-51*f*.

Each plug 80a-80f has an upper part 81 and a lower part 82 smaller in diameter than the upper part 81. The upper part 81 is provided above the corresponding contact part 62a-62d, 61, 63. The lower end of the upper part 81 reaches at least one of the oblique surface 131 and the upper surface of the corresponding contact part 62a-62d, 61, 63.

The lower part 82 is in contact with the end surface of the corresponding contact part 62a-62d, 61, 63 and extends downward. The lower end of the lower part 82 reaches the corresponding circuit interconnection 51a-51f.

A cross-sectional area parallel to the surface direction of the substrate 10 of the upper part 81 is larger than a cross-sectional area parallel to the surface direction of the lower part 82.

Also in this tier selecting section shown in FIG. 42, the respective electrode layers WL, the back gate BG, and the select gate SG can be directly connected with the circuit interconnections 51a-51f below the stacked body through the plug 80a-80f extending downward from the corresponding contact part 62a-62d, 61, 63 without traversing the upper-layer interconnection routed on the stacked body.

Accordingly, the interconnection path connecting each layer with the circuit interconnection is made shorter than in the case of traversing the upper-layer interconnection. This can suppress the propagation delay of signals.

Furthermore, the area of the interconnection formation region connecting each layer with the circuit interconnection can be made smaller than that of the interconnection routing structure traversing the upper-layer interconnection. Thus, the total chip area can be reduced, leading to cost reduction.

The inclination angle θ of the obliquely extending protrusion 130 shown in FIG. 37 with respect to the upper surface (XY surface) of the insulating layer 42 is set in a range larger than 0° and smaller than 90°.

As θ becomes closer to 0°, the distance between the electrode layers WL adjacent in the oblique direction becomes larger. Thus, the diameter of the plugs 80a-80d can be made larger. This facilitates processing.

On the other hand, as θ becomes closer to 90°, the total Y-direction size of the protrusion 130 can be made smaller.

Next, a method for manufacturing a semiconductor memory device of a further alternative embodiment is described with reference to FIGS. 43 to 56.

Like the above embodiments, recesses 44 are formed in the back gate BG. A sacrificial film 45 is embedded in the recess 44. Then, a stacked body including a plurality of electrode layers WL is formed on the back gate BG.

Figure 43:
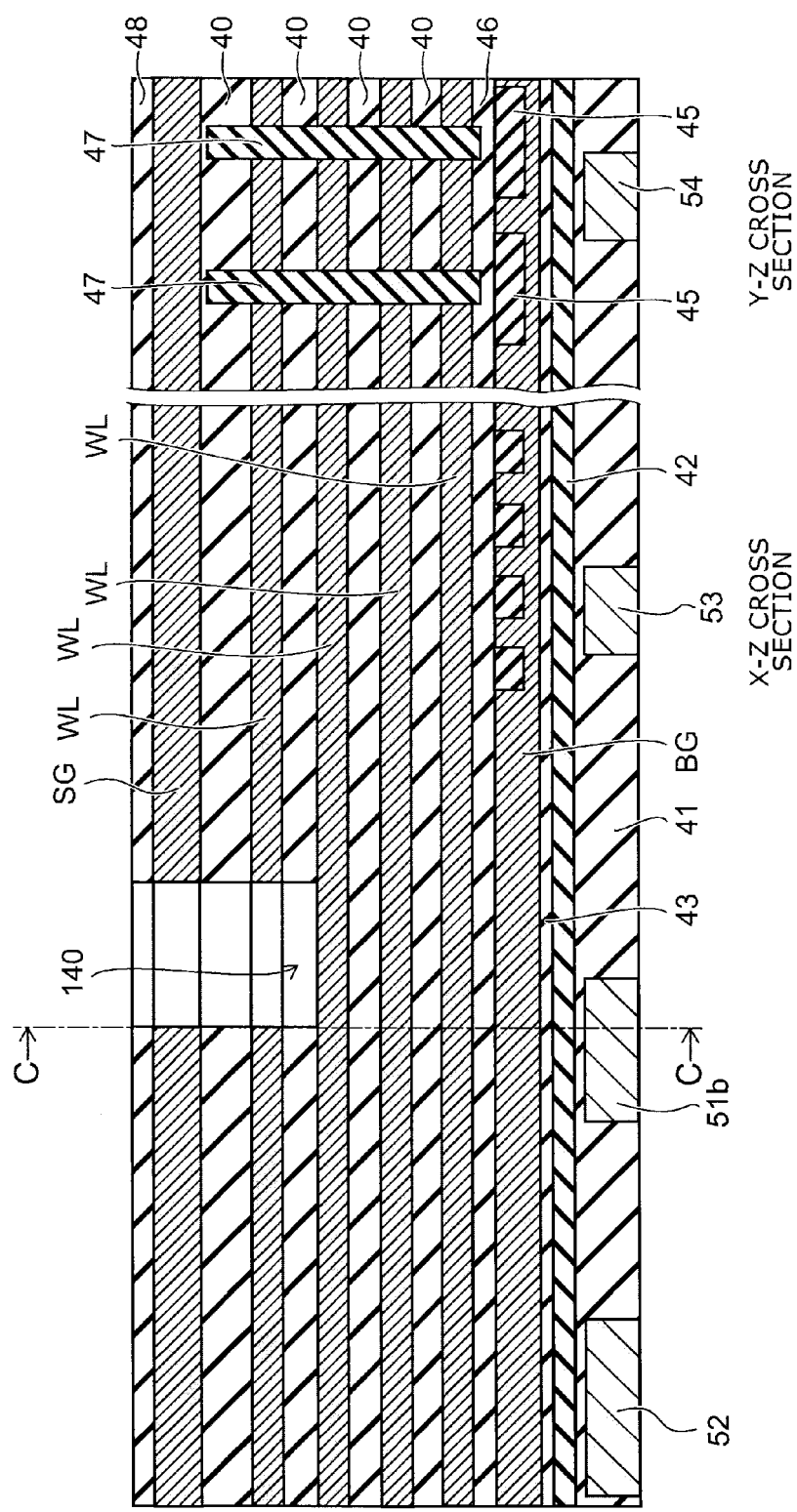

Then, as shown in FIG. 43, the stacked body in the memory cell array region is divided into a plurality of blocks by an insulating separation film 47. Subsequently, a select gate SG is stacked on the uppermost insulating layer 40. Furthermore, an insulating layer 48 is formed on the select gate SG.

Figure 44:
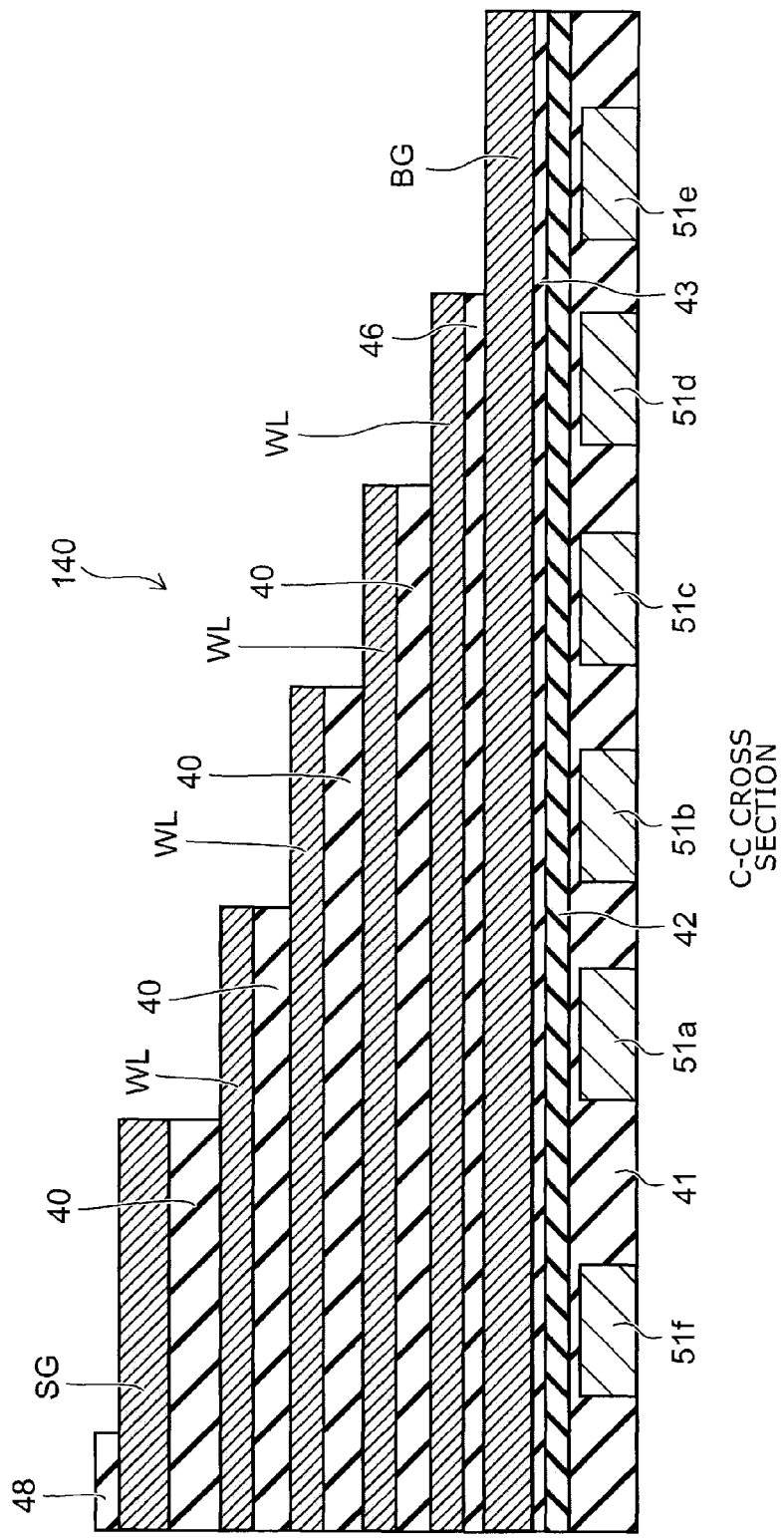

Next, as shown in FIGS. 43 and 44, part of the stacked body in the region where the tier selecting section is to be formed is processed into a staircase structure.

FIG. 44 shows a C-C cross section in FIG. 43.

The staircase structure section 140 shown in FIG. 43 shows a cross section of the stacked body below the second highest electrode layer WL (including the second highest electrode layer WL) in the staircase structure section 140 shown in FIG. 44.

The stairs of the staircase structure 140 are arranged in the Y-direction. Part of the select gate SG is exposed at the uppermost stair of the staircase structure section 140. Part of the uppermost electrode layer WL among the electrode layers WL is exposed at the second highest stair of the staircase structure section 140. Part of the electrode layer WL one layer lower than the uppermost electrode layer WL is exposed at the third highest stair of the staircase structure section 140. Part of the electrode layer WL two layers lower than the uppermost electrode layer WL is exposed at the fourth highest stair of the staircase structure section 140. Part of the electrode layer WL three layers lower than the uppermost electrode layer WL is exposed at the fifth highest stair of the staircase structure section 140. Part of the back gate BG is exposed at the lowest stair of the staircase structure section 140.

Next, impurity such as boron is implanted by ion implantation technique into the exposed portion of each of the select gate SG, the electrode layers WL, and the back gate BG in the staircase structure 140.

Each of the select gate SG, the electrode layers WL, and the back gate BG is a silicon layer. Each layer has already been implanted with boron as impurity and provided with conductivity.

Figure 45:
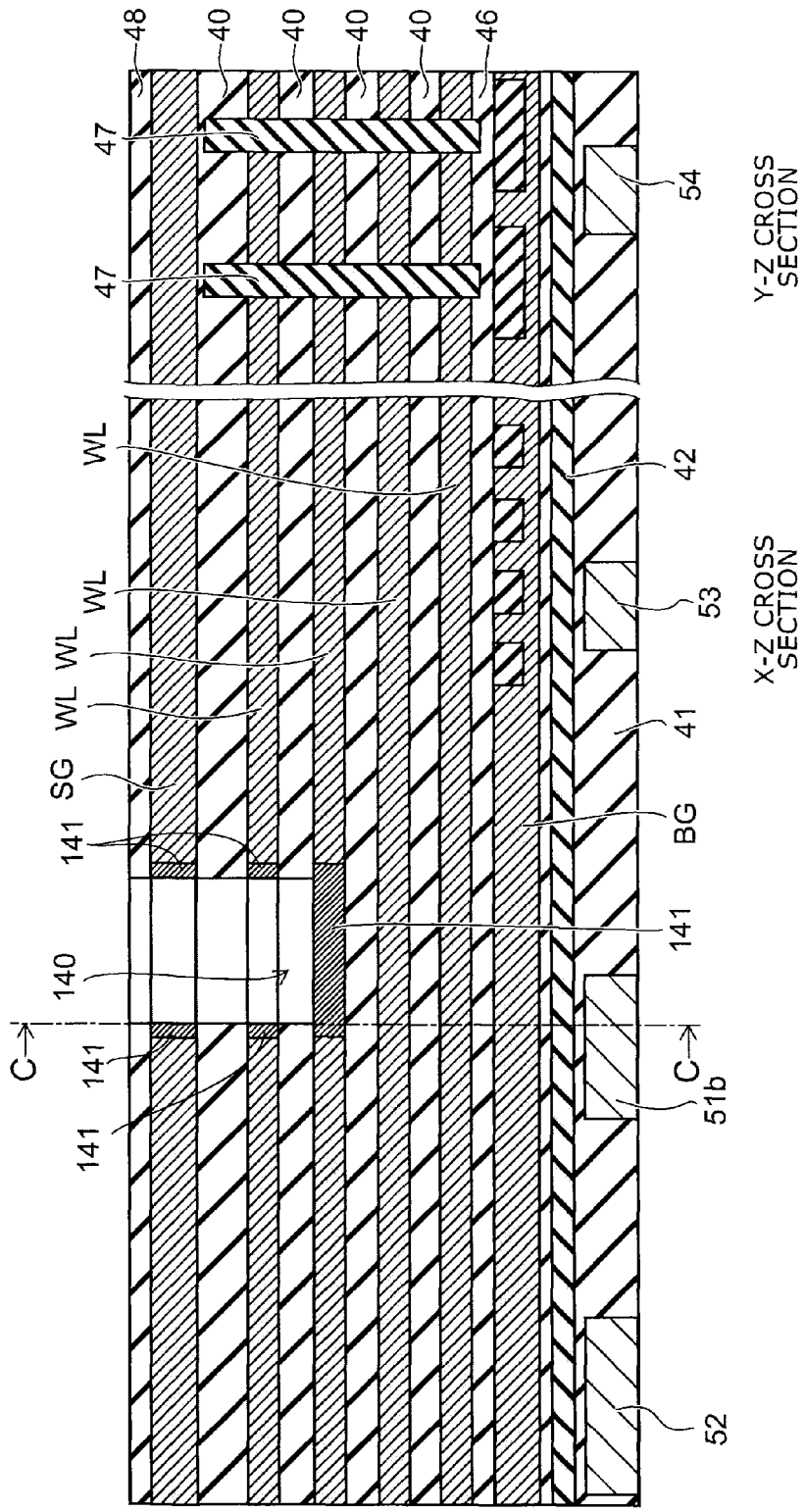
Figure 46:
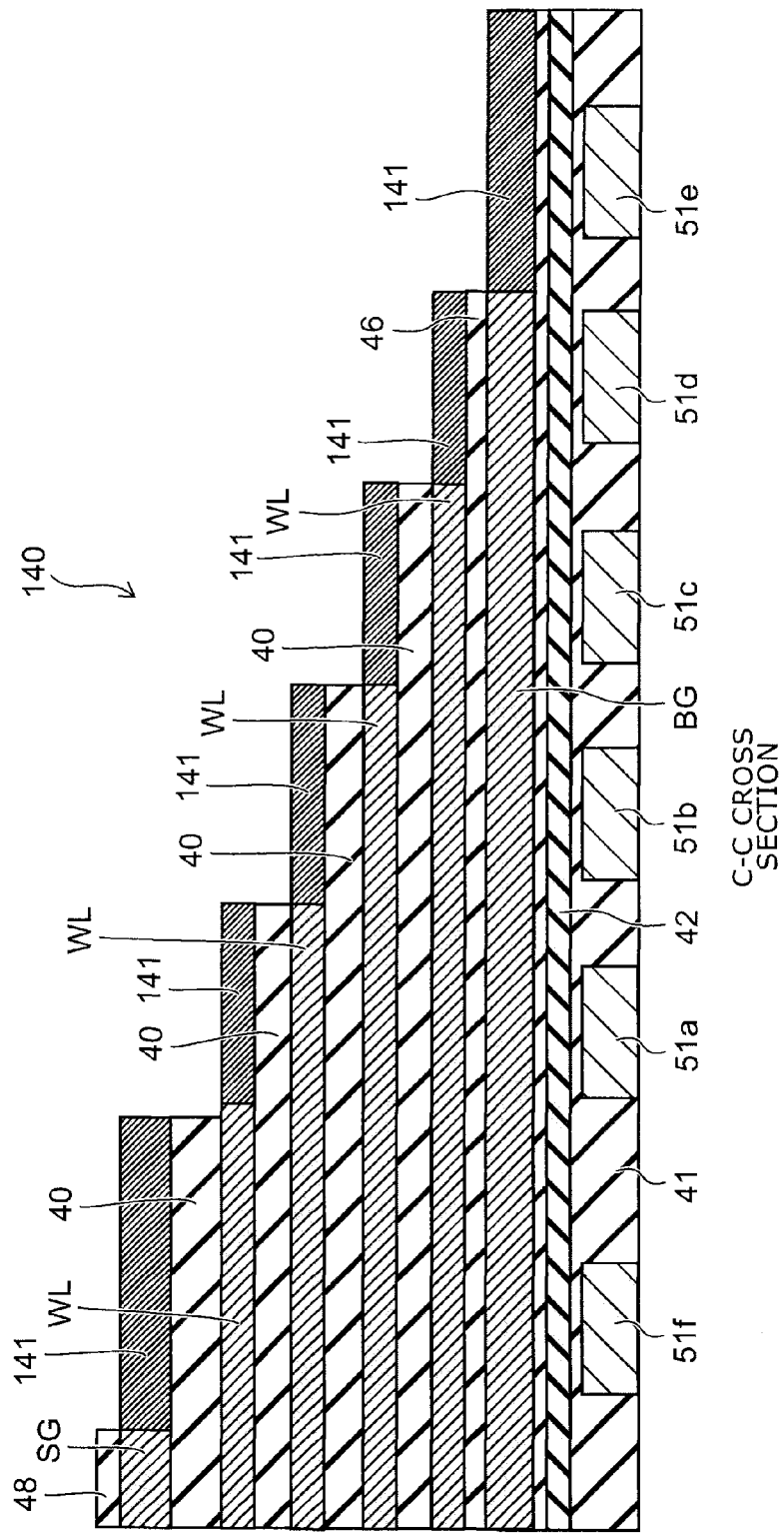

Boron is further implanted into the exposed portion of each layer in the aforementioned staircase structure section 140. Thus, as shown in FIGS. 45 and 46, the impurity concentration (boron concentration) of the end part 141 of each of the select gate SG, the electrode layers WL, and the back gate BG of the staircase structure section 140 is made relatively higher than the impurity concentration (boron concentration) of the other portion. FIG. 46 shows an A-A cross section in FIG. 45.

Figure 47:
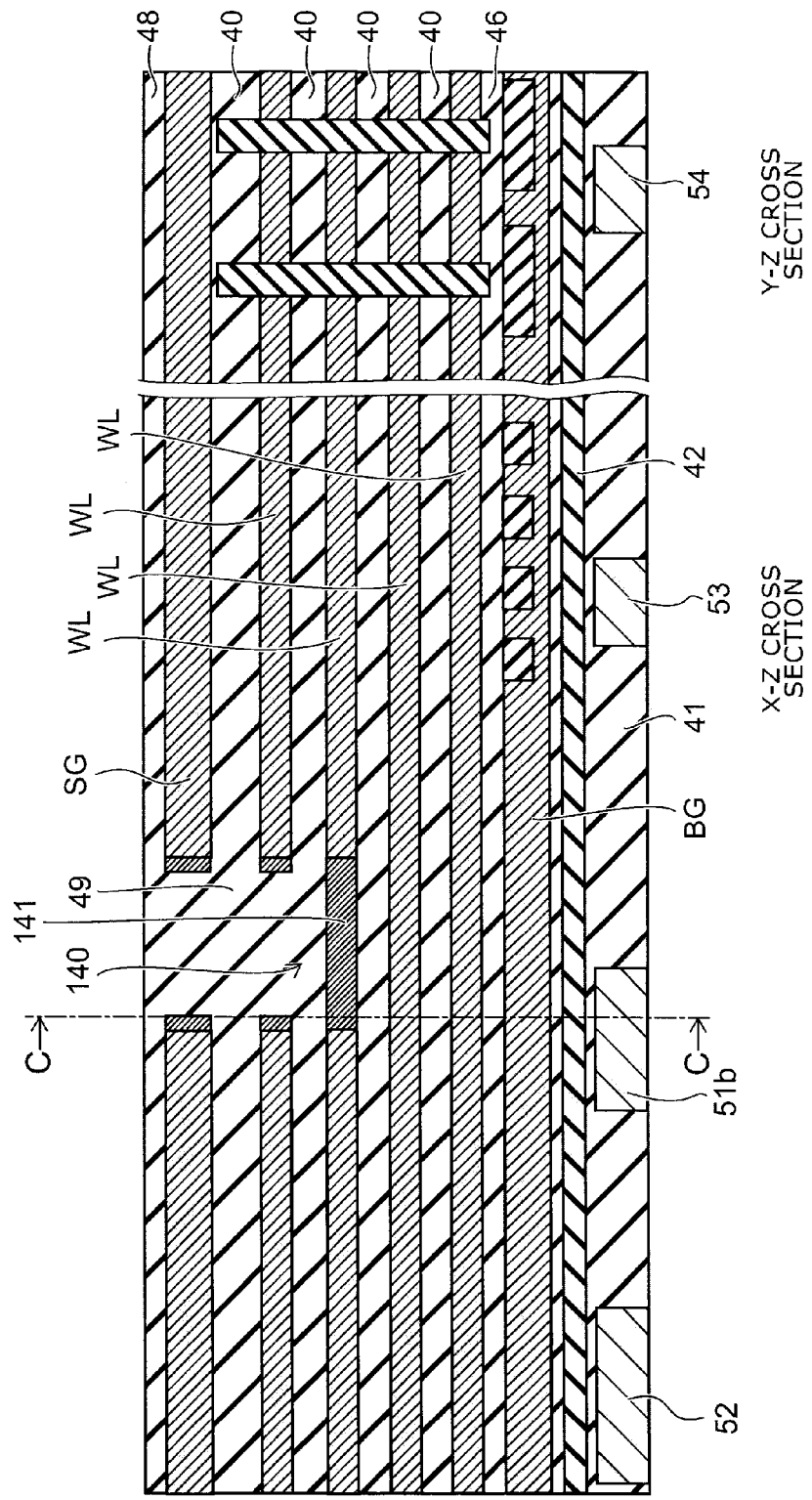
Figure 48:
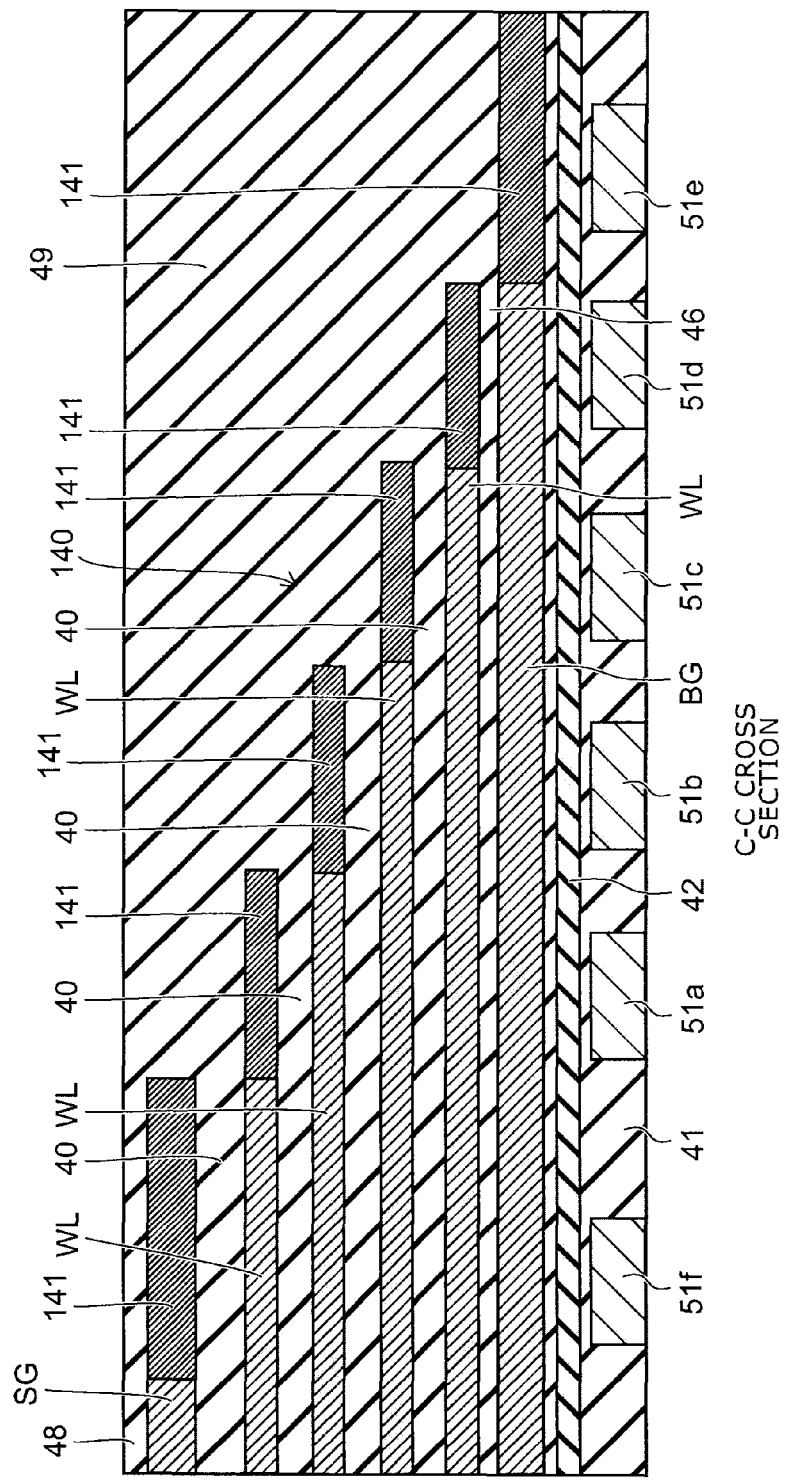

Next, as shown in FIGS. 47 and 48, the staircase structure section 140 is covered with an insulating layer 49. FIG. 48 shows a C-C cross section in FIG. 47.

Figure 49:
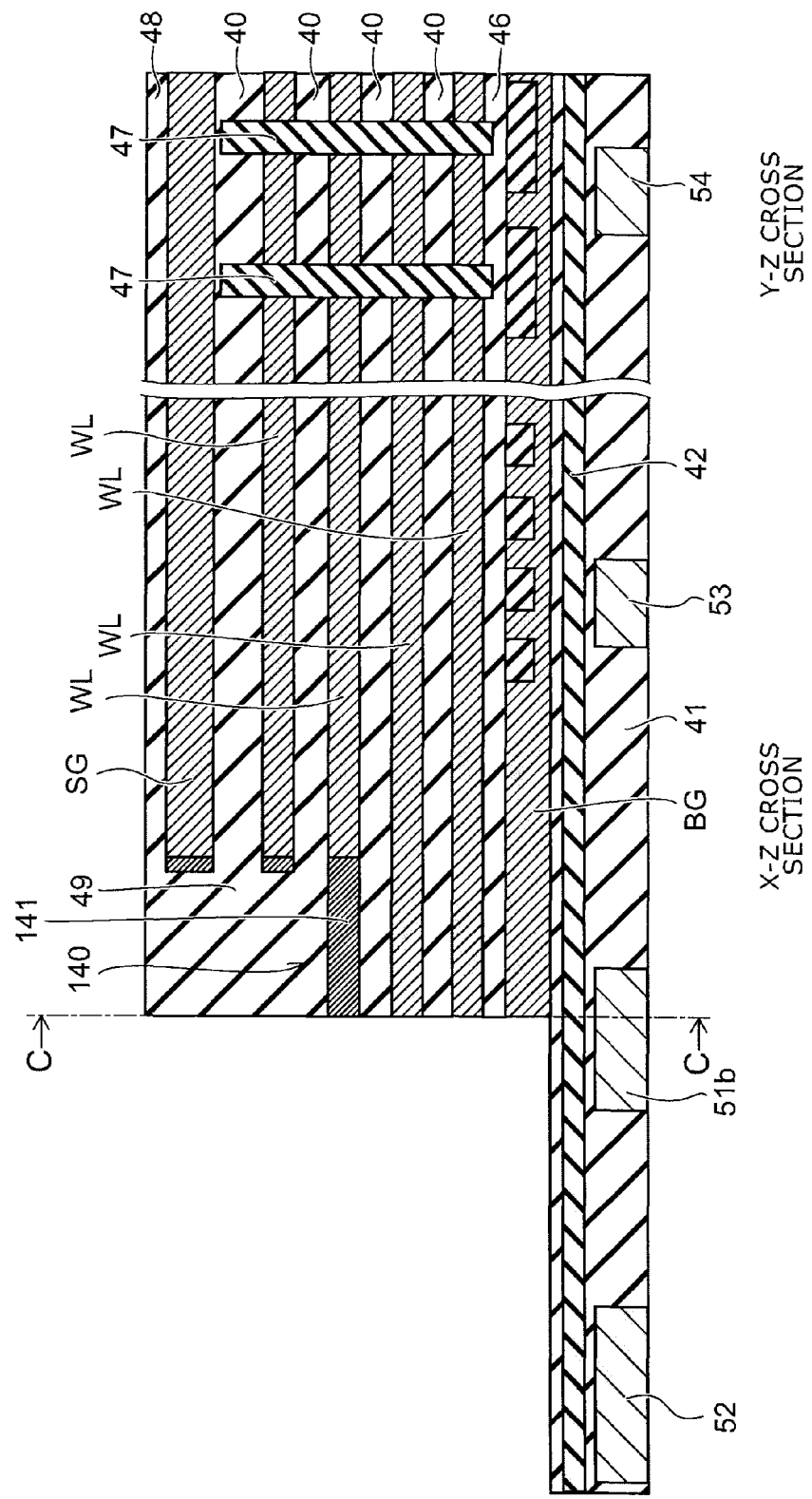
Figure 50:
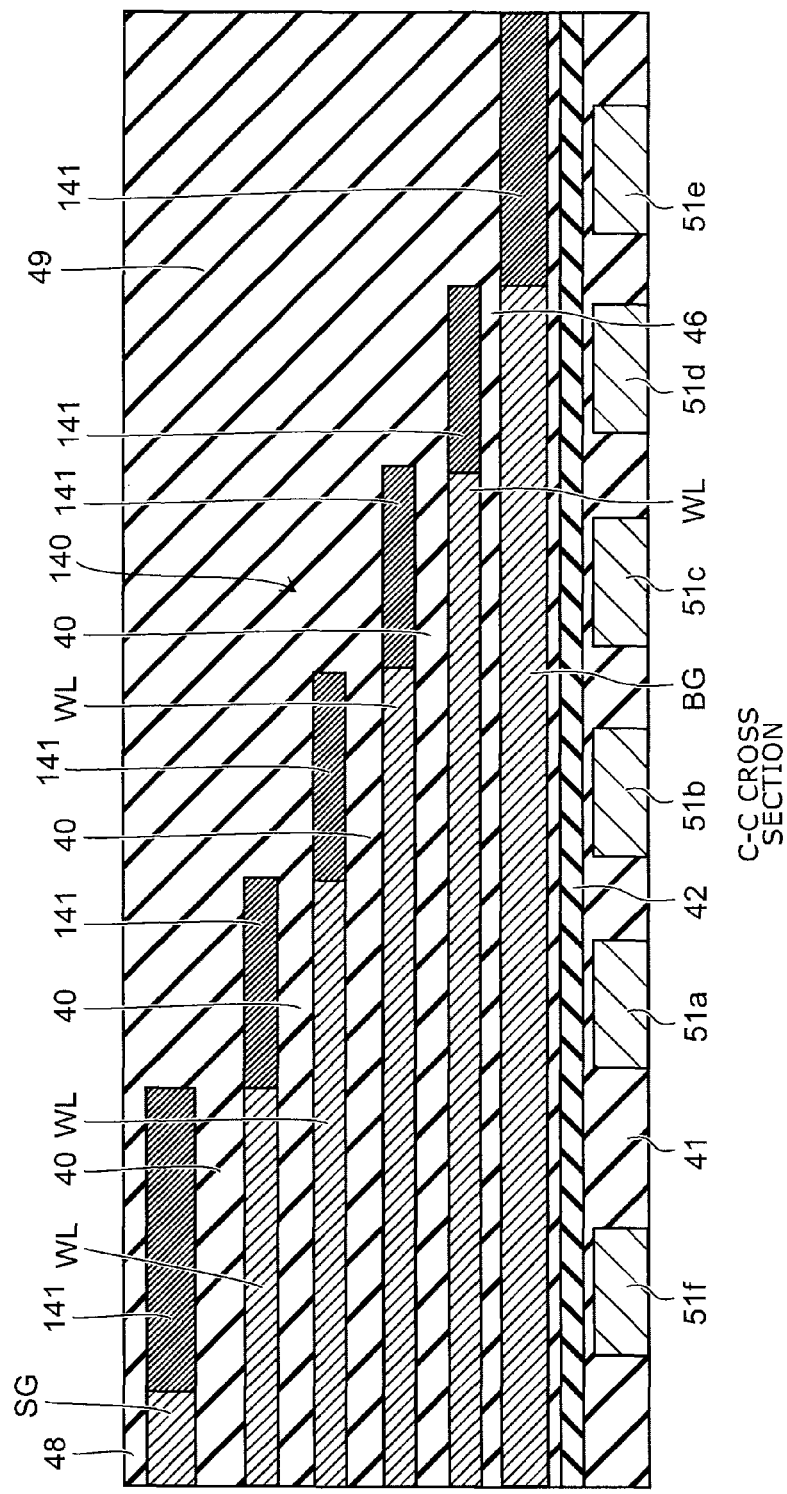

Next, the stacked body on the left side of line C-C in FIG. 47 is removed as shown in FIG. 49. That is, the stacked body located on the farther side from the memory cell array region than the staircase structure section 140 is removed. FIG. 50 shows a C-C cross section in FIG. 49.

Figure 51:
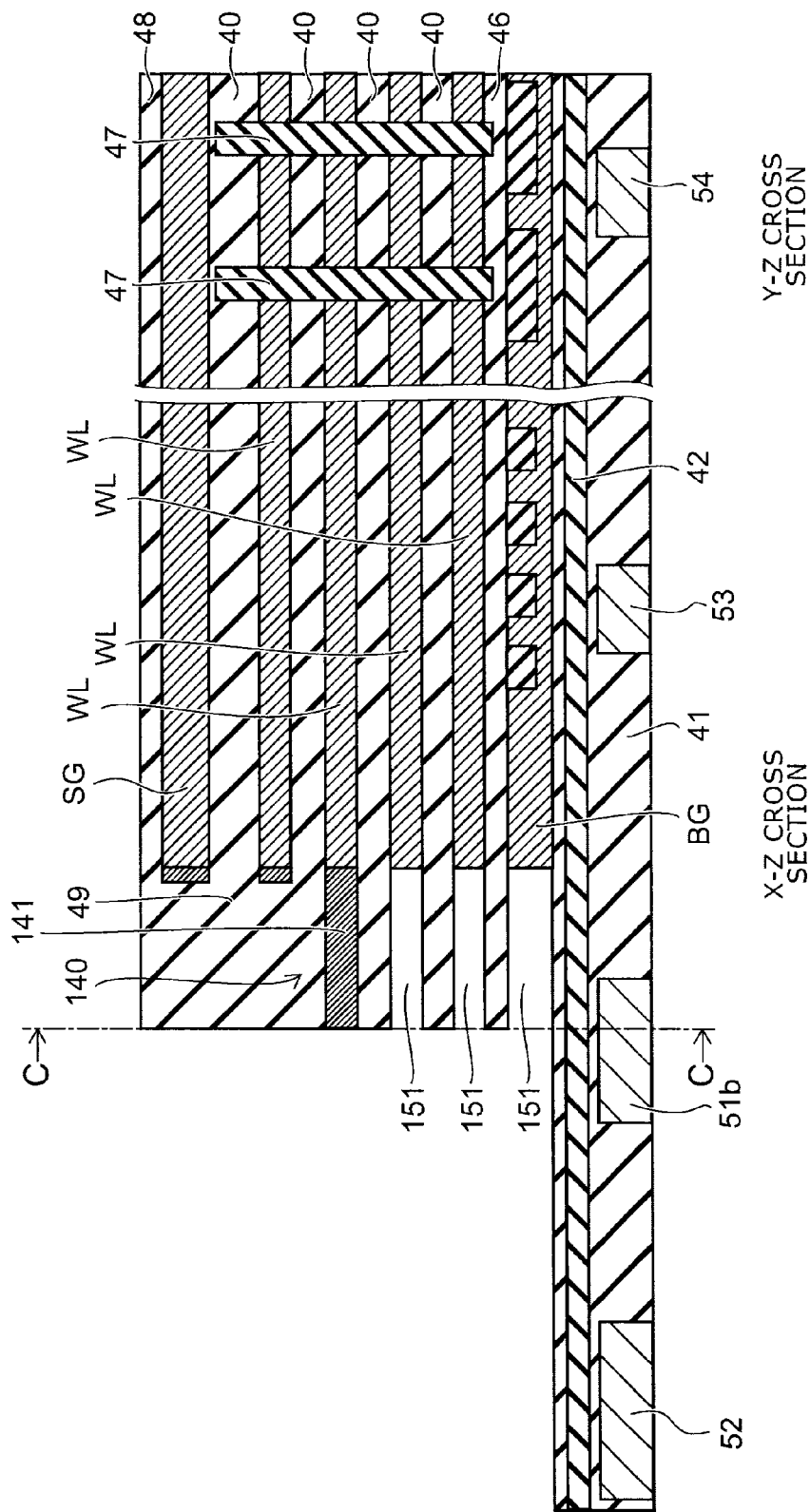
Figure 52:
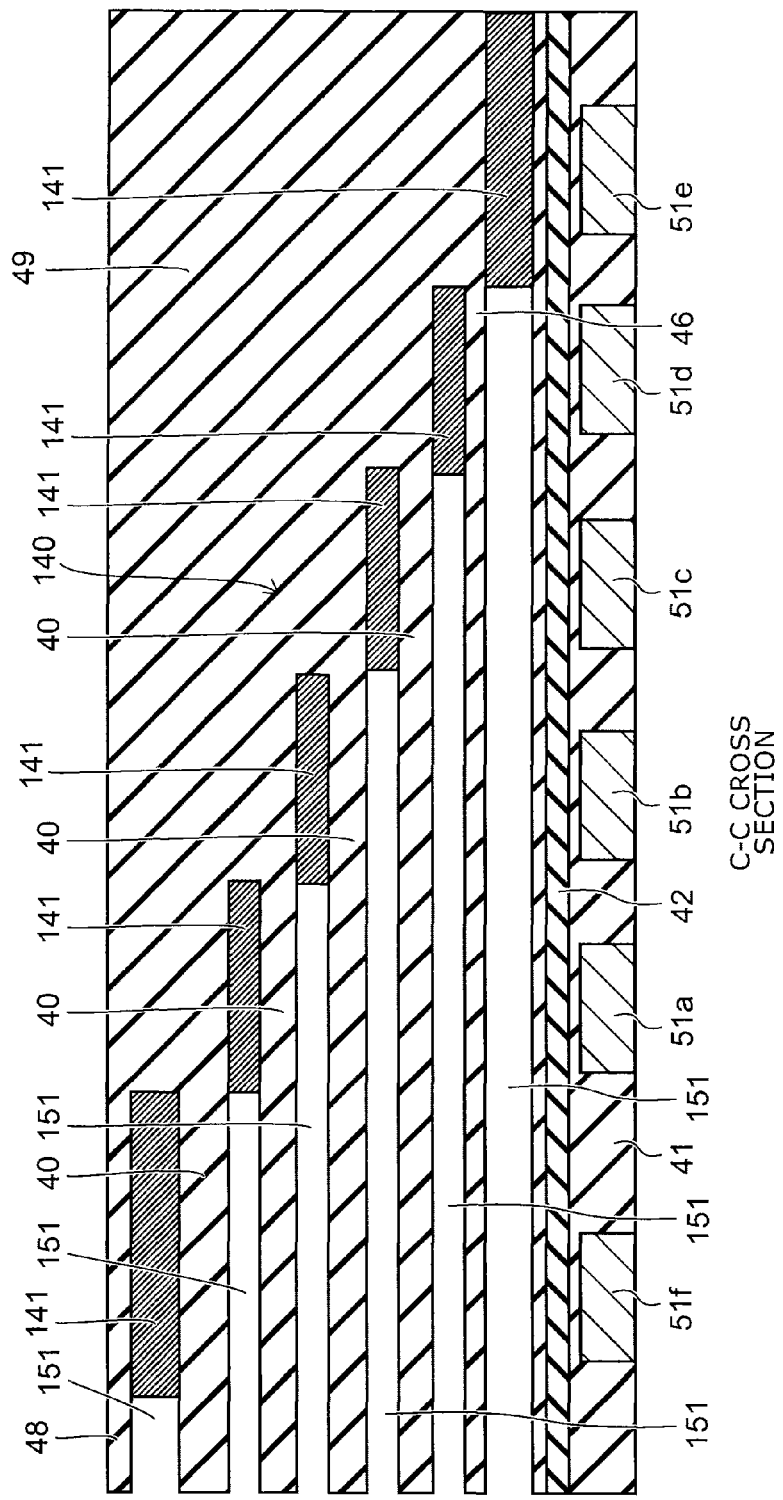

Then, as shown in FIGS. 51 and 52, the portion adjacent to the end part 141 implanted with impurity in each of the select gate SG, the electrode layers WL, and the back gate BG is removed by etching.

The etching liquid used at this time is e.g. an alkaline chemical such as KOH (potassium hydroxide) solution.

The etching rate of the silicon layer in the alkaline chemical depends on the concentration of boron doped in the silicon layer. In particular, at a boron concentration of $1 \times 10^{20}$ cm$^{-3}$ or more, the etching rate sharply decreases by a factor of several tens relative to that at a boron concentration of $1 \times 10^{19}$ cm$^{-3}$ or less.

Thus, the silicon layer having a lower boron concentration than the end part 141 of the staircase structure section 140 is selectively removed, with the end part 141 of the staircase structure section 140 left, by the above etching. At the time of etching shown in FIG. 51, the etching time is controlled so that the etching of each layer having a lower boron concentration than the end part 141 of the staircase structure section 140 does not proceed to the memory cell array region.

Figure 53:
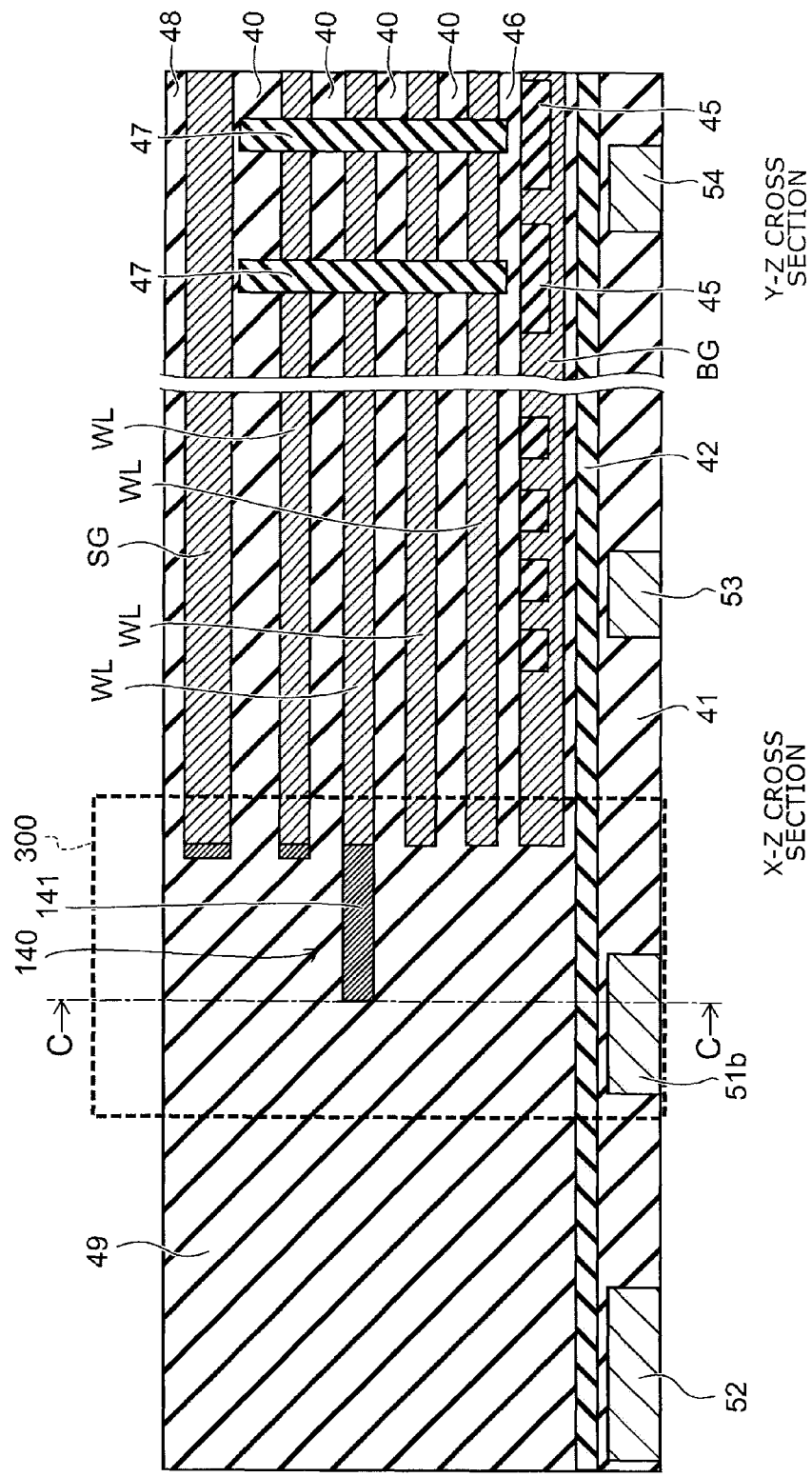
Figure 54:
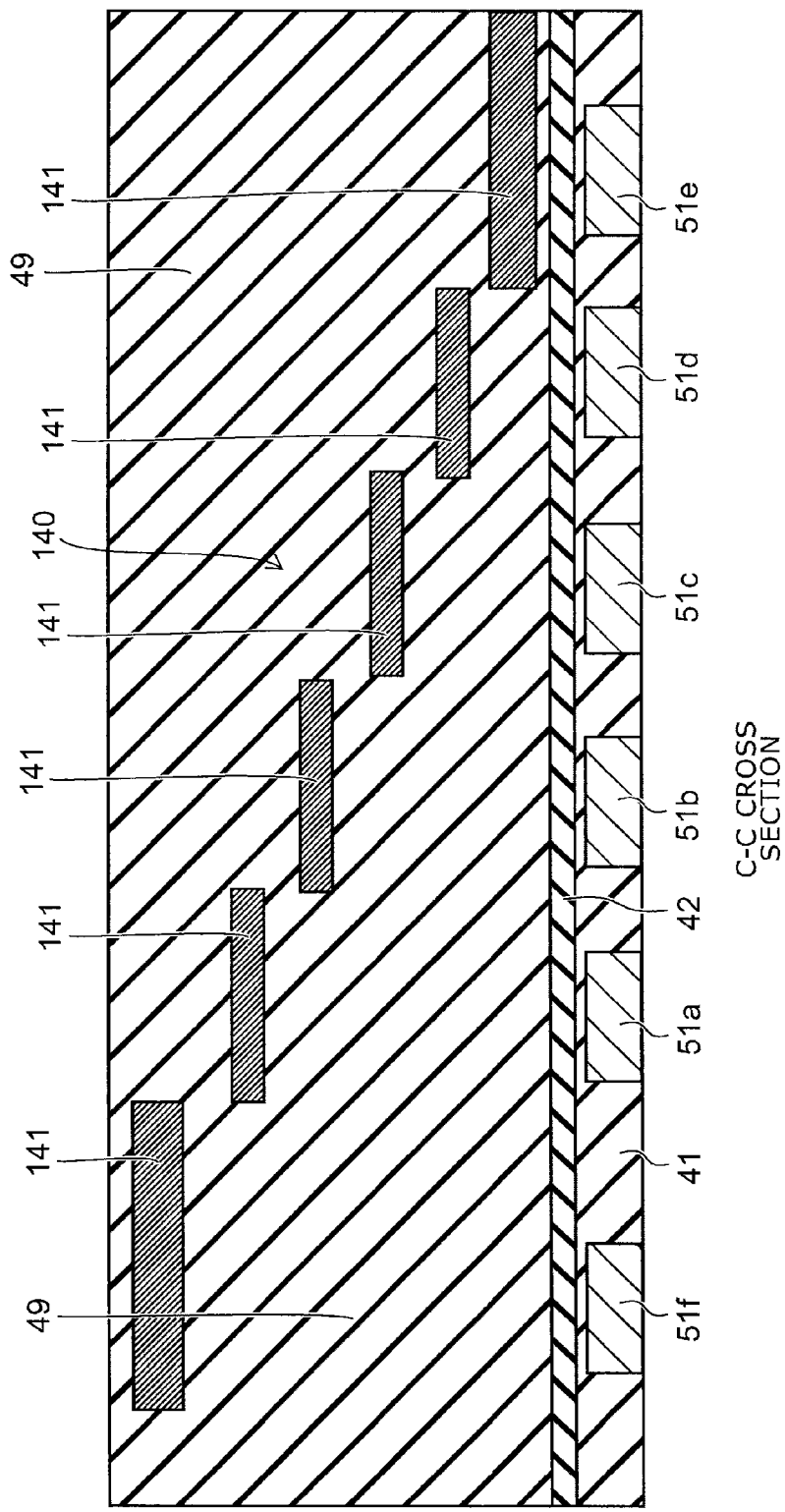

As shown in FIGS. 53 and 54, an insulating layer 49 is embedded in the gap 151 formed by the removal of each layer by the above etching. FIG. 54 shows a C-C cross section in FIG. 53.

Figure 55:
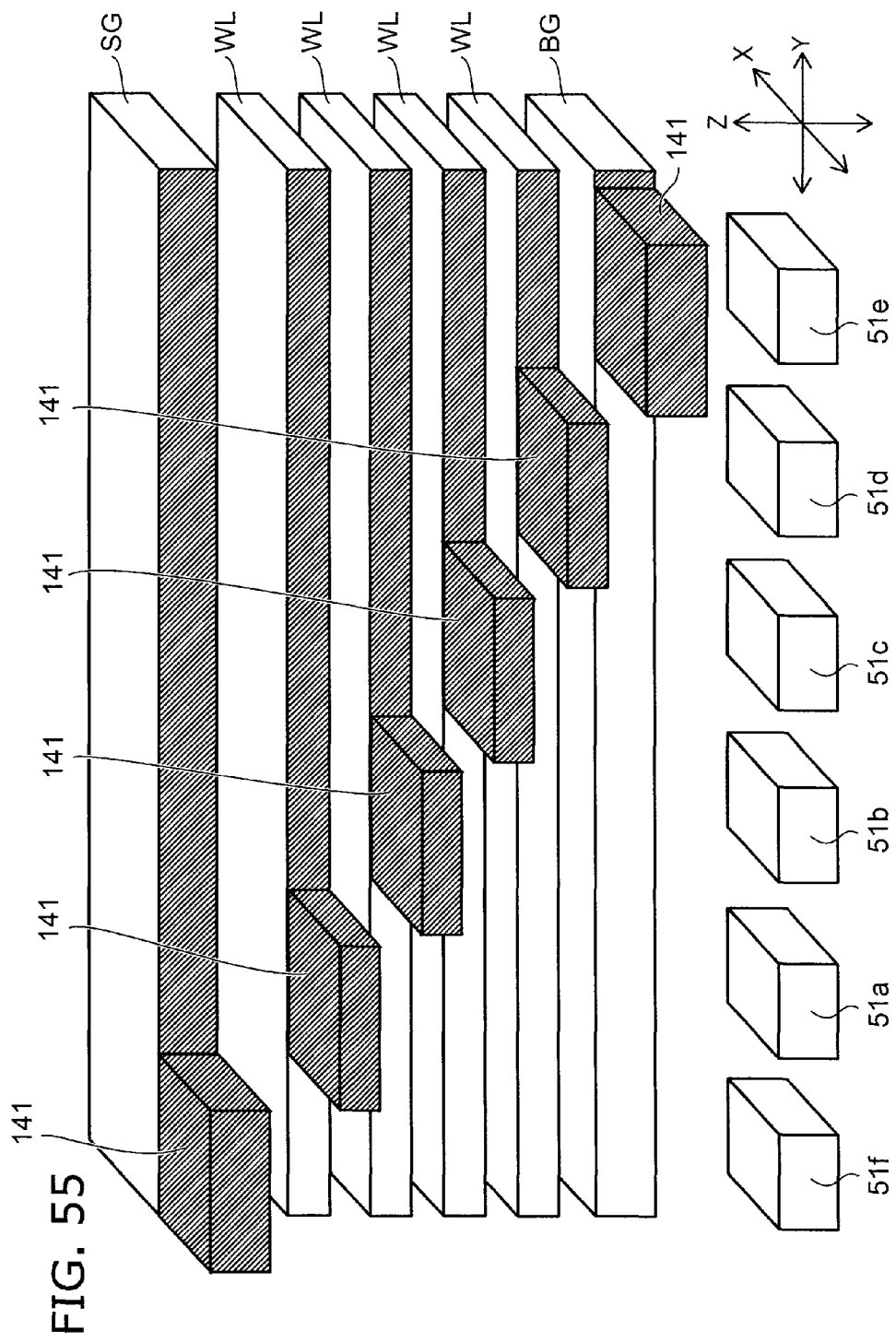

FIG. 55 is a schematic perspective view of the region 300 enclosed with the dashed line in FIG. 53.

The positions in the X-direction of the end parts (end parts in the X-direction) of the select gate SG, the respective electrode layers WL, and the back gate BG are aligned in the tier selecting section outside the memory cell array region. On the end parts, the end parts 141 of the aforementioned staircase structure section 140 are provided as contact parts.

Each contact part 141 is formed in a protruding shape projected from the X-direction end part of the corresponding layer in the X-direction on the opposite side from the memory cell array region. Each contact part 141 is integrated with the silicon layer forming the corresponding layer. However, the impurity concentration of the contact part 141 is higher than that of the other portion of the same silicon layer.

The upper surface of each contact part 141 is parallel to the upper surface and the lower surface of the corresponding layer. The end surface of each contact part 141 is parallel to the end surface of the corresponding layer.

The contact parts 141 do not overlap each other in the Z-direction. The contact parts 141 are displaced in the Y-direction parallel to the surface of the substrate 10. The contact parts 141 are spaced in the Y-direction.

The circuit interconnection 51a-51f is formed on the front side of the substrate 10 directly below each contact part 141.

The aforementioned stacked body is not provided between the contact part 141 and the circuit interconnection 51a-51f. The select gate SG, the electrode layers WL, and the back gate BG do not lie below the contact parts 141.

Figure 56:
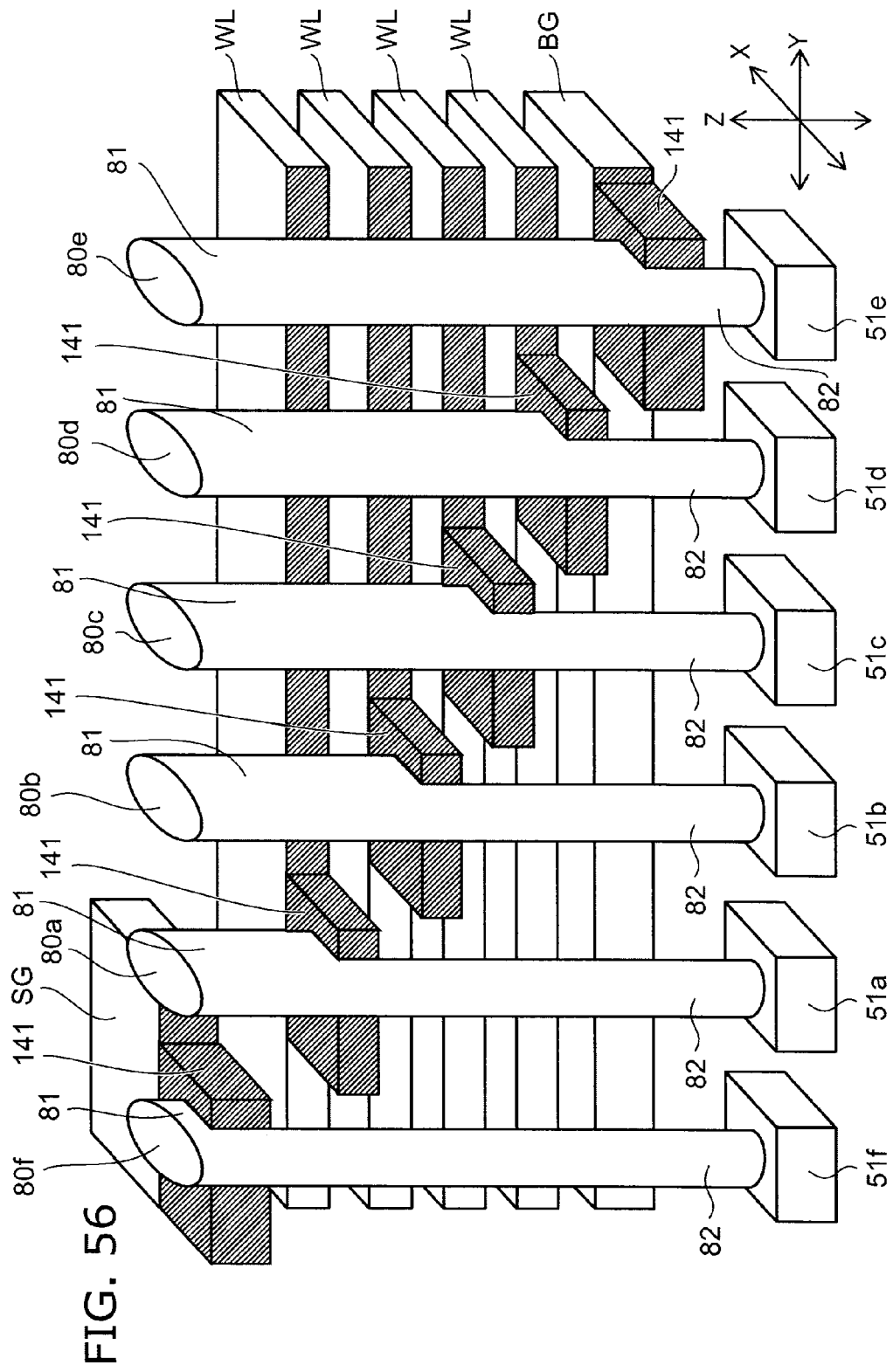

Next, as in the above embodiments, plugs 80a-80f shown in FIG. 56 are formed. The contact parts 141 are electrically connected with the circuit interconnections 51a-51f through plugs 80a-80f, respectively.

Each plug 80a-80f is in contact with the upper surface and the end surface of the corresponding contact part 141. The lower end of each plug 80a-80f is in contact with the corresponding circuit interconnection 51a-51f.

Each plug 80a-80f has an upper part 81 and a lower part 82 smaller in diameter than the upper part 81. The upper part 81 is provided above the corresponding contact part 141. The lower end of the upper part 81 reaches the upper surface of the corresponding contact part 141.

The lower part 82 is in contact with the end surface of the corresponding contact part 141 and extends downward. The lower end of the lower part 82 reaches the corresponding circuit interconnection 51a-51f.

A cross-sectional area parallel to the surface direction of the substrate 10 of the upper part 81 is larger than a cross-sectional area parallel to the surface direction of the lower part 82.

Also in this tier selecting section shown in FIG. 56, the respective electrode layers WL, the back gate BG, and the select gate SG can be directly connected with the circuit interconnections 51a-51f below the stacked body through the plug 80a-80f extending downward from the corresponding contact part 141 without traversing the upper-layer interconnection routed on the stacked body.

Accordingly, the interconnection path connecting each layer with the circuit interconnection is made shorter than in the case of traversing the upper-layer interconnection. This can suppress the propagation delay of signals.

Furthermore, the area of the interconnection formation region connecting each layer with the circuit interconnection can be made smaller than that of the interconnection routing structure traversing the upper-layer interconnection. Thus, the total chip area can be reduced, leading to cost reduction.

Here, the exposed portion of each of the select gate SG, the electrode layers WL, and the back gate BG in the aforementioned staircase structure section 140 may be turned into metal silicide to provide etching resistance for the etching of the silicon layer.

That is, at the time of etching shown in FIG. 52, the silicon layer not turned into metal silicide is selectively removed, with the end part (metal silicide part) 141 of the staircase structure section 140 left.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor memory device comprising:
a substrate;
a plurality of circuit interconnections provided on the substrate;
a stacked body including a plurality of electrode layers and a plurality of insulating layers alternately stacked on the substrate;
a channel body extending in a stacking direction of the stacked body through the plurality of electrode layers;
a memory film provided between the electrode layer and the channel body;
a plurality of contact parts provided in a protruding shape on respective end parts of the plurality of electrode layers, not overlapping each other in the stacking direction, and displaced in a surface direction of the substrate; and
a plurality of plugs extending from the respective contact parts toward the respective circuit interconnections and electrically connecting the respective contact parts with the respective circuit interconnections.

2. The device according to claim 1, wherein the plug is in contact with an upper surface and an end side surface of the contact part.

3. The device according to claim 1, wherein
the contact part has an oblique surface inclined with respect to an upper surface of the electrode layer, and
the plug is in contact with an end surface of the contact part, and further in contact with at least one of the oblique surface and an upper surface of the contact part.

4. The device according to claim 1, wherein
the channel body and the memory film are provided in a memory cell array region in the stacked body, and
the contact part is provided outside the memory cell array region.

5. The device according to claim 4, wherein the contact part is projected to opposite side from the memory cell array region.

6. The device according to claim 4, wherein
the stacked body is divided in a first direction into a plurality of blocks in the memory cell array region, and
the stacked body is continuous in the first direction outside the memory cell array region.

7. The device according to claim 6, wherein the plurality of contact parts are projected in a second direction crossing the first direction, and are arranged in the first direction outside the memory cell array region.

8. The device according to claim 1, wherein
the plug is formed in a columnar shape including an upper part above the contact part and a lower part below the contact part, and
a cross-sectional area parallel to the surface direction of the substrate of the upper part is larger than a cross-sectional area parallel to the surface direction of the lower part.

9. The device according to claim 1, wherein the respective circuit interconnection to be connected with the respective contact part is provided directly below the respective contact part.

10. The device according to claim 1, wherein the contact part is connected with the circuit interconnection through the plug without intermediary of an upper-layer interconnection provided above the stacked body.

11. The device according to claim 1, wherein the electrode layer does not lie below the contact part.

12. The device according to claim 1, wherein the electrode layer and the contact part include silicon doped with impurity.

13. The device according to claim 12, wherein an impurity concentration of the contact part is higher than an impurity concentration of the electrode layer.

14. The device according to claim 12, wherein the contact part includes metal silicide.

15. The device according to claim 1, further comprising:
a select gate provided on the stacked body;
a select gate contact part provided in a protruding shape on an end part of the select gate, not overlapping the contact parts of the electrode layers, and displaced in the surface direction of the substrate; and
a select gate connection plug extending from the select gate contact part toward the circuit interconnection and connecting the select gate contact part with the circuit interconnection.

16. The device according to claim 1, wherein the channel body and the memory film include:
a pair of columnar parts extending in the stacking direction in the stacked body; and
a joining part joining lower ends of the pair of columnar parts.

17. A method for manufacturing a semiconductor memory device, comprising:
forming a stacked body on a substrate, the stacked body including a plurality of electrode layers and a plurality of insulating layers alternately stacked, a plurality of circuit interconnections formed on the substrate;
forming a hole extending in a stacking direction of the stacked body through the plurality of electrode layers;
forming a memory film on a sidewall of the hole;
forming a channel body on a sidewall of the memory film in the hole;
forming a plurality of contact parts provided in a protruding shape on respective end parts of the plurality of electrode layers, not overlapping each other in the stacking direction, and displaced in surface direction of the substrate; and
forming a plurality of plugs extending from the respective contact parts toward the respective circuit interconnections and electrically connecting the respective contact parts with the respective circuit interconnections.

18. The method according to claim 17, wherein the forming the plurality of contact parts includes:
forming a protrusion in a part of the stacked body, the protrusion inclined with respect to the surface direction of the substrate and extending from an uppermost one of the electrode layers toward a lowermost one of the electrode layers.

19. The method according to claim 17, wherein
the plurality of contact parts include silicon, and
the forming the plurality of contact parts includes:
processing the plurality of electrode layers into a staircase structure;
implanting an impurity into the end parts of the respective electrode layers in the staircase structure; and
removing a portion of the electrode layers adjacent to the end parts where the impurity is implanted.

20. The method according to claim 17, wherein
the plurality of contact parts include silicon, and
the forming the plurality of contact parts includes:
processing the plurality of electrode layers into a staircase structure;
forming metal silicide on the end parts of the respective electrode layers in the staircase structure; and
removing a portion of the electrode layers adjacent to the end parts where the metal silicide is formed.

\* \* \* \* \*